(12) United States Patent
Li et al.

(10) Patent No.: US 12,120,946 B2
(45) Date of Patent: *Oct. 15, 2024

(54) GREEN AND RED ORGANIC LIGHT-EMITTING DIODES EMPLOYING EXCIMER EMITTERS

(71) Applicant: Arizona Board of Regents on behalf of Arizona State University, Scottsdale, AZ (US)

(72) Inventors: Jian Li, Tempe, AZ (US); Jiang Wu, Chandler, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/467,348

(22) Filed: Sep. 14, 2023

(65) Prior Publication Data

US 2024/0016048 A1 Jan. 11, 2024

Related U.S. Application Data

(63) Continuation of application No. 17/038,402, filed on Sep. 30, 2020, now Pat. No. 11,785,838.
(Continued)

(51) Int. Cl.
*H10K 85/30* (2023.01)
*C09K 11/06* (2006.01)
*H10K 50/125* (2023.01)

(52) U.S. Cl.
CPC ............ *H10K 85/341* (2023.02); *C09K 11/06* (2013.01); *H10K 85/346* (2023.02);
(Continued)

(58) Field of Classification Search
CPC .. H10K 85/341; H10K 85/342; H10K 85/344; H10K 85/371
(Continued)

(56) References Cited

U.S. PATENT DOCUMENTS

| | | | |
|---|---|---|---|
| 4,769,292 | A | 9/1988 | Tang |
| 5,451,674 | A | 9/1995 | Silver |

(Continued)

FOREIGN PATENT DOCUMENTS

| | | |
|---|---|---|
| CN | 1680366 A | 10/2005 |
| CN | 1777663 | 5/2006 |

(Continued)

OTHER PUBLICATIONS

The claim set of the U.S. Appl. No. 62/444,973, filed Jan. 11, 2017, Lichang Zeng, 36 pages. (Year: 2017).
(Continued)

*Primary Examiner* — Christopher M Raabe
(74) *Attorney, Agent, or Firm* — Riverside Law LLP

(57) ABSTRACT

Organic light emitting devices (OLEDs) are described, the OLEDs comprising an anode; a cathode; and an organic region, disposed between the anode and the cathode, comprising a first complex and a second complex; wherein when a voltage is applied across the anode and cathode at room temperature, the OLED emits a luminescent radiation that comprises one or more luminescent radiation components resulting from the formation of at least one exciplex; wherein the exciplex is formed by at least one of the following aggregate types: 1) at least one aggregate within the first complex, and at least one aggregate within the second complex; 2) at least one aggregate between the first and the second complex; and 3) both 1 and 2.

20 Claims, 10 Drawing Sheets

Related U.S. Application Data

(60) Provisional application No. 62/909,341, filed on Oct. 2, 2019.

(52) U.S. Cl.
CPC ............... C09K 2211/1029 (2013.01); C09K 2211/1044 (2013.01); C09K 2211/185 (2013.01); H10K 50/125 (2023.02)

(58) Field of Classification Search
USPC ........................................................ 257/40
See application file for complete search history.

(56) References Cited

U.S. PATENT DOCUMENTS

| | | | |
|---|---|---|---|
| 5,641,878 A | 6/1997 | Dandliker | |
| 5,707,745 A | 1/1998 | Forrest | |
| 5,844,363 A | 12/1998 | Gu | |
| 6,200,695 B1 | 3/2001 | Arai | |
| 6,303,238 B1 | 10/2001 | Thompson | |
| 6,780,528 B2 | 8/2004 | Tsuboyama | |
| 7,002,013 B1 | 2/2006 | Chi | |
| 7,037,599 B2 | 5/2006 | Culligan | |
| 7,064,228 B1 | 6/2006 | Yu | |
| 7,268,485 B2 | 9/2007 | Tyan | |
| 7,279,704 B2 | 10/2007 | Walters | |
| 7,332,232 B2 | 2/2008 | Ma | |
| 7,442,797 B2 | 10/2008 | Itoh | |
| 7,501,190 B2 | 3/2009 | Ise | |
| 7,635,792 B1 | 12/2009 | Cella | |
| 7,655,322 B2 | 2/2010 | Forrest | |
| 7,854,513 B2 | 12/2010 | Quach | |
| 7,947,383 B2 | 5/2011 | Ise | |
| 8,106,199 B2 | 1/2012 | Jabbour | |
| 8,133,597 B2 | 3/2012 | Yasukawa | |
| 8,389,725 B2 | 3/2013 | Li | |
| 8,617,723 B2 | 12/2013 | Stoessel | |
| 8,669,364 B2 | 3/2014 | Li | |
| 8,778,509 B2 | 7/2014 | Yasukawa | |
| 8,816,080 B2 | 8/2014 | Li | |
| 8,846,940 B2 | 9/2014 | Li | |
| 8,871,361 B2 | 10/2014 | Xia | |
| 8,927,713 B2 | 1/2015 | Li | |
| 8,933,622 B2 | 1/2015 | Kawami | |
| 8,946,417 B2 | 2/2015 | Li | |
| 8,987,451 B2 | 3/2015 | Tsai | |
| 9,059,412 B2 | 6/2015 | Zeng | |
| 9,076,974 B2 | 7/2015 | Li | |
| 9,082,989 B2 | 7/2015 | Li | |
| 9,203,039 B2 | 12/2015 | Li | |
| 9,221,857 B2 | 12/2015 | Li | |
| 9,224,963 B2 | 12/2015 | Li | |
| 9,238,668 B2 | 1/2016 | Li | |
| 9,312,502 B2 | 4/2016 | Li | |
| 9,312,505 B2 | 4/2016 | Brooks | |
| 9,318,725 B2 | 4/2016 | Li | |
| 9,324,957 B2 | 4/2016 | Li | |
| 9,382,273 B2 | 7/2016 | Li | |
| 9,385,329 B2 | 7/2016 | Li | |
| 9,425,415 B2 | 8/2016 | Li | |
| 9,461,254 B2 | 10/2016 | Tsai | |
| 9,493,698 B2 | 11/2016 | Beers | |
| 9,502,671 B2 | 11/2016 | Li | |
| 9,550,801 B2 | 1/2017 | Li | |
| 9,598,449 B2 | 3/2017 | Li | |
| 9,617,291 B2 | 4/2017 | Li | |
| 9,666,822 B2 | 5/2017 | Forrest | |
| 9,673,409 B2 | 6/2017 | Li | |
| 9,698,359 B2 | 7/2017 | Li | |
| 9,711,739 B2 | 7/2017 | Li | |
| 9,711,741 B2 | 7/2017 | Li | |
| 9,711,742 B2 | 7/2017 | Li | |
| 9,735,397 B2 | 8/2017 | Riegel | |
| 9,755,163 B2 | 9/2017 | Li | |
| 9,818,959 B2 | 11/2017 | Li | |
| 9,865,825 B2 | 1/2018 | Li | |
| 9,879,039 B2 | 1/2018 | Li | |
| 9,882,150 B2 | 1/2018 | Li | |
| 9,899,614 B2 | 2/2018 | Li | |
| 9,920,242 B2 | 3/2018 | Li | |
| 9,923,155 B2 | 3/2018 | Li | |
| 9,941,479 B2 | 4/2018 | Li | |
| 9,947,881 B2 | 4/2018 | Li | |
| 9,985,224 B2 | 5/2018 | Li | |
| 10,020,455 B2 | 7/2018 | Li | |
| 10,033,003 B2 | 7/2018 | Li | |
| 10,056,564 B2 | 8/2018 | Li | |
| 10,056,567 B2 | 8/2018 | Li | |
| 10,158,091 B2 | 12/2018 | Li | |
| 10,177,323 B2 | 1/2019 | Li | |
| 10,211,411 B2 | 2/2019 | Li | |
| 10,211,414 B2 | 2/2019 | Li | |
| 10,263,197 B2 | 4/2019 | Li | |
| 10,294,417 B2 | 5/2019 | Li | |
| 10,392,387 B2 | 8/2019 | Li | |
| 10,411,202 B2 | 9/2019 | Li | |
| 10,414,785 B2 | 9/2019 | Li | |
| 10,516,117 B2 | 12/2019 | Li | |
| 10,566,553 B2 | 2/2020 | Li | |
| 10,566,554 B2 | 2/2020 | Li | |
| 10,615,349 B2 | 4/2020 | Li | |
| 10,622,571 B2 | 4/2020 | Li | |
| 10,727,422 B2 | 7/2020 | Li | |
| 10,745,615 B2 | 8/2020 | Li | |
| 10,790,457 B2 | 9/2020 | Li | |
| 10,793,546 B2 | 10/2020 | Li | |
| 10,804,475 B2 | 10/2020 | Zeng | |
| 10,804,476 B2 | 10/2020 | Li | |
| 10,822,363 B2 | 11/2020 | Li | |
| 10,836,785 B2 | 11/2020 | Li | |
| 10,851,106 B2 | 12/2020 | Li | |
| 10,886,478 B2 | 1/2021 | Li | |
| 10,930,865 B2 | 2/2021 | Li | |
| 10,937,976 B2 | 3/2021 | Li | |
| 10,944,064 B2 | 3/2021 | Li | |
| 10,964,897 B2 | 3/2021 | Li | |
| 10,991,897 B2 | 4/2021 | Li | |
| 10,995,108 B2 | 5/2021 | Li | |
| 11,011,712 B2 | 5/2021 | Li | |
| 11,063,228 B2 | 7/2021 | Li | |
| 11,101,435 B2 | 8/2021 | Li | |
| 11,114,626 B2 | 9/2021 | Li | |
| 11,121,328 B2 | 9/2021 | Li | |
| 11,145,830 B2 | 10/2021 | Li | |
| 11,183,670 B2 | 11/2021 | Li | |
| 11,335,865 B2 * | 5/2022 | Li | ........................ H10K 85/625 |
| 11,594,688 B2 | 2/2023 | Li | |
| 2001/0019782 A1 | 9/2001 | Igarashi | |
| 2002/0068190 A1 | 6/2002 | Tsuboyama | |
| 2003/0062519 A1 | 4/2003 | Yamazaki | |
| 2003/0180574 A1 | 9/2003 | Huang | |
| 2003/0186077 A1 | 10/2003 | Chen | |
| 2004/0230061 A1 | 11/2004 | Seo | |
| 2005/0037232 A1 | 2/2005 | Tyan | |
| 2005/0139810 A1 | 6/2005 | Kuehl | |
| 2005/0170207 A1 | 8/2005 | Ma | |
| 2005/0260446 A1 | 11/2005 | MacKenzie | |
| 2006/0024522 A1 | 2/2006 | Thompson | |
| 2006/0032528 A1 | 2/2006 | Wang | |
| 2006/0066228 A1 | 3/2006 | Antoniadis | |
| 2006/0073359 A1 | 4/2006 | Ise | |
| 2006/0094875 A1 | 5/2006 | Itoh | |
| 2006/0127696 A1 | 6/2006 | Stossel | |
| 2006/0182992 A1 | 8/2006 | Nii | |
| 2006/0202197 A1 | 9/2006 | Nakayama | |
| 2006/0210831 A1 | 9/2006 | Sano | |
| 2006/0255721 A1 | 11/2006 | Igarashi | |
| 2006/0263635 A1 | 11/2006 | Ise | |
| 2006/0286406 A1 | 12/2006 | Igarashi | |
| 2007/0057630 A1 | 3/2007 | Nishita | |
| 2007/0059551 A1 | 3/2007 | Yamazaki | |
| 2007/0082284 A1 | 4/2007 | Stoessel | |
| 2007/0103060 A1 | 5/2007 | Itoh | |
| 2007/0160905 A1 | 7/2007 | Morishita | |

(56) References Cited

U.S. PATENT DOCUMENTS

| | | |
|---|---|---|
| 2007/0252140 A1 | 11/2007 | Limmert |
| 2008/0001530 A1 | 1/2008 | Ise |
| 2008/0036373 A1 | 2/2008 | Itoh |
| 2008/0054799 A1 | 3/2008 | Satou |
| 2008/0079358 A1 | 4/2008 | Satou |
| 2008/0102310 A1 | 5/2008 | Thompson |
| 2008/0111476 A1 | 5/2008 | Choi |
| 2008/0241518 A1 | 10/2008 | Satou |
| 2008/0241589 A1 | 10/2008 | Fukunaga |
| 2008/0269491 A1 | 10/2008 | Jabbour |
| 2008/0315187 A1 | 12/2008 | Bazan |
| 2009/0026936 A1 | 1/2009 | Satou |
| 2009/0026939 A1 | 1/2009 | Kinoshita |
| 2009/0032989 A1 | 2/2009 | Karim |
| 2009/0039768 A1 | 2/2009 | Igarashi |
| 2009/0079340 A1 | 3/2009 | Kinoshita |
| 2009/0126796 A1 | 5/2009 | Yang |
| 2009/0128008 A1 | 5/2009 | Ise |
| 2009/0136779 A1 | 5/2009 | Cheng |
| 2009/0153045 A1 | 6/2009 | Kinoshita |
| 2009/0167157 A1 | 7/2009 | Murakami |
| 2009/0167167 A1 | 7/2009 | Aoyama |
| 2009/0205713 A1 | 8/2009 | Mitra |
| 2009/0218561 A1 | 9/2009 | Kitamura |
| 2009/0261721 A1 | 10/2009 | Murakami |
| 2009/0267500 A1 | 10/2009 | Kinoshita |
| 2010/0000606 A1 | 1/2010 | Thompson |
| 2010/0013386 A1 | 1/2010 | Thompson |
| 2010/0043876 A1 | 2/2010 | Tuttle |
| 2010/0093119 A1 | 4/2010 | Shimizu |
| 2010/0127246 A1 | 5/2010 | Nakayama |
| 2010/0141127 A1 | 6/2010 | Xia |
| 2010/0147386 A1 | 6/2010 | Benson-Smith |
| 2010/0171111 A1 | 7/2010 | Takada |
| 2010/0171418 A1 | 7/2010 | Kinoshita |
| 2010/0200051 A1 | 8/2010 | Triani |
| 2010/0204467 A1 | 8/2010 | Lamarque |
| 2010/0270540 A1 | 10/2010 | Chung |
| 2010/0288362 A1 | 11/2010 | Hatwar |
| 2010/0297522 A1 | 11/2010 | Creeth |
| 2010/0301315 A1 | 12/2010 | Masui |
| 2010/0307594 A1 | 12/2010 | Zhu |
| 2011/0028723 A1 | 2/2011 | Li |
| 2011/0049496 A1 | 3/2011 | Fukuzaki |
| 2011/0062858 A1 | 3/2011 | Yersin |
| 2011/0132440 A1 | 6/2011 | Sivarajan |
| 2011/0217544 A1 | 9/2011 | Young |
| 2011/0227058 A1 | 9/2011 | Masui |
| 2011/0301351 A1 | 12/2011 | Li |
| 2012/0024383 A1 | 2/2012 | Kaiho |
| 2012/0025588 A1 | 2/2012 | Humbert |
| 2012/0039323 A1 | 2/2012 | Hirano |
| 2012/0095232 A1 | 4/2012 | Li |
| 2012/0108806 A1 | 5/2012 | Li |
| 2012/0146012 A1 | 6/2012 | Limmert |
| 2012/0181528 A1 | 7/2012 | Takada |
| 2012/0199823 A1 | 8/2012 | Molt |
| 2012/0202997 A1 | 8/2012 | Parham |
| 2012/0204960 A1 | 8/2012 | Kato |
| 2012/0215001 A1 | 8/2012 | Li |
| 2012/0223634 A1 | 9/2012 | Xia |
| 2012/0264938 A1 | 10/2012 | Li |
| 2012/0273736 A1 | 11/2012 | James |
| 2012/0302753 A1 | 11/2012 | Li |
| 2013/0048963 A1 | 2/2013 | Beers |
| 2013/0082245 A1 | 4/2013 | Kottas |
| 2013/0137870 A1 | 5/2013 | Li |
| 2013/0168656 A1 | 7/2013 | Tsai |
| 2013/0172561 A1 | 7/2013 | Tsai |
| 2013/0200340 A1 | 8/2013 | Otsu |
| 2013/0203996 A1 | 8/2013 | Li |
| 2013/0237706 A1 | 9/2013 | Li |
| 2013/0341600 A1 | 12/2013 | Lin |
| 2014/0014922 A1 | 1/2014 | Lin |
| 2014/0014931 A1 | 1/2014 | Riegel |
| 2014/0027733 A1 | 1/2014 | Zeng |
| 2014/0042475 A1 | 2/2014 | Park |
| 2014/0066628 A1 | 3/2014 | Li |
| 2014/0073798 A1 | 3/2014 | Li |
| 2014/0084261 A1 | 3/2014 | Brooks |
| 2014/0114072 A1 | 4/2014 | Li |
| 2014/0147996 A1 | 5/2014 | Vogt |
| 2014/0148594 A1 | 5/2014 | Li |
| 2014/0191206 A1 | 7/2014 | Cho |
| 2014/0203248 A1 | 7/2014 | Zhou |
| 2014/0249310 A1 | 9/2014 | Li |
| 2014/0326960 A1 | 11/2014 | Kim |
| 2014/0330019 A1 | 11/2014 | Li |
| 2014/0364605 A1 | 12/2014 | Li |
| 2014/0374728 A1 | 12/2014 | Adamovich |
| 2015/0008419 A1 | 1/2015 | Li |
| 2015/0018558 A1 | 1/2015 | Li |
| 2015/0028323 A1 | 1/2015 | Xia |
| 2015/0060804 A1 | 3/2015 | Kanitz |
| 2015/0069334 A1 | 3/2015 | Xia |
| 2015/0105556 A1 | 4/2015 | Li |
| 2015/0123047 A1 | 5/2015 | Maltenberger |
| 2015/0162552 A1 | 6/2015 | Li |
| 2015/0194616 A1 | 7/2015 | Li |
| 2015/0207086 A1 | 7/2015 | Li |
| 2015/0228914 A1 | 8/2015 | Li |
| 2015/0274762 A1 | 10/2015 | Li |
| 2015/0287938 A1 | 10/2015 | Li |
| 2015/0311456 A1 | 10/2015 | Li |
| 2015/0318500 A1 | 11/2015 | Li |
| 2015/0349279 A1 | 12/2015 | Li |
| 2015/0380666 A1 | 12/2015 | Szigethy |
| 2016/0028028 A1 | 1/2016 | Li |
| 2016/0028029 A1 | 1/2016 | Li |
| 2016/0043331 A1 | 2/2016 | Li |
| 2016/0072082 A1 | 3/2016 | Brooks |
| 2016/0130225 A1 | 5/2016 | Tasaki |
| 2016/0133861 A1 | 5/2016 | Li |
| 2016/0133862 A1 | 5/2016 | Li |
| 2016/0181529 A1 | 6/2016 | Tsai |
| 2016/0194344 A1 | 7/2016 | Li |
| 2016/0197285 A1 | 7/2016 | Zeng |
| 2016/0197291 A1 | 7/2016 | Li |
| 2016/0204358 A1 | 7/2016 | Stoessel |
| 2016/0285015 A1 | 9/2016 | Li |
| 2016/0359120 A1 | 12/2016 | Li |
| 2016/0359125 A1 | 12/2016 | Li |
| 2017/0005278 A1 | 1/2017 | Li |
| 2017/0012224 A1 | 1/2017 | Li |
| 2017/0040555 A1 | 2/2017 | Li |
| 2017/0047533 A1 | 2/2017 | Li |
| 2017/0066792 A1 | 3/2017 | Li |
| 2017/0069855 A1 | 3/2017 | Li |
| 2017/0077420 A1 | 3/2017 | Li |
| 2017/0125708 A1 | 5/2017 | Li |
| 2017/0267923 A1 | 9/2017 | Li |
| 2017/0271611 A1 | 9/2017 | Li |
| 2017/0301871 A1 | 10/2017 | Li |
| 2017/0305881 A1 | 10/2017 | Li |
| 2017/0309943 A1 | 10/2017 | Angell |
| 2017/0331056 A1 | 11/2017 | Li |
| 2017/0342098 A1 | 11/2017 | Li |
| 2017/0373260 A1 | 12/2017 | Li |
| 2018/0006246 A1 | 1/2018 | Li |
| 2018/0013096 A1 | 1/2018 | Hamada |
| 2018/0037812 A1 | 2/2018 | Pegington |
| 2018/0052366 A1 | 2/2018 | Hao |
| 2018/0053904 A1 | 2/2018 | Li |
| 2018/0062084 A1 | 3/2018 | Watabe |
| 2018/0130960 A1 | 5/2018 | Li |
| 2018/0138428 A1 | 5/2018 | Li |
| 2018/0148464 A1 | 5/2018 | Li |
| 2018/0159051 A1 | 6/2018 | Li |
| 2018/0166655 A1 | 6/2018 | Li |
| 2018/0175329 A1 | 6/2018 | Li |
| 2018/0194790 A1 | 7/2018 | Li |
| 2018/0198081 A1 | 7/2018 | Zeng |
| 2018/0219161 A1 | 8/2018 | Li |
| 2018/0226592 A1 | 8/2018 | Li |

(56) References Cited

U.S. PATENT DOCUMENTS

| | | |
|---|---|---|
| 2018/0226593 A1 | 8/2018 | Li |
| 2018/0230173 A1 | 8/2018 | Ji |
| 2018/0277777 A1 | 9/2018 | Li |
| 2018/0301641 A1 | 10/2018 | Li |
| 2018/0312750 A1 | 11/2018 | Li |
| 2018/0331307 A1 | 11/2018 | Li |
| 2018/0334459 A1 | 11/2018 | Li |
| 2018/0337345 A1 | 11/2018 | Li |
| 2018/0337349 A1 | 11/2018 | Li |
| 2018/0337350 A1 | 11/2018 | Li |
| 2018/0353771 A1 | 12/2018 | Kim |
| 2019/0013485 A1 | 1/2019 | Li |
| 2019/0058137 A1 | 2/2019 | Ko |
| 2019/0067602 A1 | 2/2019 | Li |
| 2019/0074455 A1 | 3/2019 | Chen |
| 2019/0109288 A1 | 4/2019 | Li |
| 2019/0119312 A1 | 4/2019 | Chen |
| 2019/0157352 A1 | 5/2019 | Li |
| 2019/0194536 A1 | 6/2019 | Li |
| 2019/0214584 A1 | 7/2019 | Chen |
| 2019/0221757 A1 | 7/2019 | Tarran |
| 2019/0259963 A1 | 8/2019 | Li |
| 2019/0276485 A1 | 9/2019 | Li |
| 2019/0312217 A1 | 10/2019 | Li |
| 2019/0367546 A1 | 12/2019 | Li |
| 2019/0389893 A1 | 12/2019 | Li |
| 2020/0006678 A1 | 1/2020 | Li |
| 2020/0055885 A1 | 2/2020 | Tarran |
| 2020/0071330 A1 | 3/2020 | Li |
| 2020/0075868 A1 | 3/2020 | Li |
| 2020/0119288 A1 | 4/2020 | Li |
| 2020/0119289 A1 | 4/2020 | Lin |
| 2020/0140471 A1 | 5/2020 | Chen |
| 2020/0152891 A1 | 5/2020 | Li |
| 2020/0168798 A1 | 5/2020 | Han |
| 2020/0227656 A1 | 7/2020 | Li |
| 2020/0227660 A1 | 7/2020 | Li |
| 2020/0239505 A1 | 7/2020 | Li |
| 2020/0243776 A1 | 7/2020 | Li |
| 2020/0287153 A1 | 9/2020 | Li |
| 2020/0332185 A1 | 10/2020 | Li |
| 2020/0365819 A1 | 11/2020 | Seo |
| 2020/0373505 A1 | 11/2020 | Li |
| 2020/0403167 A1 | 12/2020 | Li |
| 2021/0024526 A1 | 1/2021 | Li |
| 2021/0024559 A1 | 1/2021 | Li |
| 2021/0047296 A1 | 2/2021 | Li |
| 2021/0091316 A1 | 3/2021 | Li |
| 2021/0095195 A1 | 4/2021 | Ma |
| 2021/0104687 A1 | 4/2021 | Li |
| 2021/0111355 A1 | 4/2021 | Li |
| 2021/0126208 A1 | 4/2021 | Li |
| 2021/0193936 A1 | 6/2021 | Li |
| 2021/0193947 A1 | 6/2021 | Li |
| 2021/0217973 A1 | 7/2021 | Li |
| 2021/0230198 A1 | 7/2021 | Li |
| 2021/0261589 A1 | 8/2021 | Li |
| 2021/0273182 A1 | 9/2021 | Li |
| 2021/0292351 A1 | 9/2021 | MacInnis |
| 2021/0376260 A1 | 12/2021 | Li |
| 2022/0059786 A1 | 2/2022 | Seo |

FOREIGN PATENT DOCUMENTS

| | | |
|---|---|---|
| CN | 1894267 | 1/2007 |
| CN | 1894269 A | 1/2007 |
| CN | 101142223 A | 3/2008 |
| CN | 101667626 | 3/2010 |
| CN | 102449108 A | 5/2012 |
| CN | 102892860 A | 1/2013 |
| CN | 102971396 A | 3/2013 |
| CN | 103102372 | 5/2013 |
| CN | 104232076 A | 12/2014 |
| CN | 104377231 | 2/2015 |
| CN | 104576934 | 4/2015 |
| CN | 104693243 A | 6/2015 |
| CN | 105367605 A | 3/2016 |
| CN | 105418591 A | 3/2016 |
| CN | 106783922 | 5/2017 |
| CN | 109309168 A | 2/2019 |
| CN | 110066296 A | 7/2019 |
| CN | 110240606 A | 9/2019 |
| EP | 1617493 | 1/2006 |
| EP | 1808052 A1 | 7/2007 |
| EP | 1874893 A1 | 1/2008 |
| EP | 1874894 A1 | 1/2008 |
| EP | 1919928 A1 | 5/2008 |
| EP | 1968131 | 9/2008 |
| EP | 2020694 | 2/2009 |
| EP | 2036907 A1 | 3/2009 |
| EP | 2096690 | 9/2009 |
| EP | 2112213 A2 | 10/2009 |
| EP | 2417217 A2 | 2/2012 |
| EP | 2684932 | 1/2014 |
| EP | 2711999 A2 | 3/2014 |
| EP | 3032293 | 6/2016 |
| JP | 2002010505 | 1/2002 |
| JP | 2002105055 | 4/2002 |
| JP | 2003342284 | 12/2003 |
| JP | 2005031073 | 2/2005 |
| JP | 2005267557 | 9/2005 |
| JP | 2005310733 A | 11/2005 |
| JP | 2006047240 A | 2/2006 |
| JP | 2006232784 A | 9/2006 |
| JP | 2006242080 | 9/2006 |
| JP | 2006242081 A | 9/2006 |
| JP | 2006256999 A | 9/2006 |
| JP | 2006257238 A | 9/2006 |
| JP | 2006261623 A | 9/2006 |
| JP | 2006290988 A | 10/2006 |
| JP | 2006313796 A | 11/2006 |
| JP | 2006332622 A | 12/2006 |
| JP | 2006351638 A | 12/2006 |
| JP | 2007019462 A | 1/2007 |
| JP | 2007031678 | 2/2007 |
| JP | 2007042875 A | 2/2007 |
| JP | 2007051243 A | 3/2007 |
| JP | 2007053132 A | 3/2007 |
| JP | 2007066581 | 3/2007 |
| JP | 2007073620 A | 3/2007 |
| JP | 2007073845 A | 3/2007 |
| JP | 2007073900 A | 3/2007 |
| JP | 2007080593 | 3/2007 |
| JP | 2007080677 A | 3/2007 |
| JP | 2007088105 | 4/2007 |
| JP | 2007088164 A | 4/2007 |
| JP | 2007096259 A | 4/2007 |
| JP | 2007099765 A | 4/2007 |
| JP | 2007110067 | 4/2007 |
| JP | 2007110102 A | 4/2007 |
| JP | 2007519614 | 7/2007 |
| JP | 2007258550 A | 10/2007 |
| JP | 2007324309 A | 12/2007 |
| JP | 2008010353 A | 1/2008 |
| JP | 2008091860 A | 4/2008 |
| JP | 2008103535 A | 5/2008 |
| JP | 2008108617 A | 5/2008 |
| JP | 2008109085 | 5/2008 |
| JP | 2008109103 A | 5/2008 |
| JP | 2008116343 A | 5/2008 |
| JP | 2008117545 A | 5/2008 |
| JP | 2008160087 A | 7/2008 |
| JP | 2008198801 A | 8/2008 |
| JP | 2008270729 A | 11/2008 |
| JP | 2008270736 | 11/2008 |
| JP | 2008310220 A | 12/2008 |
| JP | 2009016184 A | 1/2009 |
| JP | 2009016579 | 1/2009 |
| JP | 2009032977 A | 2/2009 |
| JP | 2009032988 A | 2/2009 |
| JP | 2009059997 | 3/2009 |
| JP | 2009076509 | 4/2009 |
| JP | 2009161524 A | 7/2009 |
| JP | 2009247171 | 10/2009 |

(56) References Cited

FOREIGN PATENT DOCUMENTS

| | | |
|---|---|---|
| JP | 2009266943 A | 11/2009 |
| JP | 2009267171 A | 11/2009 |
| JP | 2009267244 A | 11/2009 |
| JP | 2009272339 A | 11/2009 |
| JP | 2009283891 A | 12/2009 |
| JP | 4460952 B2 | 5/2010 |
| JP | 2010135689 A | 6/2010 |
| JP | 2010171205 A | 8/2010 |
| JP | 2011071452 A | 4/2011 |
| JP | 2012074444 A | 4/2012 |
| JP | 2012079895 A | 4/2012 |
| JP | 2012079898 A | 4/2012 |
| JP | 5604505 | 9/2012 |
| JP | 2012522843 | 9/2012 |
| JP | 2012207231 A | 10/2012 |
| JP | 2012222255 A | 11/2012 |
| JP | 2012231135 A | 11/2012 |
| JP | 2013023500 A | 2/2013 |
| JP | 2013048256 A | 3/2013 |
| JP | 2013053149 A | 3/2013 |
| JP | 2013525436 | 6/2013 |
| JP | 2014019701 A | 2/2014 |
| JP | 2014058504 A | 4/2014 |
| JP | 2014520096 | 8/2014 |
| JP | 2012709899 | 11/2014 |
| JP | 2014221807 A | 11/2014 |
| JP | 2014239225 A | 12/2014 |
| JP | 2015081257 A | 4/2015 |
| KR | 20060011537 | 2/2006 |
| KR | 20060015371 | 2/2006 |
| KR | 20060115371 | 11/2006 |
| KR | 20070061830 | 6/2007 |
| KR | 20070112465 | 11/2007 |
| KR | 20130043460 A | 4/2013 |
| KR | 101338250 | 12/2013 |
| KR | 20140052501 | 5/2014 |
| TW | 200701835 | 1/2007 |
| TW | 201249851 | 12/2012 |
| TW | 201307365 A | 2/2013 |
| TW | 201710277 | 3/2017 |
| WO | 2000070655 | 11/2000 |
| WO | 2004003108 | 1/2004 |
| WO | 2004070655 | 8/2004 |
| WO | 2004085450 | 10/2004 |
| WO | 2004108857 | 12/2004 |
| WO | 2005042444 A2 | 5/2005 |
| WO | 2005042550 A1 | 5/2005 |
| WO | 2005113704 | 12/2005 |
| WO | 2006033440 A1 | 3/2006 |
| WO | 2006067074 | 6/2006 |
| WO | 2006081780 | 8/2006 |
| WO | 2006098505 A1 | 9/2006 |
| WO | 2006113106 | 10/2006 |
| WO | 2006115299 A1 | 11/2006 |
| WO | 2006115301 | 11/2006 |
| WO | 2007034985 A1 | 3/2007 |
| WO | 2007069498 A1 | 6/2007 |
| WO | 2008054578 | 5/2008 |
| WO | 2008066192 A1 | 6/2008 |
| WO | 2008066195 A1 | 6/2008 |
| WO | 2008066196 A1 | 6/2008 |
| WO | 2008101842 A1 | 8/2008 |
| WO | 2008117889 | 10/2008 |
| WO | 2008123540 | 10/2008 |
| WO | 2008131932 A1 | 11/2008 |
| WO | 2009003455 | 1/2009 |
| WO | 2009008277 | 1/2009 |
| WO | 2009011327 | 1/2009 |
| WO | 2009017211 A1 | 2/2009 |
| WO | 2009023667 | 2/2009 |
| WO | 2009086209 | 7/2009 |
| WO | 2009111299 | 9/2009 |
| WO | 2010007098 A1 | 1/2010 |
| WO | 2010056669 | 5/2010 |
| WO | 2010093176 | 8/2010 |
| WO | 2010105141 | 9/2010 |
| WO | 2010118026 A2 | 10/2010 |
| WO | 2011064335 A1 | 6/2011 |
| WO | 2011070989 A1 | 6/2011 |
| WO | 2011089163 | 7/2011 |
| WO | 2011137429 A2 | 11/2011 |
| WO | 2011137431 A2 | 11/2011 |
| WO | 2012074909 | 6/2012 |
| WO | 2012112853 A1 | 8/2012 |
| WO | 2012116231 | 8/2012 |
| WO | 2012142387 | 10/2012 |
| WO | 2012162488 A1 | 11/2012 |
| WO | 2012163471 A1 | 12/2012 |
| WO | 2013130483 A1 | 9/2013 |
| WO | 2014009310 | 1/2014 |
| WO | 2014016611 | 1/2014 |
| WO | 2014031977 | 2/2014 |
| WO | 2014047616 A1 | 3/2014 |
| WO | 2014109814 | 7/2014 |
| WO | 2014208271 | 12/2014 |
| WO | 2015027060 A1 | 2/2015 |
| WO | 2015131158 | 9/2015 |
| WO | 2016025921 A1 | 2/2016 |
| WO | 2016029137 | 2/2016 |
| WO | 2016029186 | 2/2016 |
| WO | 2016088354 A1 | 6/2016 |
| WO | 2016197019 | 12/2016 |
| WO | 2017117935 | 7/2017 |
| WO | 2018071697 | 4/2018 |
| WO | 2018140765 | 8/2018 |
| WO | 2019079505 | 4/2019 |
| WO | 2019079508 | 4/2019 |
| WO | 2019079509 | 4/2019 |
| WO | 2019236541 | 12/2019 |
| WO | 2020018476 | 1/2020 |

OTHER PUBLICATIONS

Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <DOI:10.1063/1.1306639>.

Ayan Maity et al., "Room-temperature synthesis of cyclometalated iridium(III) complexes; kinetic isomers and reactive functionalities" Chem. Sci., vol. 4, pp. 1175-1181 (2013).

Baldo et al., "Very High-Efficiency Green Organic Light-Emitting Devices Based on Electrophosphorescence", Appl Phys Lett, 75(3):4-6 (1999).

Baldo et al., "Highly Efficient Phosphorescent Emission from Organic Electroluminescent Devices," Nature, vol. 395, Sep. 10, 1998, pp. 151-154.

Baldo, M. et al., "Excitonic singlet-triplet ratio in a semiconducting organic thin film", Physical Review B, Nov. 1999, vol. 60, No. 20, pp. 14422-14428 <DOI:10.1103/PhysRevB.60.14422>.

Baldo, M. et al., "High-efficiency fluorescent organic light-emitting devices using a phosphorescent sensitizer", Nature, Feb. 2000, vol. 403, pp. 750-753.

Barry O'Brien et al.: White organic light emitting diodes using Pt-based red, green and blue phosphorescent dopants. Proc. SPIE, vol. 8829, pp. 1-6, Aug. 25, 2013.

Barry O'Brien et al., "High efficiency white organic light emitting diodes employing blue and red platinum emitters," Journal of Photonics for Energy, vol. 4, 2014, pp. 043597-1-043597-8.

Berson et al. (2007). "Poly(3-hexylthiophene) fibers for photovoltaic applications," Adv. Funct. Mat., 17, 1377-84.

Bouman et al. (1994). "Chiroptical properties of regioregular chiral polythiophenes," Mol. Cryst. Liq. Cryst., 256, 439-48.

Brian W. D'Andrade et al., "Controlling Exciton Diffusion in Multilayer White Phosphorescent Organic Light Emitting Devices", Adv. Mater., vol. 14, No. 2, Jan. 16, 2002, pp. 147-151.

Bronner; "Dipyrrin based luminescent cyclometallated palladium and platinum complexes", Dalton Trans., 2010, 39, 180-184. DOI: 10.1039/b908424j (Year: 2010) (5 pages).

Brooks, J. et al., "Synthesis and Characterization of Phosphorescent Cyclometalated Platinum Complexes", Inorganic Chemistry, May 2002, vol. 41, No. 12, pp. 3055-3066 <DOI:10.1021/ic0255508>.

(56) References Cited

OTHER PUBLICATIONS

Brown, A. et al., "Optical spectroscopy of triplet excitons and charged excitations in poly(p-phenylenevinylene) light-emitting diodes", Chemical Physics Letters, Jul. 1993, vol. 210, No. 1-3, pp. 61-66 <DOI:10.1016/0009-2614(93)89100-V>.
Burroughes, J. et al., "Light-emitting diodes based on conjugated polymers", Nature, Oct. 1990, vol. 347, pp. 539-541.
Campbell et al. (2008). "Low-temperature control of nanoscale morphology for high performance polymer photovoltaics," Nano Lett., 8, 3942-47.
Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 <10.1063/1.1462862>.
Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <DOI: 10.1021/cr200201z>.
Chew, S. et al: Photoluminescence and electroluminescence of a new blue-emitting homoleptic iridium complex. Applied Phys. Letters; vol. 88, pp. 093510-1-093510-3, 2006.
Chi et al.; Transition-metal phosphors with cyclometalating ligands: fundamentals and applications, Chemical Society Reviews, vol. 39, No. 2, Feb. 2010, pp. 638-655.
Chi-Ming Che et al. "Photophysical Properties and OLEO Applications of Phosphorescent Platinum(II) Schiff Base Complexes," Chem. Eur. J., vol. 16, 2010, pp. 233-247.
Christoph Ulbricht et al., "Synthesis and Characterization of Oxetane-Functionalized Phosphorescent Ir(III)-Complexes", Macromol. Chem. Phys. 2009, 210, pp. 531-541.
Coakley et al. (2004). "Conjugated polymer photovoltaic cells," Chem. Mater., 16, 4533-4542.
Colombo, M. et al., "Synthesis and high-resolution optical spectroscopy of bis[2-(2-thienyl)pyridinato-C3,N'](2,2'-bipyridine)iridium(III)", Inorganic Chemistry, Jul. 1993, vol. 32, No. 14, pp. 3081-3087 <DOI:10.1021/ic00066a019>.
D.F. O'Brien et al., "Improved energy transfer in electrophosphorescent devices," Appl. Phys. Lett., vol. 74, No. 3, Jan. 18, 1999, pp. 442-444.
D'Andrade, B. et al., "Operational stability of electrophosphorescent devices containing p and n doped transport layers", Applied Physics Letters, Nov. 2003, vol. 83, No. 19, pp. 3858-3860 <DOI:10.1063/1.1624473>.
Dan Wang et al., "Carbazole and arylamine functionalized iridium complexes for efficient electro-phosphorescent light-emitting diodes", Inorganica Chimica Acta 370 (2011) pp. 340-345.
Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.
Dong Ryun Lee et al. "Emitting Materials for Thermally Activated Delayed Fluorescent Organic Light-Emitting Diodes Using Benzofurocarbazole and Benzothienocarbazole as Donor Moieties" SID 2015 Digest, vol. 46, p. 502-504 (Year: 2015).
Dorwald, Side Reactions in Organic Synthesis 2005, Wiley:VCH Weinheim Preface, pp. 1-15 & Chapter 1, pp. 279-308.
Dorwald; "Side Reactions in Organic Synthesis: A Guide to Successful Synthesis Design," Chapter 1, 2005 Wiley-VCH Verlag Gmbh & Co. KGaA, Wienheim, 32 pages.
Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI:10.1021/cr200213s>.
Eric Turner et al., "Cyclometalated Platinum Complexes with Luminescent Quantum Yields Approaching 100%," Inorg. Chem., 2013, vol. 52, pp. 7344-7351.
Evan L. Williams et al., "Excimer-Based White Phosphorescent Organic Light Emitting Diodes with Nearly 100% Internal Quantum Efficiency," Adv. Mater., vol. 19, 2007, pp. 197-202.
Finikova,M.A. et al., New Selective Synthesis of Substituted Tetrabenzoporphyris, Doklady Chemistry, 2003, vol. 391, No. 4-6, pp. 222-224.
Fleetham et al., "Phosphorescent Pt(II) and Pd(II) Complexes for Efficient, High-Color-Quality, and Stable OLEDs", Advanced Mater., 29, 1601861, 2017, 16 pages.
Fuchs, C. et al., "Enhanced light emission from top-emitting organic light-emitting diodes by optimizing surface plasmon polariton losses", arXiv, submitted Mar. 2015, 11 pages, arXiv:1503.01309.
Fuchs, C. et al., "Enhanced light emission from top-emitting organic light-emitting diodes by optimizing surface plasmon polariton losses", Physical Review B, Dec. 2015, vol. 92, No. 24, pp. 245306-1-245306-10 <DOI:10.1103/PhysRevB.92.245306>.
Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.
Galanin et al., meso-Phenyltetrabenzoazaporphyrins and their zinc complexes. Synthesis and spectral properties, Russian Journal of General Chemistry (2005), 75(4), 651-655.
Gather, M. et al., "Recent advances in light outcoupling from white organic light-emitting diodes," Journal of Photonics for Energy, May 2015, vol. 5, No. 1, 057607-1-057607-20 <DOI:10.1117/1.JPE.5.057607>.
Glauco Ponterini et al., "Comparison of Radiationless Decay Processes in Osmium and Platinum Porphyrins," J. Am. Chem. Soc., vol. 105, No. 14, 1983, pp. 4639-4645.
Gong et al., Highly Selective Complexation of Metal Ions by the Self-Tuning Tetraazacalixpyridine macrocycles, Tetrahedron, 65(1): 87-92 (2009).
Gottumukkala,V. et al., Synthesis, cellular uptake and animal toxicity of a tetra carboranylphenyl N-tetrabenzoporphyr in, Bioorganic & Medicinal Chemistry, 2006, vol. 14, pp. 1871-1879.
Graf, A. et al., "Correlating the transition dipole moment orientation of phosphorescent emitter molecules in OLEDs with basic material properties", Journal of Materials Chemistry C, Oct. 2014, vol. 2, No. 48, pp. 10298-10304 <DOI:10.1039/c4tc00997e>.
Guijie Li et al., "Efficient and stable red organic light emitting devices from a tetradentate cyclometalated platinum complex," Organic Electronics, 2014, vol. 15 pp. 1862-1867.
Guijie Li et al., "Modifying Emission Spectral Bandwidth of Phosphorescent Platinum(II) Complexes Through Synthetic Control," Inorg. Chem. 2017, 56, 8244-8256.
Guijie Li et al., Efficient and Stable White Organic Light-Emitting Diodes Employing a Single Emitter, Adv. Mater., 2014, vol. 26, pp. 2931-2936.
Hansen (1969). "The universality of the solubility parameter," I & EC Product Research and Development, 8, 2-11.
Hatakeyama, T. et al., "Ultrapure Blue Thermally Activated Delayed Fluorescence Molecules: Effi cient HOMO-LUMO Separation by the Multiple Resonance Effect", Advanced Materials, Apr. 2016, vol. 28, No. 14, pp. 2777-2781, <DOI:10.1002/adma.201505491>.
Hirohiko Fukagawa et al., "Highly Efficient and Stable Red Phosphorescent Organic Light-Emitting Diodes Using Platinum Complexes," Adv. Mater., 2012, vol. 24, pp. 5099-5103.
Hoe-Joo Seo et al., "Blue phosphorescent iridium(III) complexes containing carbazole-functionalized phenyl pyridine for organic light-emitting diodes: energy transfer from carbazolyl moieties to iridium(III) cores", RSC Advances, 2011, 1, pp. 755-757.
Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <DOI:10.1063/1.1624639>.
Huaijun Tang et al., "Novel yellow phosphorescent iridium complexes containing a carbazoleeoxadiazole unit used in polymeric light-emitting diodes", Dyes and Pigments 91 (2011) pp. 413-421.
Imre et al (1996). "Liquid-liquid demixing ffrom solutions of polystyrene. 1. A review. 2. Improved correlation with solvent properties," J. Phys. Chem. Ref. Data, 25, 637-61.
International Preliminary Report on Patentability issued on Nov. 26, 2013 for Intl. Pat. App. No. PCT/US2012/039323 filed May 24, 2012 and published as WO 2012/162488 on Nov. 29, 2012 (Appli-

(56) References Cited

OTHER PUBLICATIONS cants—Arizona Board of Regents Acting for and on Behalf of Arizona State University; Inventors—Li et al.; (7 pages).
Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.
J. Park et al., 26 Semicond. Sci. Technol., 1-9 (2011) (Year: 2011).
Jack W. Levell et al., "Carbazole/iridium dendrimer side-chain phosphorescent copolymers for efficient light emitting devices", New J. Chem., 2012, vol. 36, pp. 407-413.
Jan Kalinowski et al., "Light-emitting devices based on organometallic platinum complexes as emitters," Coordination Chemistry Reviews, vol. 255, 2011, pp. 2401-2425.
Jeong et al. (2010). "Improved efficiency of bulk heterojunction poly (3-hexylthiophene): [6,6]-phenyl-C61-butyric acid methyl ester photovoltaic devices using discotic liquid crystal additives," Appl. Phys. Lett.. 96, 183305. (3 pages).
Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
JP2009267244, English Translation from EPO, Nov. 2009, 80 pages.
JP2010135689, English translation from EPO, dated Jun. 2010, 95 pages.
JP4460952 machine translation downloaded from Google patents Dec. 30, 2022, 21 pages.
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Kim et al (2009). "Altering the thermodynamics of phase separation in inverted bulk-heterojunction organic solar cells," Adv. Mater., 21, 3110-15.
Kim et al. (2005). "Device annealing effect in organic solar cells with blends of regioregular poly (3-hexylthiophene) and soluble fullerene," Appl. Phys. Lett. 86, 063502. (3 pages).
Kim, H.Y. et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI: 10.1002/adma.201504451>.
Kim, JJ., "Setting up the new efficiency limit of OLEDs; Abstract" [online], Electrical Engineering—Princeton University, Aug. 2014 [retrieved on Aug. 24, 2016], retrieved from the internet: <URL:http://ee.princeton.edu/events/setting-new-efficiency-limit-oled> 2 pages.
Kim, SY. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104 >.
Kroon et al. (2008). "Small bandgap olymers for organic solar cells," Polymer Reviews, 48, 531-82.
Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.
Kwong, R. et al., "High operational stability of electrophosphorescent devices", Applied Physics Letters, Jul. 2002 [available online Jun. 2002], vol. 81, No. 1, pp. 162-164 <DOI:10.1063/1.1489503>.
Lamansky, S. et al., "Cyclometalated Ir complexes in polymer organic light-emitting devices", Journal of Applied Physics, Aug. 2002 [available online Jul. 2002], vol. 92, No. 3, pp. 1570-1575 <10.1063/1.1491587>.
Lampe, T. et al., "Dependence of Phosphorescent Emitter Orientation on Deposition Technique in Doped Organic Films", Chemistry of Materials, Jan. 2016, vol. 28, pp. 712-715 <DOI:10.1021/acs.chemmater.5b04607>.
Lee et al. (2008). "Processing additives for inproved efficiency from bulk heterojunction solar cells," J. Am. Chem. Soc, 130, 3619-23.
Li et al. (2005). "Investigation of annealing effects and film thickness dependence of polymer solar cells based on poly (3-hexylthiophene)," J. Appl. Phys., 98, 043704. (5 pages).
Li et al. (2007). "Solvent annealing effect in polymer solar cells based on poly(3-hexylthiophene) and methanofullerenes," Adv. Funct. Mater, 17, 1636-44.
Li, J. et al., "Synthesis and characterization of cyclometalated Ir(III) complexes with pyrazolyl ancillary ligands", Polyhedron, Jan. 2004, vol. 23, No. 2-3, pp. 419-428 <DOI:10.1016/j.poly.2003.11.028>.
Li, J., "Efficient and Stable OLEDs Employing Square Planar Metal Complexes and Inorganic Nanoparticles", in DOE SSL R&D Workshop (Raleigh, North Carolina, 2016), Feb. 2016, 15 pages.
Li, J., et al., "Synthetic Control of Excited-State Properties in Cyclometalated Ir(III) Complexes Using Ancillary Ligands", Inorganic Chemistry, Feb. 2005, vol. 44, No. 6, pp. 1713-1727 <DOI:10.1021/ic048599h>.
Liang, et al. (2010). "For the bright future-bulk heterojunction polymer solar cells with power conversion efficiency of 7.4%,"Adv. Mater. 22, E135-38.
Lin, TA et al., "Sky-Blue Organic Light Emitting Diode with 37% External Quantum Efficiency Using Thermally Activated Delayed Fluorescence from Spiroacridine-Triazine Hybrid", Advanced Materials, Aug. 2016, vol. 28, No. 32, pp. 6876-6983 <DOI:10.1002/adma.201601675>.
Machine-translated English version of JP 2012/074444 A, Sekine Noboru, Apr. 12, 2012 (Year: 2012) 75 pages.
Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.
Marc Lepeltier et al., "Efficient blue green organic light-emitting devices based on a monofluorinated heteroleptic iridium(III) complex," Synthetic Metals, vol. 199, 2015, pp. 139-146.
Markham, J. et al., "High-efficiency green phosphorescence from spin-coated single-layer dendrimer light-emitting diodes", Applied Physics Lettersm Apr. 2002, vol. 80, vol. 15, pp. 2645-2647 <DOI:10.1063/1.1469218>.
Matthew J. Jurow et al., "Understanding and predicting the orientation of heteroleptic phosphors in organic light- emitting materials", Nature Materials, vol. 15, Jan. 2016, pp. 85-93.
Michl, J., "Relationship of bonding to electronic spectra", Accounts of Chemical Research, May 1990, vol. 23, No. 5, pp. 127-128 <DOI:10.1021/ar00173a001>.
Miller, R. et al., "Polysilane high polymers", Chemical Reviews, Sep. 1989, vol. 89, No. 6, pp. 1359-1410 <DOI:10.1021/cr00096a006>.
Morana et al. (2007). "Organic field-effect devices as tool to characterize the bipolar transport in polymer-fullerene blends: the case of P3HT-PCBM," Adv. Funct. Mat., 17, 3274-83.
Moule et al. (2008). "Controlling morphology in Polymer-Fullerene mixtures," Adv. Mater., 20, 240-45.
Murakami; JP 2007324309, English machine translation from EPO, dated Dec. 13, 2007, 89 pages.
Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <DOI:10.1021/ja021413y>.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Nillson et al. (2007). "Morphology and phase segregation of spin-casted films of polyfluorene/PCBM Blends," Macromolecules, 40, 8291-8301.

(56) References Cited

OTHER PUBLICATIONS

Olynick et al. (2009). "The link between nanoscale feature development in a negative resist and the Hansen solubility sphere," Journal of Polymer Science: Part B: Polymer Physics, 47, 2091-2105.

Peet et al. (2007). "Efficiency enhancement in low-bandgap polymer solar cells by processing with alkane dithiols," Nature Materials, 6, 497-500.

Pivrikas et al. (2008). "Substituting the postproduction treatment for bulk-heterojunction solar cells using chemical additives," Organic Electronics, 9, 775-82.

Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.

Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.

Results from SciFinder Compound Search on Dec. 8, 2016. (17 pages).

Rui Zhu et al., "Color tuning based on a six-membered chelated iridium (III) complex with aza-aromatic ligand," Chemistry Letters, vol. 34, No. 12, 2005, pp. 1668-1669.

Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.

S. Kunic et al., 54th International Symposium ELMAR-2012, 31-35 (2012) (Year: 2012).

S. Lamansky et al., "Synthesis and Characterization of Phosphorescent Cyclometalated Iridium Complexes", Inorg. Chem., vol. 40, pp. 1704-1711, 2001.

Sajoto, T. et al., "Temperature Dependence of Blue Phosphorescent Cyclometalated Ir(III) Complexes", Journal of the American Chemical Society, Jun. 2009, vol. 131, No. 28, pp. 9813-9822 <DOI:10.1021/ja903317w>.

Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, pp. 096601-1-096601-4 <DOI:10.7567/APEX.8.096601>.

Saricifci et al. (1993). "Semiconducting polymerbuckminsterfullerene heterojunctions: diodes photodiodes, and photovoltaic cells," Appl. Phys. Lett., 62, 585-87.

Satake et al., "Interconvertible Cationic and Neutral Pyridinylimidazole η3-Allylpalladium Complexes. Structural Assignment by 1H, 13C, and 15N NMR and X-ray Diffraction", Organometallics, vol. 18, No. 24, 1999, pp. 5108-5111.

Saunders et al. (2008). "Nanoparticle-polymer photovoltaic cells," Advances in Colloid and Interface Science, 138, 1-23.

Senes, A. et al., "Transition dipole moment orientation in films of solution processed fluorescent oligomers: investigating the influence of molecular anisotropy", Journal of Materials Chemistry C, Jun. 2016, vol. 4, No. 26, pp. 6302-6308 <DOI:10.1039/c5tc03481g>.

Shih-Chun Lo et al. "High-Triplet-Energy Dendrons: Enhancing the Luminescence of Deep Blue Phosphorescent Indium(III) Complexes" J. Am. Chem. Soc., vol. 131, 2009, pp. 16681-16688.

Shin et al. (2010). "Abrupt morphology change upon thermal annealing in Poly(3-hexathiophene)/soluble fullerene blend films for polymer solar cells," Adv. Funct. Mater., 20, 748-54.

Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).

Shizuo Tokito et al. "Confinement of triplet energy on phosphorescent molecules for highly-efficient organic blue-light-emitting devices" Applied Physics Letters, vol. 83, No. 3, Jul. 21, 2003, pp. 569-571.

Stefan Bernhard, "The First Six Years: A Report," Department of Chemistry, Princeton University, May 2008, 11 pages.

Stephen R. Forrest, "The path to ubiquitous and low-cost organic electronic appliances on plastic," Nature, vol. 428, Apr. 29, 2004, pp. 911-918.

Steven C. F. Kui et al., "Robust phosphorescent platinum(II) complexes with tetradentate O^N^C^N ligands: high efficiency OLEDs with excellent efficiency stability," Chem. Commun., 2013, vol. 49, pp. 1497-1499.

Steven C. F. Kui et al., "Robust Phosphorescent Platinum(II) Complexes Containing Tetradentate O^N^C^N Ligands: Excimeric Excited State and Application in Organic White-Light-Emitting Diodes," Chem. Eur. J., 2013, vol. 19, pp. 69-73.

Strouse, G. et al., "Optical Spectroscopy of Single Crystal [Re(bpy)(CO)4](PF6): Mixing between Charge Transfer and Ligand Centered Excited States", Inorganic Chemistry, Oct. 1995, vol. 34, No. 22, pp. 5578-5587 <DOI:10.1021/ic00126a031>.

Supporting Information: Xiao-Chun Hang et al., "Highly Efficient Blue-Emitting Cyclometalated Platinum(II) Complexes by Judicious Molecular Design," Wiley-VCH 2013, 7 pages.

Sylvia Bettington et al. "Tris-Cyclometalated Iridium(III) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.

T. Fleetham et al., 25 Advanced Materials, 2573-2576 (2013) (Year: 2013).

Tang, C. et al., "Organic electroluminescent diodes", Applied Physics Letters, Jul. 1987, vol. 51, No. 12, pp. 913-915 <DOI:10.1063/1.98799>.

Tsuoboyama, A. et al., "Homoleptic Cyclometalated Iridium Complexes with Highly Efficient Red Phosphorescence and Application to Organic Light-Emitting Diode", Journal of the American Chemical Society, Sep. 2003, vol. 125, No. 42, pp. 12971-12979 <DOI:10.1021/ja034732d>.

Turro, N., "Modern Molecular Photochemistry" (Sausalito, California, University Science Books, 1991), p. 48. (3 pages).

Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.

Tyler Fleetham et al., "Efficient Red-Emitting Platinum Complex with Long Operational Stability," ACS Appl. Mater. Interfaces 2015, 7, 16240-16246.

Tyler Fleetham, "Phosphorescent Pt(II) and Pd(II) Complexes for Efficient, High-Color-Quality, and Stable OLEDs", 52 pages, Material Science and Engineering, Arizona State University (Year: 2016).

V. Adamovich et al., "High efficiency single dopant white electrophosphorescent light emitting diodes", New J. Chem, vol. 26, pp. 1171-1178. 2002.

V. Thamilarasan et al., "Green-emitting phosphorescent iridium(III) complex: Structural, photophysical and electrochemical properties," Inorganica Chimica Acta, vol. 408, 2013, pp. 240-245.

Vanessa Wood et al., "Colloidal quantum dot light-emitting devices," Nano Reviews 1, Jul. 2010, pp. 5202. (7 pages).

Vezzu, D. et al.: Highly luminescent tridentate platinum (II) complexes featured in fused five-six-membered metallacycle and diminishing concentration quenching. Inorganic Chem., vfol. 50 (17), pp. 8261-8273, 2011.

Wang et al. (2010). "The development of nanoscale morphology in polymer: fullerene photovoltaic blends during solvent casting," Soft Matter, 6, 4128-4134.

Wang et al., C(aryl)-C(alkyl) bond formation from Cu(Cl04)2-mediated oxidative cross coupling reaction between arenes and alkyllithium reagents through structurally well-defined Ar—Cu(III) intermediates, Chem Commun, 48: 9418-9420 (2012).

Williams et al., "Organic light-emitting diodes having exclusive near-infrared electrophosphorescence", Applied Physics Letters, vol. 89, pp. 083506 (3 pages), 2006.

Williams, E. et al., "Excimer-Based White Phosphorescent Organic Light-Emitting Diodes with Nearly 100 % Internal Quantum Efficiency", Advanced Materials, Jan. 2007, vol. 19, No. 2, pp. 197-202 <DOI:10.1002/adma.200602174>.

(56) References Cited

OTHER PUBLICATIONS

Wong. Challenges in organometallic research-Great opportunity for solar cells and OLEDs. Journal of Organometallic Chemistry 2009, vol. 694, pp. 2644-2647.
Written Opinion mailed on Aug. 17, 2012 for Intl. Pat. App. No. PCT/US2012/039323 filed May 24, 2012 and published as WO 2012/162488 on Nov. 29, 2012 (Applicants—Arizona Board of Regents Acting for and on Behalf of Arizona State University; Inventors—Li et al.; (6 pages).
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Xiaofan Ren et al., "Ultrahigh Energy Gap Hosts in Deep Blue Organic Electrophosphorescent Devices," Chem. Mater., vol. 16, 2004, pp. 4743-4747.
Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.
Y. Karzazi, 5 J. Mater. Environ. Sci., 1-12 (2014) (Year: 2014).
Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, No. 5, pp. 755-760.
Yang et al. (2005). "Nanoscale morphology of high-performance polymer solar cells," Nano Lett., 5, 579-83.
Yang, X. et al., "Efficient Blue- and White-Emitting Electrophosphorescent Devices Based on Platinum(II) [1,3-Difluoro-4,6-di(2-pyridinyl)benzene] Chloride", Advanced Materials, Jun. 2008, vol. 20, No. 12, pp. 2405-2409 <DOI:10.1002/adma.200702940>.
Yao et al. (2008). "Effect of solvent mixture on nanoscale phase separation in polymer solar cells," Adv. Funct. Mater., 18, 1783-89.
Yao et al., Cu(ClO4)2-Mediated Arene C—H Bond Halogenations of Azacalixaromatics Using Alkali Metal Halides as Halogen Sources, The Journal of Organic Chemistry, 77(7): 3336-3340 (2012).
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Yu et al. (1995). "Polymer Photovoltaic Cells: Enhanced efficiencies via a network of internal donor-acceptor heterojunctions," Science, 270, 1789-91.
Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.
Z Xu et al., "Synthesis and properties of iridium complexes based 1,3,4-oxadiazoles derivatives", Tetrahedron 64 (2008) pp. 1860-1867.
Zhi-Qiang Zhu et. al., "Efficient Cyclometalated Platinum(II) Complex with Superior Operational Stability," Adv. Mater. 29 (2017) 1605002, pp. 1-5.
Zhi-Qiang Zhu et.al., "Harvesting All Electrogenerated Excitons through Metal Assisted Delayed Fluorescent Materials," Adv. Mater. 27 (2015) 2533-2537.
Zhu, W. et al., "Highly efficient electrophosphorescent devices based on conjugated polymers doped with iridium complexes", Applied Physics Letters, Mar. 2002, vol. 80, No. 12, pp. 2045-2047 <DOI:10.1063/1.1461418>.
Chinese Office Action issued in App. No. CN202110548036, dated Aug. 8, 2024, 10 pages.

* cited by examiner

GREEN AND RED ORGANIC LIGHT-EMITTING DIODES EMPLOYING EXCIMER EMITTERS

CROSS-REFERENCE TO RELATED APPLICATIONS

The present application is a continuation of U.S. patent application Ser. No. 17/038,402, filed Sep. 30, 2020, now allowed, which claims priority to U.S. Provisional Application No. 62/909,341, filed Oct. 2, 2019, all of which applications are incorporated herein in their entireties.

BACKGROUND OF THE INVENTION

During the last decade, organic light emitting diodes (OLEDs) have undergone great development in the display industry, such as improved performance in both color and definition. In 2009, LG solved the large size OLED display and commercialized a 15-inch OLED TV set which was based on a fine metal mask (FMM) and low temperature poly silicon (LTPS) thin film transistor (TFT). In the emitting portions of the device forming the full color display, the blue stack and red/green (R/G) stack consist of an RGB sub-pixel. Since a highly stable phosphorescent blue emitter is very difficult to achieve, the fluorescent blue stack has since been replaced in the commercial TV. For the R/G layer, highly stable and efficient materials were applied. Although the R/G pixel is commercial now, searching for much more efficient and stable materials is of utmost interest in the OLED research.

There is need in the art for green and/or red emitters having high stability and efficiency. The present invention satisfies this unmet need.

SUMMARY

In one aspect, the present disclosure relates to an organic light emitting device (OLED) comprising:
  an anode;
  a cathode; and
  an organic region, disposed between the anode and the cathode, comprising a first complex and a second complex;
  wherein when a voltage is applied across the anode and cathode at room temperature, the OLED emits a luminescent radiation that comprises one or more luminescent radiation components resulting from the formation of at least one exciplex;
  wherein the exciplex is formed by at least one of the following aggregate types:
  1) at least one aggregate within the first complex, and at least one aggregate within the second complex;
  2) at least one aggregate between the first and the second complex; and
  3) both 1 and 2.

According to another aspect, the OLED is incorporated into a consumer product.

BRIEF DESCRIPTION OF THE DRAWINGS

The following detailed description of preferred embodiments of the invention will be better understood when read in conjunction with the appended drawings. For the purpose of illustrating the invention, there are shown in the drawings embodiments which are presently preferred. It should be understood, however, that the invention is not limited to the precise arrangements and instrumentalities of the embodiments shown in the drawings.

DETAILED DESCRIPTION

Definitions

Figure 1:
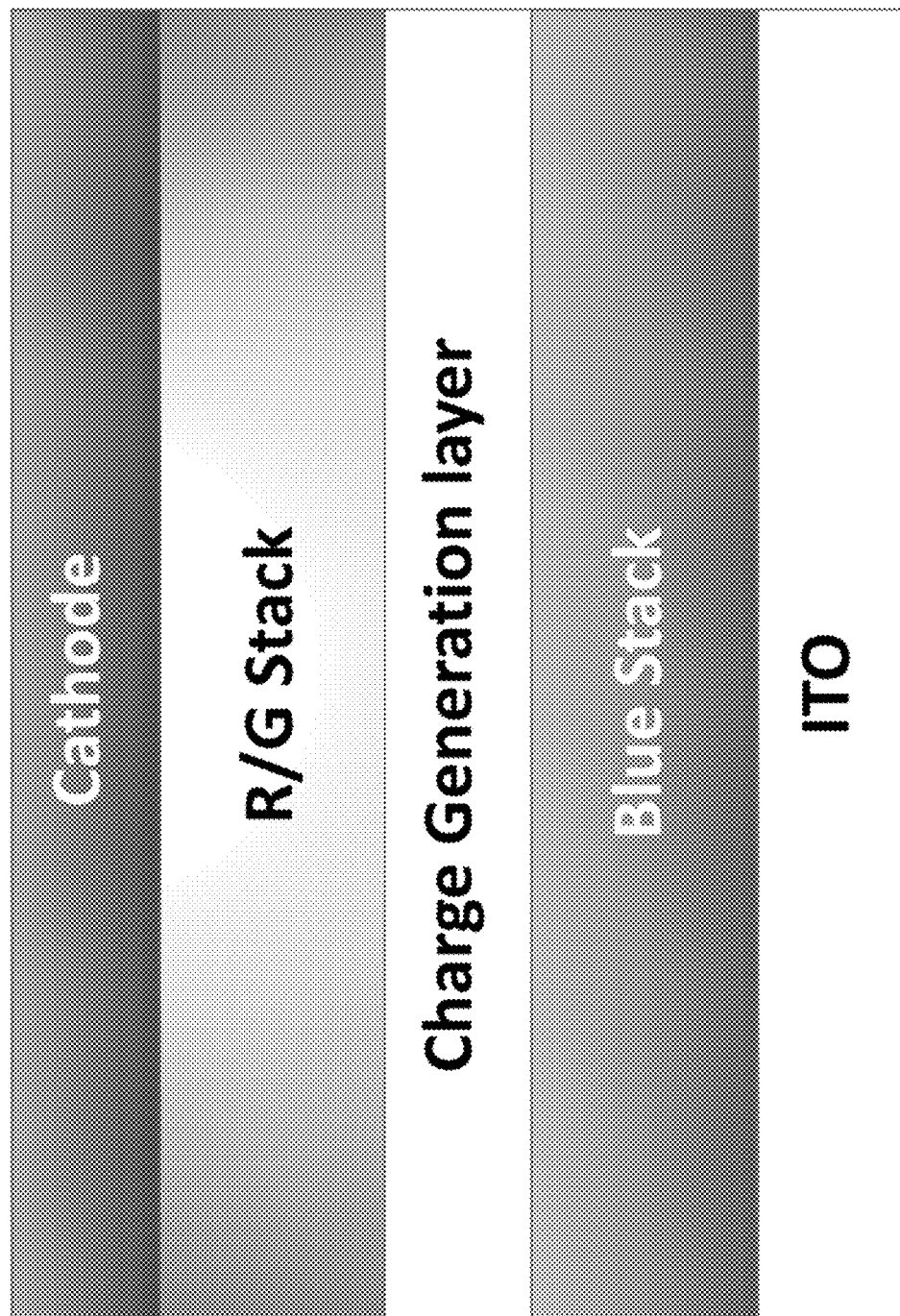
FIG. 1 is a schematic diagram of a hybrid tandem white OLED (WOLED) structure.

It is to be understood that the figures and descriptions of the present invention have been simplified to illustrate elements that are relevant for a clear understanding of the present invention, while eliminating, for the purpose of clarity, many other elements found in the art related to phosphorescent organic light emitting devices and the like. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods, materials and components similar or equivalent to those described herein can be used in the practice or testing of the present invention, the preferred methods, and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, or ±0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Disclosed are the components to be used to prepare the compositions of the disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific embodiment or combination of embodiments of the methods of the invention.

As referred to herein, a linking atom or a linking group can connect two groups such as, for example, an N and C group. The linking atom can optionally, if valency permits, have other chemical moieties attached. For example, in one aspect, an oxygen would not have any other chemical groups attached as the valency is satisfied once it is bonded to two groups (e.g., N and/or C groups). In another aspect, when carbon is the linking atom, two additional chemical moieties can be attached to the carbon. Suitable chemical moieties includes, but are not limited to, hydrogen, hydroxyl, alkyl, alkoxy, =O, halogen, nitro, amine, amide, thiol, aryl, heteroaryl, cycloalkyl, and heterocyclyl.

The term "cyclic structure" or the like terms used herein refer to any cyclic chemical structure which includes, but is not limited to, aryl, heteroaryl, cycloalkyl, cycloalkenyl, and heterocyclyl.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The term "polyalkylene group" as used herein is a group having two or more $CH_2$ groups linked to one another. The polyalkylene group can be represented by the formula $-(CH_2)_a-$, where "a" is an integer of from 2 to 500.

The terms "alkoxy" and "alkoxyl" as used herein to refer to an alkyl or cycloalkyl group bonded through an ether linkage; that is, an "alkoxy" group can be defined as $-OA^1$ where $A^1$ is alkyl or cycloalkyl as defined above. "Alkoxy" also includes polymers of alkoxy groups as just described; that is, an alkoxy can be a polyether such as $-OA^1-OA^2$ or $-OA^1-(OA^2)_a-OA^3$, where "a" is an integer of from 1 to 200 and $A^1$, $A^2$, and $A^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as $(A^1A^2)C=C(A^3A^4)$ are intended to include both the E and Z isomers. This can be presumed in structural formulae herein wherein an asymmetric alkene is present, or it can be explicitly indicated by the bond symbol C=C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bond, i.e., C=C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptynyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula $-C(O)H$. Throughout this specification "C(O)" is a short hand notation for a carbonyl group, i.e., C=O.

The terms "amine" or "amino" as used herein are represented by the formula $-NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula $-NH(-alkyl)$ where alkyl is a described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula $-N(-alkyl)_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula $-C(O)OH$.

The term "ester" as used herein is represented by the formula $-OC(O)A^1$ or $-C(O)OA^1$, where $A^1$ can be alkyl, cycloalkyl, alkenyl, cycloalkenyl, alkynyl, cycloalkynyl, aryl, or heteroaryl group as described herein. The term "polyester" as used herein is represented by the formula $-(A^1O(O)C-A^2-C(O)O)$, or $-(A^1O(O)C-A^2-OC(O))_a-$, where $A^1$ and $A^2$ can be, independently, an alkyl, cycloalkyl, alkenyl, cycloalkynyl, aryl, or heteroaryl group described herein and "a" is an integer from 1 to 500. "Polyester" is as the term used to describe a group that is produced by the reaction between a compound having at least two carboxylic acid groups with a compound having at least two hydroxyl groups.

The term "ether" as used herein is represented by the formula $A^1OA^2$, where $A^1$ and $A^2$ can be, independently, an alkyl, cycloalkyl, alkenyl, cycloalkenyl, alkynyl, cycloalkynyl, aryl, or heteroaryl group described herein. The term "polyether" as used herein is represented by the formula $-(A^1O-A^2O)_a-$, where $A^1$ and $A^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "halide" as used herein refers to the halogens fluorine, chlorine, bromine, and iodine.

The term "heterocyclyl," as used herein refers to single and multi-cyclic non-aromatic ring systems and "heteroaryl" as used herein refers to single and multi-cyclic aromatic ring systems: in which at least one of the ring members is other than carbon. The term "heterocyclyl" includes azetidine, dioxane, furan, imidazole, isothiazole, isoxazole, morpholine, oxazole, oxazole, including, 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "ketone" as used herein is represented by the formula $A^1C(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "azide" as used herein is represented by the formula $-N_3$.

The term "nitro" as used herein is represented by the formula $-NO_2$.

The term "nitrile" as used herein is represented by the formula —CN.

The term "ureido" as used herein refers to a urea group of the formula $-NHC(O)NH_2$ or $-NHC(O)NH-$.

The term "phosphoramide" as used herein refers to a group of the formula $-P(O)(NA^1A^2)_2$, where $A^1$ and $A^2$ can be, independently, hydrogen or an alkyl, cycloalkyl, alkoxy, alkenyl, cycloalkenyl, alkynyl, cycloalkynyl, aryl, or heteroaryl group as described herein.

The term "carbamoyl" as used herein refers to an amide group of the formula $-CONA^1A^2$, where $A^1$ and $A^2$ can be, independently, hydrogen or an alkyl, cycloalkyl, alkoxy, alkenyl, cycloalkenyl, alkynyl, cycloalkynyl, aryl, or heteroaryl group as described herein.

The term "sulfamoyl" as used herein refers to a group of the formula $-S(O)_2NA^1A^2$, where $A^1$ and $A^2$ can be, independently, hydrogen or an alkyl, cycloalkyl, alkoxy, alkenyl, cycloalkenyl, alkynyl, cycloalkynyl, aryl, or heteroaryl group as described herein.

The term "silyl" as used herein is represented by the formula $-SiA^1A^2A^3$, where $A^1$, $A^2$, and $A^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas $-S(O)A^1$, $-S(O)_2A^1$, $-OS(O)_2A^1$, or $-OS(O)_2OA^1$, where $A^1$ is hydrogen or an alkyl, cycloalkyl, alkenyl, cycloalkenyl, alkynyl, cycloalkynyl, aryl, or heteroaryl group as described herein. Throughout this specification "S(O)" is a short hand notation for S=O. The term "sulfonyl" is used herein to refer to the sulfo-oxo group represented by the formula $-S(O)_2A^1$, where $A^1$ is hydrogen or an alkyl, cycloalkyl, alkenyl, cycloalkenyl, alkynyl, cycloalkynyl, aryl, or heteroaryl group as described herein. The term "sulfone" as used herein is represented by the formula $A^1S(O)_2A^2$, where $A^1$ and $A^2$ can be, independently, an alkyl, cycloalkyl, alkenyl, cycloalkenyl, alkynyl, cycloalkynyl, aryl, or heteroaryl group as described herein. The term "sulfoxide" as used herein is represented by the formula $A^1S(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "thiol" as used herein is represented by the formula —SH.

The term "polymeric" includes polyalkylene, polyether, polyester, and other groups with repeating units, such as, but not limited to $-(CH_2O)_n-CH_3$, $-(CH_2CH_2O)_n-CH_3$, $-[CH_2CH(CH_3)]_n-CH_3$, $-[CH_2CH(COOCH_3)]_n-CH_3$, $-[CH_2CH(COOCH_2CH_3)]_n-CH_3$, and $-[CH_2CH(COO^tBu)]_n-CH_3$, where n is an integer (e.g., n>1 or n>2).

"R," "$R^1$," "$R^2$," "$R^3$," "$R^n$," where n is an integer, as used herein can, independently, include hydrogen or one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within a second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

As described herein, compounds of the disclosure may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this disclosure are preferably those that result in the formation of stable or chemically feasible compounds. It is also contemplated that, in certain aspects, unless expressly indicated to the contrary, individual substituents can be further optionally substituted (i.e., further substituted or unsubstituted).

In some aspects, a structure of a compound can be represented by a formula:

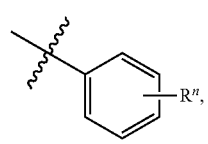

which is understood to be equivalent to a formula:

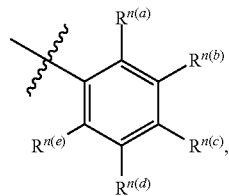

wherein n is typically an integer. That is, $R^n$ is understood to represent five independent substituents, $R^{n(a)}$, $R^{n(b)}$, $R^{n(c)}$, $R^{n(d)}$, $R^{n(e)}$. By "independent substituents," it is meant that each R substituent can be independently defined. For example, if in one instance $R^{n(a)}$ is halogen, then $R^{n(b)}$ is not necessarily halogen in that instance.

Several references to R, $R^1$, $R^2$, $R^3$, $R^4$, $R^5$, $R^6$ etc. are made in chemical structures and moieties disclosed and described herein. Any description of R, $R^1$, $R^2$, $R^3$, $R^4$, $R^5$, $R^6$, etc. in the specification is applicable to any structure or moiety reciting R, $R^1$, $R^2$, $R^3$, $R^4$, $R^5$, $R^6$, etc. respectively.

Compositions of the Invention

In one aspect, the present invention relates to a composition comprising a first complex and a second complex, wherein the first complex and the second complex each have a structure independently selected from General Formula I and General Formula II:

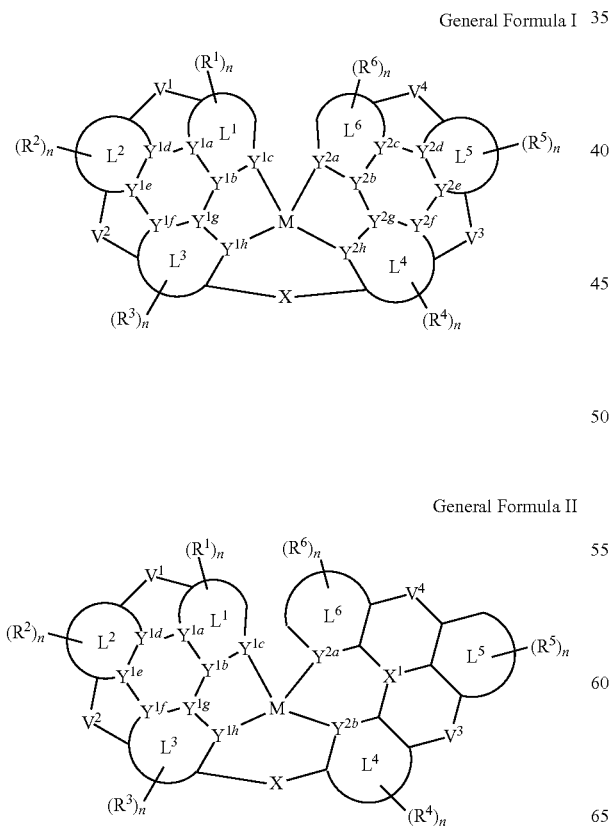

wherein, in General Formula I and General Formula II:

M represents Pt(II), Pd(II), Ir(I), Rh(I), Au(III);

$Y^{1a}$, $Y^{1b}$, $Y^{1c}$, $Y^{1f}$, $Y^{1g}$, $Y^{1h}$, $Y^{2a}$, $Y^{2b}$, $Y^{2c}$, $Y^{2f}$, $Y^{2g}$, $Y^{2h}$ each independently represents C or N;

$Y^{1d}$, $Y^{1e}$, $Y^{2d}$, $Y^{2e}$ each is independently absent or present, and if present, $Y^{1d}$, $Y^{1e}$, $Y^{2d}$, $Y^{2e}$ each independently represents C or N;

X and $X^1$ each is independently present or absent, and, if present, each of X and $X^1$ independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7R^8$, $R^7Bi$=O, or $BiR^7$;

$R^1$, $R^2$, $R^3$, $R^4$, $R^5$, $R^6$, $R^7$, and $R^8$ each is independently absent or present as a single substituent or multiple substituents, valency permitting, and, if present, each of $R^1$, $R^2$, $R^3$, $R^4$, $R^5$, $R^6$, $R^7$, and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof;

$L^1$, $L^3$, $L^4$, and $L^6$ each independently represents a 5- to 10-membered aryl, heteroaryl, fused aryl, or fused heteroaryl;

$L^2$ and $L^5$ each is independently present or absent, and, if present, $L^2$ and $L^5$ each independently represents a 5- to 10-membered aryl, heteroaryl, fused aryl, or fused heteroaryl;

$V^1$, $V^2$, $V^3$, $V^4$ each is independently present, absent, or a covalent bond, and if present, each of $V^1$, $V^2$, $V^3$, $V^4$ independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, Bi=O, $CR^7R^8$, C=O, $SiR^7R^8$, $GeR^7R^8$, $PR^7$, $PR^7R^8$, $R^7O$=O, $AsR^7$, $R^7As$=O, S=O, $SO_2$, Se=O, $SeO_2$, $BR^7R^8$, $AlR^7R^8$, $R^7Bi$=O, or $BiR^7$;

each n is independently an integer, valency permitting;

wherein the first complex and the second complex have different structures.

In one embodiment, at least one of $V^3$, $V^4$, or $X^1$ is present in General Formula I or General Formula II.

In one embodiment, M in one of the first complex and the second complex is Pt(II); and M in the other of the first complex and the second complex is Pd(II).

In one embodiment, the first complex and the second complex each have a structure of General Formula I.

In one embodiment, at least one of the first complex and the second complex is a complex of General Formula III, General Formula IV, General Formula V, or General Formula VI

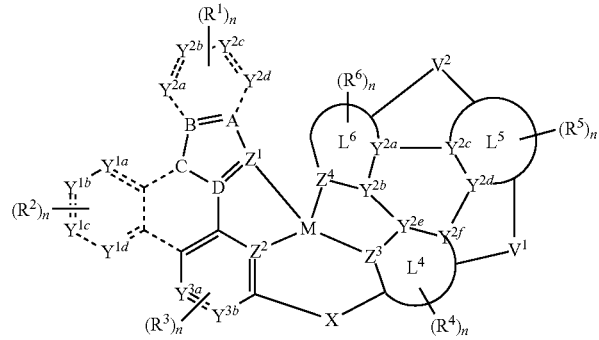

General Formula III

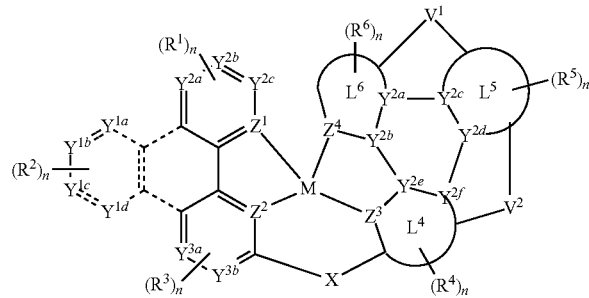

General Formula IV

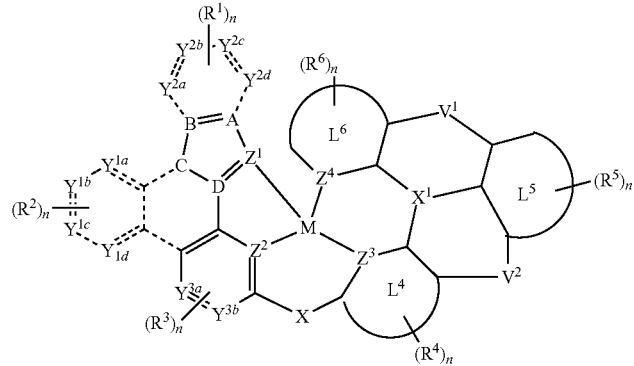

General Formula V

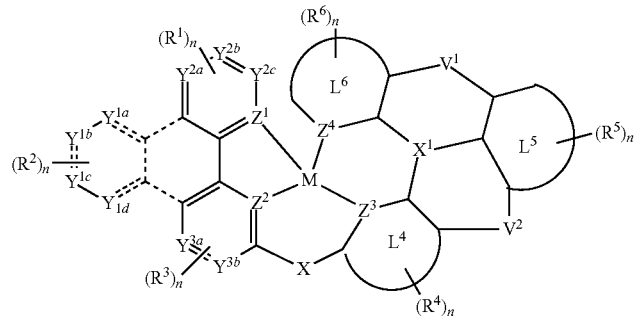

General Formula VI wherein, in General Formulas
M represents Pt(II), Pd(II), Ir(I), Rh(I), or Au(III);
each $Y^{1a}$, $Y^{1b}$, $Y^{1c}$, $Y^{1d}$, $Y^{2a}$, $Y^{2b}$, $Y^{2c}$, $Y^{2d}$, $Y^{2e}$, $Y^{2f}$, $Y^{3a}$, $Y^{3b}$, $Z^1$, $Z^2$, $Z^3$ and $Z^4$ independently represents C or N;
X and $X^1$ each is independently present or absent, and, if present, each of X and $X^1$ independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7R^8$, $R^7Bi$=O, or $BiR^7$;
A, B, C, and D each independently represents C, N, O, or S;
$R^1$, $R^2$, $R^3$, $R^4$, $R^5$, $R^6$, $R^7$, and $R^8$ each is independently absent or present as a single substituent or multiple substituents, valency permitting, and, if present, each of R¹, R², R³, R⁴, R⁵, R⁶, R⁷, and R⁸ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof;

$L^4$, $L^5$, and $L^6$ each independently represents a 5- to 10-membered aryl, heteroaryl, fused aryl, or fused heteroaryl;

$V^1$ and $V^2$ each is independently present, absent, or a covalent bond, and if present, each of $V^1$ and $V^2$ independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $ALR^7$, $AlR^7R^8$, $R^7Bi$=O, or $BiR^7$; and each n is independently an integer, valency permitting.

In one embodiment, at least one of $V^1$, $V^2$, or $X^1$ is present in General Formulas III-VI.

In one embodiment, one of the first complex and the second complex has a structure of General Formula III, and the other of the first complex and the second complex has a structure of General Formula IV.

In one embodiment, at least one of the first complex and the second complex is a complex of General Formula VII, General Formula VIII, General Formula IX, General Formula X, General Formula XI, General Formula XII, General Formula XIII, General Formula XIV, General Formula XV, General Formula XVI, General Formula XVII, General Formula XVIII, General Formula XIX, General Formula XX, General Formula XXI, General Formula XXII, General Formula XXIII, or General Formula XXIV:

General Formula VII

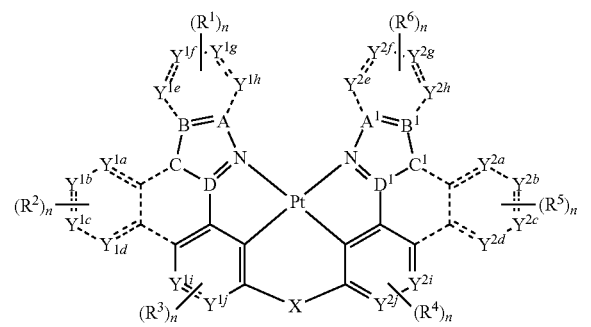

General Formula VIII

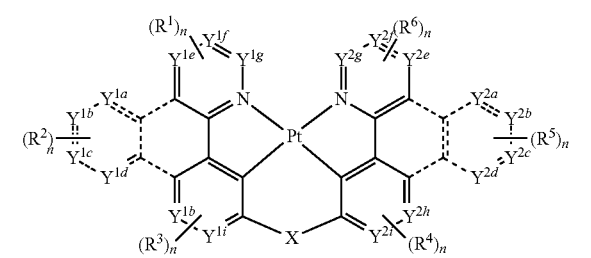

General Formula IX

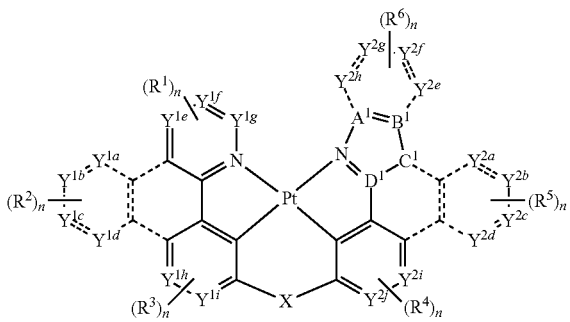

General Formula X

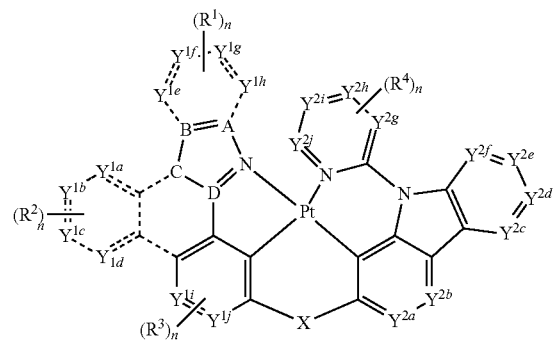

General Formula XI

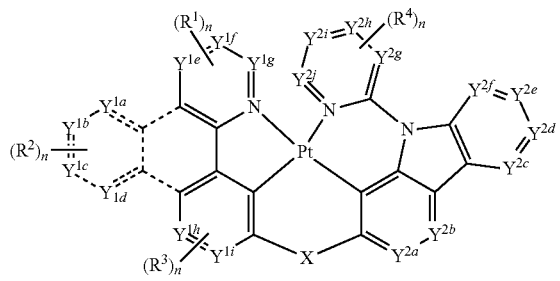

General Formula XII

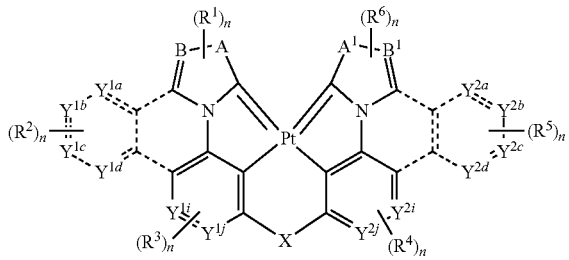

General Formula XIII

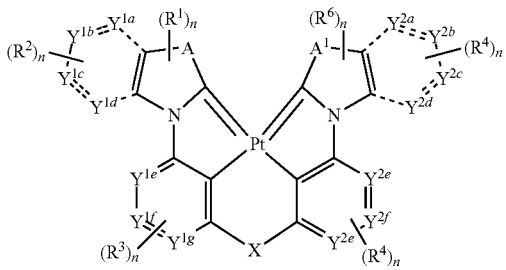

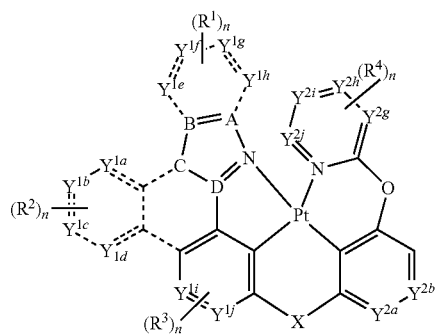

-continued

General Formula XXIII

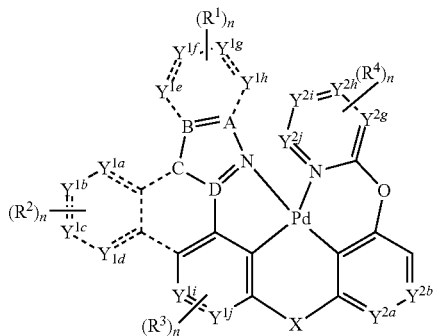

General Formula XXIV

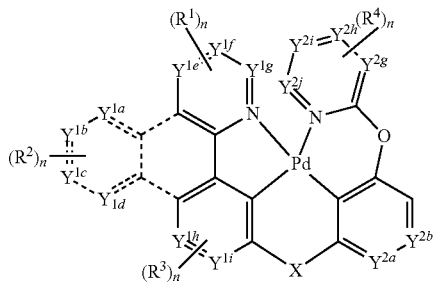

General Formula XXV

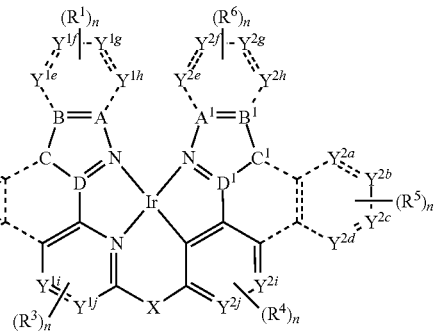

General Formula XXVI

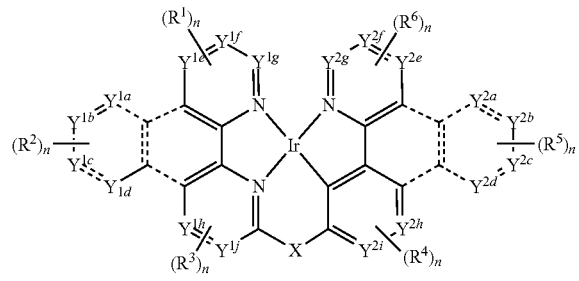

General Formula XXVII

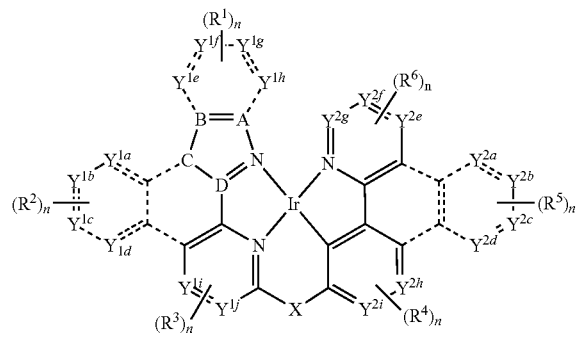

General Formula XXVIII

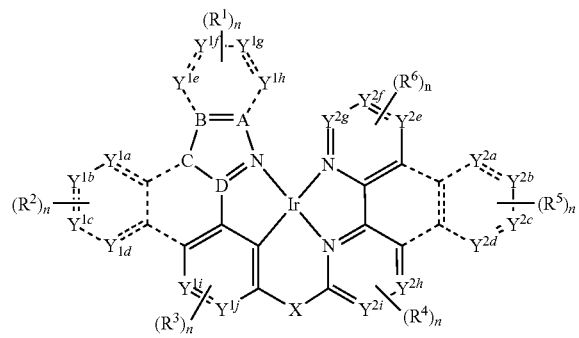

wherein, in General Formulas VII-XXIV:

$Y^{1a}$, $Y^{1b}$, $Y^{1c}$, $Y^{1d}$, $Y^{1e}$, $Y^{1f}$, $Y^{1g}$, $Y^{1h}$, $Y^{1i}$, $Y^{1j}$, $Y^{2a}$, $Y^{2b}$, $Y^{2c}$, $Y^{2d}$, $Y^{2e}$, $Y^{2f}$, $Y^{2g}$, $Y^{h2}$, $Y^{2i}$, $Y^{2j}$ each independently represents C or N;

X is independently present or absent, and, if present, X independently represents C, N, Si, O, S, Ge, P, As, Se, B, Al, or Bi, or if valency permits, X independently represents $CR^7$, $SiR^7$, $GeR^7$, $NR^7$, $P=O$, $As=O$, B, $BR^7$, $Bi=O$, $CR^7R^8$, $C=O$, $SiR^7R^8$, $GeR^7R^8$, $PR^7$, $PR^7R^8$, $R^7P=O$, $AsR^7$, $R^7As=O$, $S=O$, $SO_2$, $Se=O$, $SeO_2$, $BR^7R^8$, $AlR^7R^8$, $R^7Bi=O$, or $BiR^7$;

A, B, C, D, $A^1$, $B^1$, $C^1$, and $D^1$ each independently represents C, N, O, S;

$R^1$, $R^2$, $R^3$, $R^4$, $R^5$, $R^6$, $R^7$, and $R^8$ is each independently absent or present as a single substituent or multiple substituents, valency permitting, and, if present, each of $R^1$, $R^2$, $R^3$, $R^4$, $R^5$, $R^6$, $R^7$, and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; and each n is independently an integer, valency permitting.

In one embodiment, at least one of the first complex and the second complex has a structure of General Formula VIII.

In one embodiment, at least one of the first complex and the second complex is a complex of General Formula XXV, General Formula XXVI, General Formula XXVII, General Formula)(XVIII, General Formula XXIX, General Formula XXX, General Formula XXXI, or General Formula XXXII:

-continued

General Formula XXIX

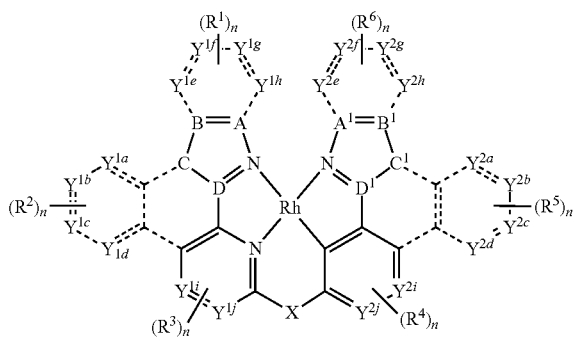

General Formula XXX

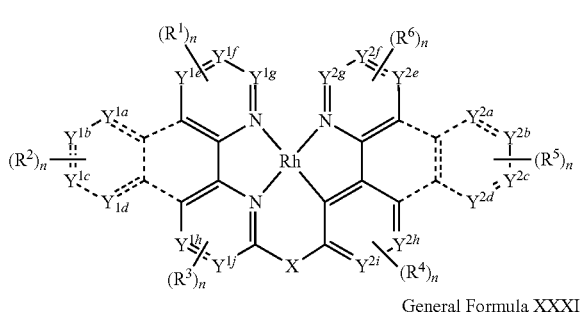

General Formula XXXI

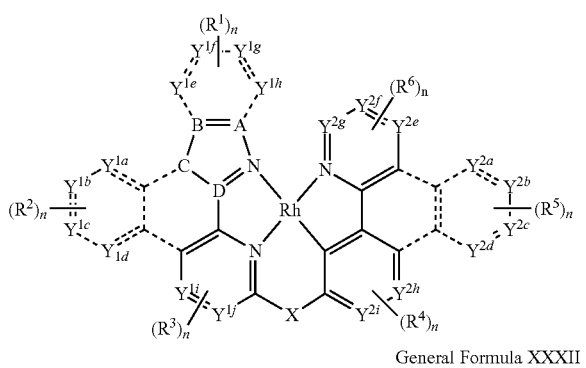

General Formula XXXII

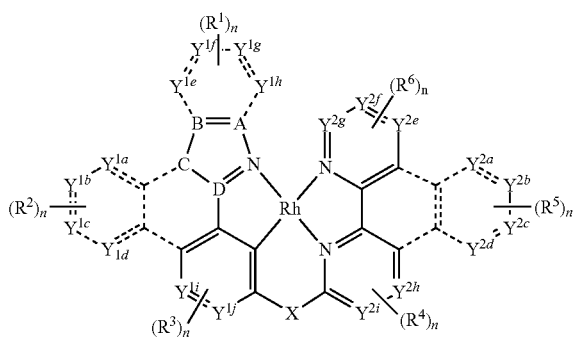

wherein, in General Formulas XXV-XXXII:

$Y^{1a}, Y^{1b}, Y^{1c}, Y^{1d}, Y^{1e}, Y^{1f}, Y^{1g}, Y^{1h}, Y^{1i}, Y^{1j}, Y^{2a}, Y^{2b}, Y^{2c}, Y^{2d}, Y^{2e}, Y^{2f}, Y^{2g}, Y^{2h}, Y^{2i}, Y^{2j}$ each independently represents C or N;

X is independently present or absent, and, if present, X independently represents C, N, Si, O, S, Ge, P, As, Se, B, Al, or Bi, or if valency permits, X independently represents $CR^7$, $SiR^7$, $GeR^7$, $NR^7$, P=O, As=O, B, $BR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7R^8$, $R^7Bi$=O, or $BiR^7$;

A, B, C, D each independently represents C, N, O, S;

$R^1, R^2, R^3, R^4, R^5, R^6, R^7$, and $R^8$ is each independently absent or present as a single substituent or multiple substituents, valency permitting, and, if present, each of $R^1, R^2, R^3, R^4, R^5, R^6, R^7$, and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; and each n is independently an integer, valency permitting.

In one embodiment, at least one of the first complex and the second complex is a complex of General Formula XXXIII, General Formula XXXIV, or General Formula XXXV:

General Formula XXXIII

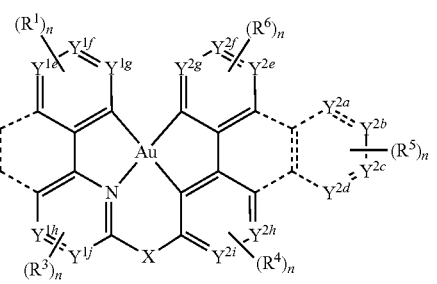

General Formula XXXIV

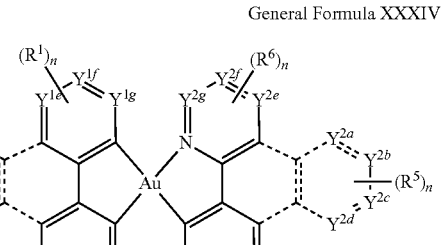

General Formula XXXV

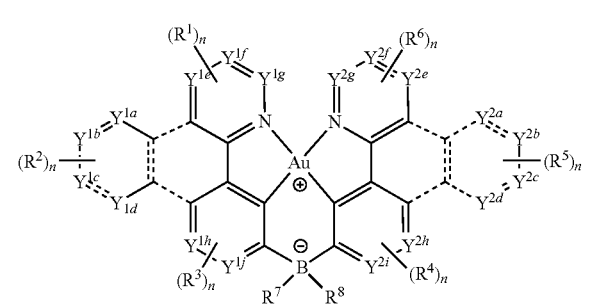

wherein, in General Formulas XXXIII-XXXV:

$Y^{1a}, Y^{1b}, Y^{1c}, Y^{1d}, Y^{1e}, Y^{1f}, Y^{1g}, Y^{1h}, Y^{1i}, Y^{2a}, Y^{2b}, Y^{2c}, Y^{2d}, Y^{2e}, Y^{2f}, Y^{2g}, Y^{2h}, Y^{2i}$, each independently represents C or N;

X is independently present or absent, and, if present, X independently represents C, N, Si, O, S, Ge, P, As, Se, B, Al, or Bi, or if valency permits, each X independently represents $CR^7$, $SiR^7$, $GeR^7$, $NR^7$, $P=O$, $As=O$, B, $BR^7$, $Bi=O$, $CR^7R^8$, $C=O$, $SiR^7R^8$, $GeR^7R^8$, $PR^7$, $PR^7R^8$, $R^7P=O$, $AsR^7$, $R^7As=O$, $S=O$, $SO_2$, $Se=O$, $SeO_2$, $BR^7R^8$, $AlR^7R^8$, $R^7Bi=O$, or $BiR^7$;

$R^1$, $R^2$, $R^3$, $R^4$, $R^5$, $R^6$, $R^7$, and $R^8$ is each independently absent or present as a single substituent or multiple substituents, valency permitting, and, if present, each of $R^1$, $R^2$, $R^3$, $R^4$, $R^5$, $R^6$, $R^7$, and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; and each n is independently an integer, valency permitting.

In one embodiment, the dotted lines in any of General Formulas III-XXXV indicate that the dotted bonds and/or atoms may be present or may not be present.

In one embodiment, in at least one of the first complex and the second complex, each instance of $R^1$-$R^5$ in any of General Formulas I-XXXV comprises hydrogen.

In one embodiment, in at least one of the first complex and the second complex, at least one $R^2$ in any of General Formulas I-XXXV is a $C_1$-$C_6$ linear alkyl group. In one embodiment, at least one $R^2$ in any of General Formulas I-XXXV is a $C_3$-$C_6$ branched alkyl group.

In one embodiment, in at least one of the first complex and the second complex, at least one $R^2$ in any of General Formulas I-XXXV is selected from the group consisting of:

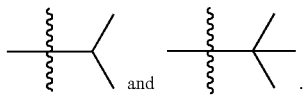

In one embodiment, in at least one of the first complex and the second complex, at least one $R^2$ in any of General Formulas I-XXXV is an optionally substituted aryl group. In one embodiment, at least one $R^2$ in any of General Formulas I-XXXV is an optionally substituted $C_6$-$C_{24}$ aryl group. In one embodiment, at least one $R^2$ in any of General Formulas I-XXXV is a $C_6$ aryl group substituted with one or more $C_1$-$C_6$ linear alkyl groups. In one embodiment, at least one $R^2$ in any of General Formulas I-XXXV is a $C_6$ aryl group substituted with one or more $C_3$-$C_6$ branched alkyl groups.

In one embodiment, in at least one of the first complex and the second complex, at least one $R^2$ in any of General Formulas I-XXXV is selected from the group consisting of:

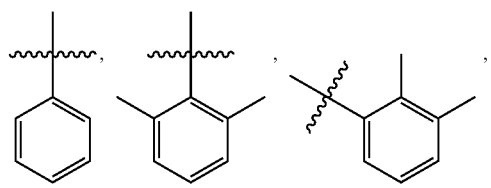

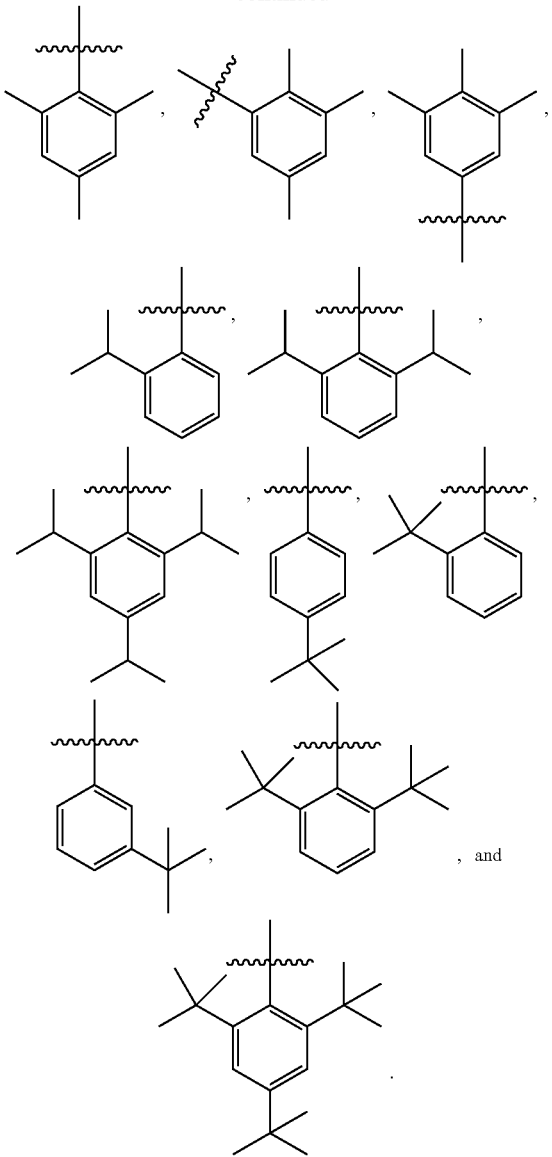

In one embodiment, at least one of $R^1$, $R^2$, $R^3$, $R^4$, $R^5$, or $R^6$ in any of General Formulas I-XXXV is a $C_1$-$C_6$ linear alkyl group. In one embodiment, at least one of $R^1$, $R^2$, $R^3$, $R^4$, $R^5$, or $R^6$ in any of General Formulas I-XXXV is a $C_3$-$C_6$ branched alkyl group.

In one embodiment, at least one of $R^1$, $R^2$, $R^3$, $R^4$, $R^5$, or $R^6$ in any of General Formulas I-XXXV is selected from the group consisting of:

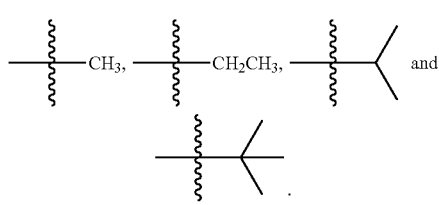

In one embodiment, in at least one of the first complex and the second complex, at least one of $R^1$, $R^2$, $R^3$, $R^4$, $R^5$, or $R^6$ in any of General Formulas I-XXXV is an optionally substituted aryl group. In one embodiment, at least one of $R^1$, $R^2$, $R^3$, $R^4$, $R^5$, or $R^6$ in any of General Formulas I-XXXV is an optionally substituted $C_6$-$C_{24}$ aryl group. In one embodiment, at least one of $R^1$, $R^2$, $R^3$, $R^4$, $R^5$, or $R^6$ in any of General Formulas I-XXXV is an unsubstituted $C_6$-$C_{24}$ aryl group. In one embodiment, at least one of $R^1$, $R^2$, $R^3$, $R^4$, $R^5$, or $R^6$ in any of General Formulas I-XXXV is a $C_6$-$C_{24}$ aryl group substituted with one or more $C_1$-$C_6$ linear alkyl groups. In one embodiment, at least one of $R^1$, $R^2$, $R^3$, $R^4$, $R^5$, or $R^6$ in any of General Formulas I-XXXV is a $C_6$-$C_{24}$ aryl group substituted with one or more $C_3$-$C_6$ branched alkyl groups.

In one embodiment, at least one of $R^1$, $R^2$, $R^3$, $R^4$, $R^5$, or $R^6$ in any of General Formulas I-XXXV is selected from the group consisting of:

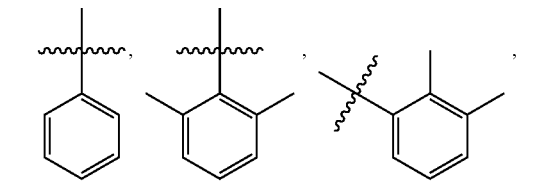

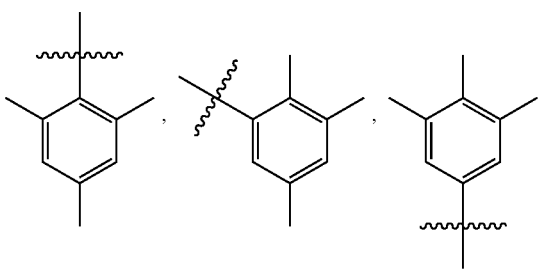

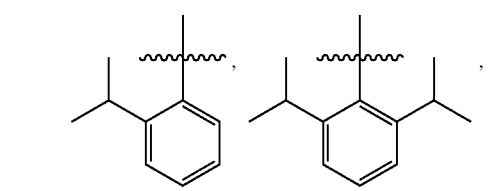

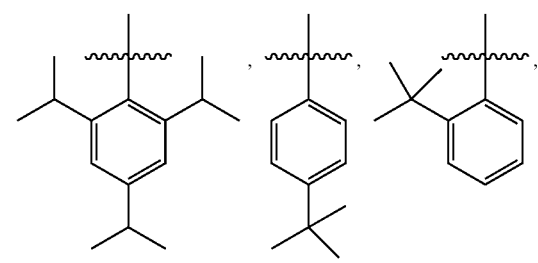

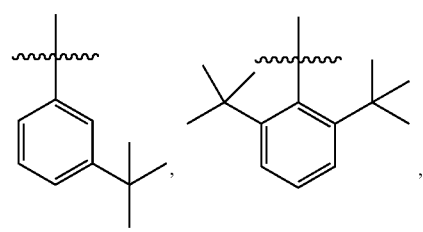

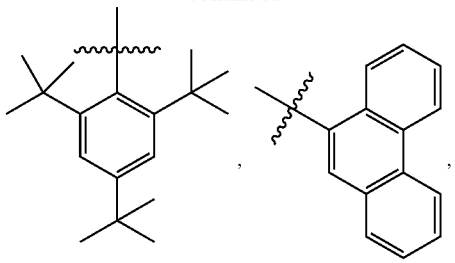

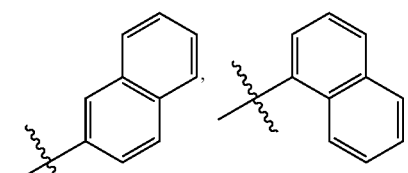

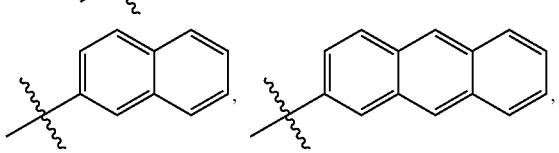

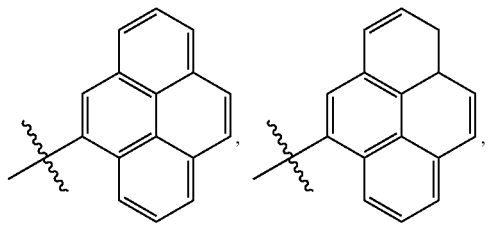

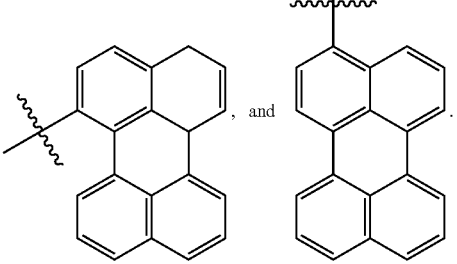

In one embodiment, in at least one of the first complex and the second complex, at least one of $R^1$, $R^2$, $R^3$, $R^4$, $R^5$, or $R^6$ in any of General Formulas I-XXXV is an optionally substituted heteroaryl group. In one embodiment, at least one of $R^1$, $R^2$, $R^3$, $R^4$, $R^5$, or $R^6$ in any of General Formulas I-XXXV is an optionally substituted heteroaryl group comprising at least one heteroatom selected from the group consisting of N, S, and O. In one embodiment, at least one of $R^1$, $R^2$, $R^3$, $R^4$, $R^5$, or $R^6$ in any of General Formulas I-XXXV is an unsubstituted heteroaryl group. In one embodiment, at least one of $R^1$, $R^2$, $R^3$, $R^4$, $R^5$, or $R^6$ in any of General Formulas I-XXXV is a heteroaryl group substituted with one or more $C_1$-$C_6$ linear alkyl groups. In one embodiment, at least one of $R^1$, $R^2$, $R^3$, $R^4$, $R^5$, or $R^6$ in any of General Formulas I-XXXV is a heteroaryl group substituted with one or more $C_3$-$C_6$ branched alkyl groups.

In one embodiment, at least one of $R^1$, $R^2$, $R^3$, $R^4$, $R^5$, or $R^6$ in any of General Formulas I-XXXV is selected from the group consisting of:

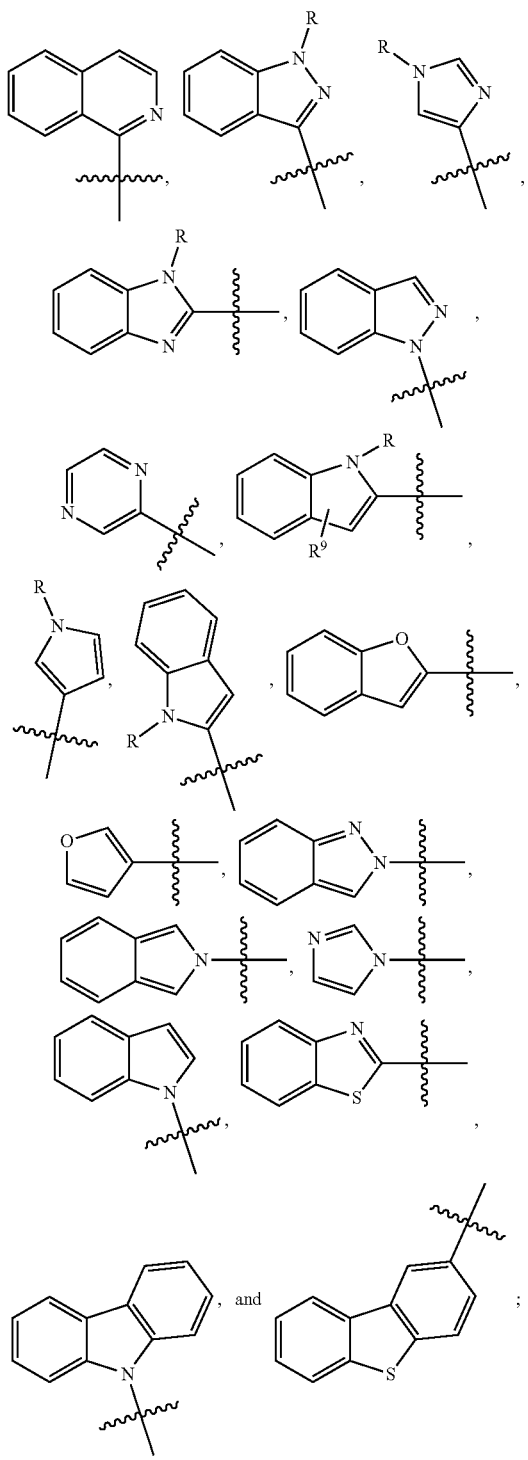

wherein R and $R^9$ each independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

In one embodiment, $L^3$ in General Formula I or II is a benzene ring. In one embodiment, $L^4$ in General Formula I or II is a benzene ring. In one embodiment, $L^1$ in General Formula I or II is a pyridine ring. In one embodiment, $L^1$ in General Formula I or II is an imidazole ring. In one embodiment, $L^1$ in General Formula I or II is an imidazoline ring. In one embodiment, $L^1$ in General Formula I or II is a benzimidazole ring. In one embodiment, $L^6$ in General Formula I or II is a pyridine ring. In one embodiment, X in General Formula I or II is O. In one embodiment, $L^2$ and $L^5$ in General Formula I or II is absent. In one embodiment, $L^2$ and $L^5$ in General Formula I or II are present. In one embodiment, $L^2$ in General Formula I or II is present and $L^5$ in General Formula I or II is absent. In one embodiment, $L^2$ in General Formula I or II is a benzene ring. In one embodiment, each of $V^1$, $V^2$, $V^3$, and $V^4$ in General Formula I or II is absent. In one embodiment, $X^1$ in General Formula II is absent.

In one embodiment, X in any of General Formulas I-XXXV comprises O.

In one embodiment, the compound is a compound of General Formula VIII wherein $Y^{1a}$, $Y^{1b}$, $Y^{1c}$, $Y^{1d}$, $Y^{2a}$, $Y^{2b}$, $Y^{2c}$, and $Y^{2d}$ are absent; $Y^{1e}$, $Y^{1f}$, $Y^{1g}$, $Y^{1h}$, $Y^{1i}$, $Y^{2e}$, $Y^{2f}$, $Y^{2g}$, $Y^{2h}$, and $Y^{2i}$ are each C; X is O; and $R^1$, $R^2$, $R^3$, $R^4$, $R^5$, and $R^6$ are each hydrogen, valency permitting.

In one embodiment, the compound is a compound of General Formula XVII wherein $Y^{1a}$, $Y^{1b}$, $Y^{1c}$, $Y^{1d}$, $Y^{2a}$, $Y^{2b}$, $Y^{2c}$, and $Y^{2d}$ are absent; $Y^{1e}$, $Y^{1f}$, $Y^{1g}$, $Y^{1h}$, $Y^{1i}$, $Y^{2e}$, $Y^{2f}$, $Y^{2g}$, $Y^{2h}$, and $Y^{2i}$ are each C; X is O; and $R^1$, $R^2$, $R^3$, $R^4$, $R^5$, and $R^6$ are each hydrogen, valency permitting.

In one embodiment, the compound is a compound of General Formula XVIII wherein $Y^{1a}$, $Y^{1b}$, $Y^{1c}$, and $Y^{1d}$ are absent; $Y^{1e}$, $Y^{1f}$, $Y^{1g}$, $Y^{1h}$, $Y^{1i}$, $Y^{2a}$, $Y^{2b}$, $Y^{2c}$, $Y^{2d}$, $Y^{2e}$, $Y^{2f}$, $Y^{2g}$, $Y^{2h}$, and $Y^{2j}$ are C; $A^1$, $B^1$, and $D^1$ are C; $C^1$ is N; X is O; and $R^1$, $R^2$, $R^3$, $R^4$, $R^5$, and $R^6$ are each hydrogen, valency permitting.

In one embodiment, at least one of the first complex and the second complex is selected from the group consisting of:

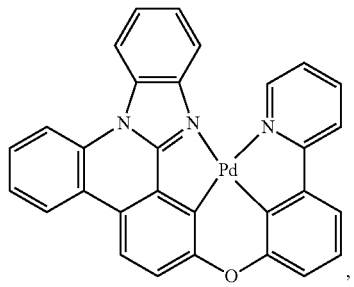

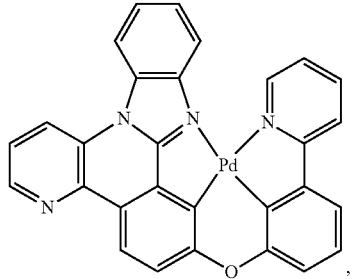

-continued

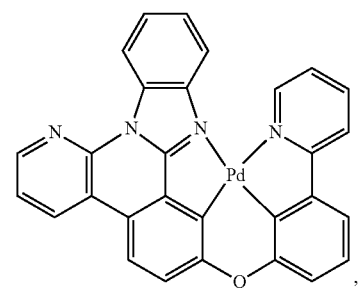

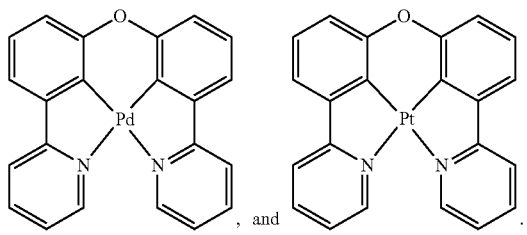

In one embodiment, each of the first complex and the second complex is independently selected from the group consisting of:

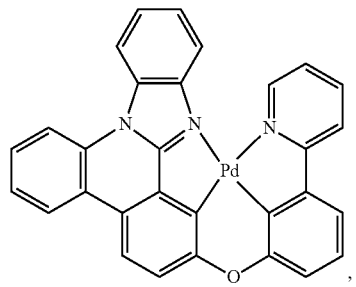

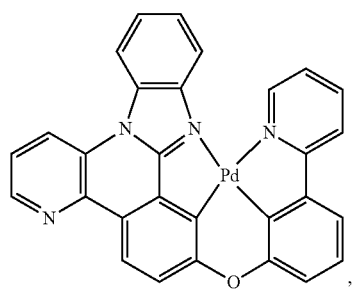

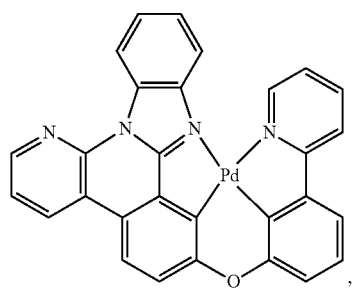

-continued

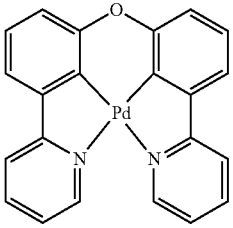
, and
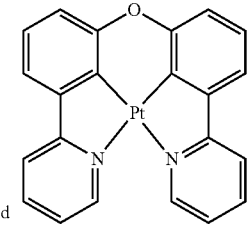
.

In one embodiment, the ratio of the first complex to the second complex in the composition can be any ratio as would be understood by a person of ordinary skill in the art. In one embodiment, the ratio of the first complex to the second complex is any ratio between about 99:1 and about 1:99. In one embodiment, the ratio of the first complex to the second complex is about 1:1. In one embodiment, the ratio of the first complex to the second complex is about 10:90. In one embodiment, the ratio of the first complex to the second complex is about 90:10. In one embodiment, the ratio of the first complex to the second complex is about 4:96. In one embodiment, the ratio of the first complex to the second complex is about 96:4.

In one embodiment, at least one of the first complex and the second complex is an emitter. In one embodiment, at least one of the first complex and the second complex is an excimer emitter. In one embodiment, at least one of the first complex and the second complex is a red excimer emitter. In one embodiment, at least one of the first complex and the second complex is a green excimer emitter. In one embodiment, the composition emits in both the red and green regions of the electromagnetic spectrum.

Devices of the Invention

Also disclosed herein are devices comprising the composition disclosed herein.

In one aspect, the device is an electro-optical device. Electro-optical devices include, but are not limited to, photo-absorbing devices such as solar- and photo-sensitive devices, organic light emitting diodes (OLEDs), photo-emitting devices, or devices capable of both photo-absorption and emission and as markers for bio-applications. For example, the device can be an OLED.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

In one aspect, the present disclosure relates to an organic light emitting device (OLED), the OLED comprising an anode;
a cathode; and
an organic region, disposed between the anode and the cathode, comprising a first complex and a second complex;
wherein when a voltage is applied across the anode and cathode at room temperature, the OLED emits a luminescent radiation that comprises one or more luminescent radiation components resulting from the formation of at least one exciplex;
wherein the exciplex is formed by at least one of the following aggregate types:
1) at least one aggregate within the first complex, and at least one aggregate within the second complex;
2) at least one aggregate between the first and the second complex; and
3) both 1 and 2.

In one embodiment, the first complex is a green emitter and the second complex is a red emitter. In one embodiment, the luminescent radiation component comprises red light, green light, or a mixture of red light and green light. In one embodiment, the organic region comprises a mixed layer comprising the first complex and the second complex. In one embodiment, the organic region comprises at least one sublayer comprising the first complex and at least one sublayer comprising the second complex.

In one embodiment, the first complex and the second complex each has a structure of any of General Formulas I-XXXV. In one embodiment, the OLED device comprises an excimer emitter of any of General Formulas I-XXXV. In one embodiment, the OLED device comprises multiple excimer emitters of any of General Formulas I-XXXV. In one embodiment, the OLED device comprises one or more red excimer emitters of any of General Formulas I-XXXV. In one embodiment, the OLED device comprises one or more green excimer emitters of any of General Formulas I-XXXV. In one embodiment, the OLED device comprises one or more excimer emitters of any of General Formulas I-XXXV that emit in both the red and green regions of the electromagnetic spectrum.

In one aspect, the present invention includes an organic layer that includes a first complex and a second complex. In one embodiment, one of the first complex and second complex is a red emitter and the other of the first complex and the second complex is a green emitter. In one embodiment, the organic layer includes one red emitter and one green emitter. In one embodiment, the red emitter is a compound of any one of General Formulas I-XXXV. In one embodiment, the green emitter is a compound of any one of General Formulas I-XXXV.

The ratio of the red emitter to the green emitter can be any ratio, as would be understood by a person of ordinary skill in the art. In one embodiment, the ratio of the red emitter to the green emitter is any ratio between about 99:1 and about 1:99. In one embodiment, the ratio of the red emitter to the green emitter is about 1:1. In one embodiment, the ratio of the red emitter to the green emitter is about 4:96. In one embodiment, the ratio of the red emitter to the green emitter is about 96:4. In one embodiment, the organic layer includes a 1:1 ratio of $Pt_3O_3$ to $Pd_3O_3$. In one embodiment, the organic layer includes a 4:96 ratio of $Pt_3O_3$ to $Pd_3O_3$. In one embodiment, the ratio of one or more red emitters to one or more green emitters can be tuned to adjust and improve performance of the device.

One application for phosphorescent emissive molecules is a full color display. FIG. 1 shows a common structure of the device which forms the full color of the display. Industry standards for such a display call for pixels adapted to emit particular colors, referred to as "saturated" colors. In particular, these standards call for saturated red, green, and blue pixels. Color may be measured using CIE coordinates, which are well known to the art. Such devices are disclosed herein which comprise one or more of the compounds or compositions disclosed herein. In one embodiment, the display comprises a red pixel comprising a compound of any of General Formulas I-XXXV. In one embodiment, the display comprises a green pixel comprising a compound of any of General Formulas I-XXXV. In one embodiment, the display comprises a red pixel comprising a compound of any of General Formulas I-XXXV and a green pixel comprising a compound of any of General Formulas I-XXXV. In one embodiment, the display comprises pixel that emits in both the red and green regions of the electromagnetic spectrum, the pixel comprising a compound of any of General Formulas I-XXXV.

OLEDs can be produced by methods known to those skilled in the art. In general, the OLED is produced by successive vapor deposition of the individual layers onto a suitable substrate. Suitable substrates include, for example, glass, inorganic materials such as ITO or IZO or polymer films. For the vapor deposition, customary techniques may be used, such as thermal evaporation, chemical vapor deposition (CVD), physical vapor deposition (PVD), and others.

In an alternative process, the organic layers may be coated from solutions or dispersions in suitable solvents, in which case coating techniques known to those skilled in the art are employed. Suitable coating techniques are, for example, spin-coating, the casting method, the Langmuir-Blodgett ("LB") method, the inkjet printing method, dip-coating, letterpress printing, screen printing, doctor blade printing, slit-coating, roller printing, reverse roller printing, offset lithography printing, flexographic printing, web printing, spray coating, coating by a brush or pad printing, and the like. Among the processes mentioned, in addition to the aforementioned vapor deposition, preference is given to spin-coating, the inkjet printing method and the casting method since they are particularly simple and inexpensive to perform. In the case that layers of the OLED are obtained by the spin-coating method, the casting method or the inkjet printing method, the coating can be obtained using a solution prepared by dissolving the composition in a concentration of 0.0001 to 90% by weight in a suitable organic solvent such as benzene, toluene, xylene, tetrahydrofuran, methyltetrahydrofuran, N,N-dimethylformamide, acetone, acetonitrile, anisole, dichloromethane, dimethyl sulfoxide, water, and mixtures thereof.

Figure 2:
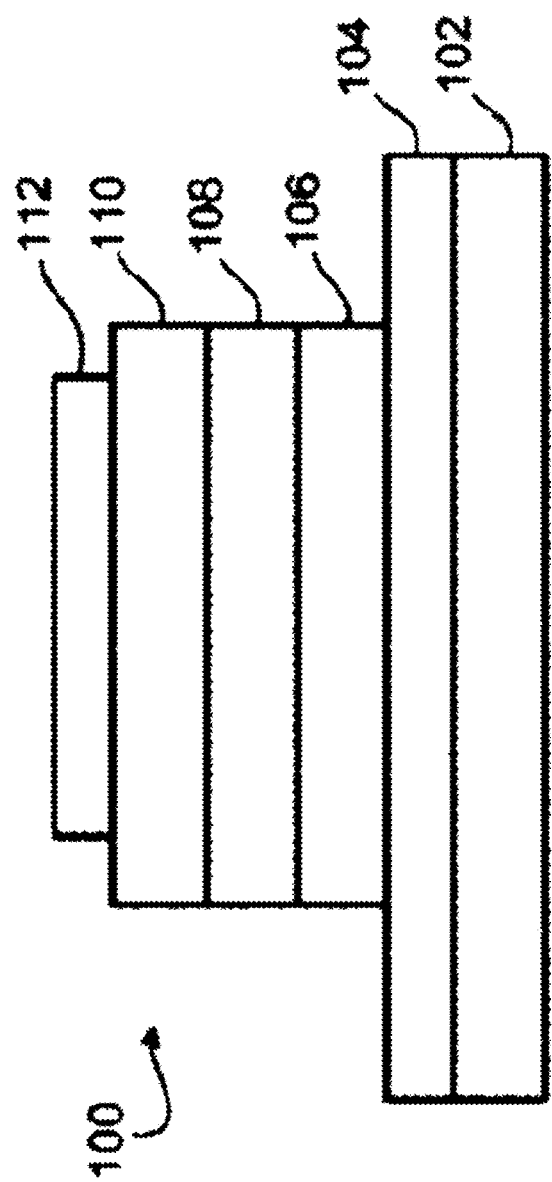
FIG. 2 depicts an OLED.

Compositions described herein can be used in a light emitting device such as an OLED. FIG. 2 depicts a cross-sectional view of an OLED 100. OLED 100 includes substrate 102, anode 104, hole-transporting material(s) (HTL) 106, light processing material 108, electron-transporting material(s) (ETL) 110, and a metal cathode layer 112. Anode 104 is typically a transparent material, such as indium tin oxide. Light processing material 108 may be an emissive material (EML) including an emitter and a host. In one embodiment, Light processing material 108 is an emissive material (EML) including a composition described herein.

In various aspects, any of the one or more layers depicted in FIG. 2 may include indium tin oxide (ITO), poly(3,4-ethylenedioxythiophene) (PEDOT), polystyrene sulfonate (PSS), N,N'-di-1-naphthyl-N,N-diphenyl-1,1'-biphenyl-4,4'diamine (NPD), 1,1-bis((di-4-tolylamino)phenyl)cyclohexane (TAPC), 2,6-Bis(N-carbazolyl)pyridine (mCpy), 2,8-bis(diphenylphosphoryl)dibenzothiophene (PO15), LiF, Al, or a combination thereof.

Light processing material 108 may include one or more compounds of the present disclosure optionally together with a host material. In one embodiment, the light processing material comprises one or more compounds of the present disclosure as an emissive material. The host material can be any suitable host material known in the art. In one embodiment, the emission color of an OLED is determined by the emission energy (optical energy gap) of the light processing material 108, which can be tuned by tuning the electronic structure of the emitting compounds, the host material, or both. Both the hole-transporting material in the HTL layer 106 and the electron-transporting material(s) in the ETL layer 110 may include any suitable hole-transporter known in the art.

Compounds described herein may exhibit phosphorescence. Phosphorescent OLEDs (i.e., OLEDs with phosphorescent emitters) typically have higher device efficiencies than other OLEDs, such as fluorescent OLEDs. Light emitting devices based on electrophosphorescent emitters are described in more detail in WO2000/070655 to Baldo et al., which is incorporated herein by this reference for its teaching of OLEDs, and in particular phosphorescent OLEDs.

As contemplated herein, an OLED of the present invention may include an anode, a cathode, and an organic layer/region disposed between the anode and the cathode. The organic layer may include a host and a phosphorescent dopant. The organic layer can include a compound of the invention and its variations as described herein.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises an RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiment, the OLED is a large size display having at least a 15 inch diagonal. In some embodiments, the OLED is a lighting panel.

In one embodiment, the consumer product is selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, and a sign.

In some embodiments of the emissive region, the emissive region further comprises a host, wherein the host comprises at least one selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of CnH2n+1, OCnH2n+1, OAr1, N(CnH2n+1)2, N(Ar1)(Ar2), CH=CH—CnH2n+1, C≡C—CnH2n+1, Ar1, Ar1-Ar2, and CnH2n-Ar1, or the host has no substitutions. In the preceding substituents n can range from 1 to 10; and Ar1 and Ar2 can be independently selected from the group consisting of benzene, biphenyl, naphthalene, triphenylene, carbazole, and heteroaromatic analogs thereof. The host can be an inorganic compound. For example, a Zn containing inorganic material e.g. ZnS.

Suitable hosts may include, but are not limited to, mCP (1,3-bis(carbazol-9-yl)benzene), mCPy (2,6-bis(N-carbazolyl)pyridine), TCP (1,3,5-tris(carbazol-9-yl)benzene), TCTA (4,4',4"-tris(carbazol-9-yl)triphenylamine), TPBi (1,3,5-tris(1-phenyl-1-H-benzimidazol-2-yl)benzene), mCBP (3,3-di(9H-carbazol-9-yl)biphenyl), pCBP (4,4'-bis (carbazol-9-yl)biphenyl), CDBP (4,4'-bis(9-carbazolyl)-2,2'-dimethylbiphenyl), DMFL-CBP (4,4'-bis(carbazol-9-yl)-9,9-dimethylfluorene), FL-4CBP (4,4'-bis(carbazol-9-yl)-9,9-bis(9-phenyl-9H-carbazole)fluorene), FL-2CBP (9,9-bis (4-carbazol-9-yl)phenyl)fluorene, also abbreviated as CPF), DPFL-CBP (4,4'-bis(carbazol-9-yl)-9,9-ditolylfluorene), FL-2CBP (9,9-bis(9-phenyl-9H-carbazole)fluorene), Spiro-CBP (2,2',7,7'-tetrakis(carbazol-9-yl)-9,9'-spirobifluorene), ADN (9,10-di(naphth-2-yl)anthracene), TBADN (3-tert-butyl-9,10-di(naphth-2-yl)anthracene), DPVBi (4,4'-bis(2,2-diphenylethen-1-yl)-4,4'-dimethylphenyl), p-DMDPVBi (4,4'-bis(2,2-diphenylethen-1-yl)-4,4'-dimethylphenyl), TDAF (tert(9,9-diarylfluorene)), BSBF (2-(9,9'-spirobifluoren-2-yl)-9,9'-spirobifluorene), TSBF (2,7-bis(9,9'-spirobifluoren-2-yl)-9,9'-spirobifluorene), BDAF (bis(9,9-diarylfluorene)), p-TDPVBi (4,4'-bis(2,2-diphenylethen-1-yl)-4,4'-di-(tert-butyl)phenyl), TPB3 (1,3,5-tri(pyren-1-yl)benzene, PBD (2-(4-biphenylyl)-5-(4-tert-butylphenyl)-1,3,4-oxadiazole), BCP (2,9-dimethyl-4,7-diphenyl-1,10-phenanthroline), BP-OXD-Bpy (6,6'-bis[5-(biphenyl-4-yl)-1,3,4-oxadiazo-2-yl]-2,2'-bipyridyl), NTAZ (4-(naphth-1-yl)-3,5-diphenyl-4H-1,2,4-triazole), Bpy-OXD (1,3-bis[2-(2,2'-bipyrid-6-yl)-1,3,4oxadiazo-5-yl]benzene), BPhen (4,7-diphenyl-1,10-phenanthroline), TAZ (3-(4-biphenylyl)-4-phenyl-5-tert-butylphenyl-1,2,4-triazole), PADN (2-phenyl-9,10-di(naphth-2-yl)anthracene), Bpy-FOXD (2,7-bis [2-(2,2'-bipyrid-6-yl)-1,3,4-oxadiazol-5-yl]-9,9-dimethylfluorene), OXD-7 (1,3-bis[2-(4-tert-butylphenyl)-1,3,4-oxadiazol-5-yl]benzene), HNBphen (2-(naphth-2-yl)-4,7-diphenyl-1,10-phenanthroline), NBphen (2,9-bis (naphth-2-yl)-4,7-diphenyl-1,10-phenanthroline), 3TPYMB (tris(2,4,6-trimethyl-3-(pyrid-3-yl)phenyl)borane), 2-NPIP (1-methyl-2-(4-(naphth-2-yl)phenyl)-1H-imidazo[4,5-f]-[1, 10]phenanthroline), Liq (8-hydroxyquinolinolatolithium), and Alq (bis(2-methyl-8-quinolinolate)-4-(phenylphenolato) aluminum), and also of mixtures of the aforesaid substances.

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

The light emitting layer of the organic EL device of the present invention preferably contains the composition described herein. In one embodiment, the light emitting layer comprises a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

In yet another aspect of the present disclosure, a formulation that comprises the novel compound disclosed herein is described. The formulation can include one or more components selected from the group consisting of a solvent, a host, a hole injection material, hole transport material, and an electron transport layer material, disclosed herein.

EXPERIMENTAL EXAMPLES

The invention is further described in detail by reference to the following experimental examples. These examples are provided for purposes of illustration only and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the compounds and devices of the present invention and practice the claimed methods. The following working examples therefore, specifically point out the preferred embodiments of the present invention, and are not to be construed as limiting in any way the remainder of the disclosure.

In one aspect, the present invention relates to highly stable and efficient excimer emitting materials. In the current technology, red and green pixels are co-deposited in thin film or deposited in stack with two monomer emitting materials. In concentrated solution or thin film, a new excited species (excimer, or exciplex if between dissimilar molecules) containing one excited molecule (M*) and a ground state (M) is formed in equilibrium with the separated species. The excimer has a broad structureless phosphorescence at longer wavelengths than that of the isolated molecular excited state.

Example 1: Pd3O8-P Excimer Emitter

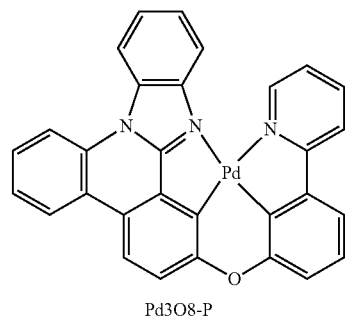

Pd3O8-P

Figure 3:
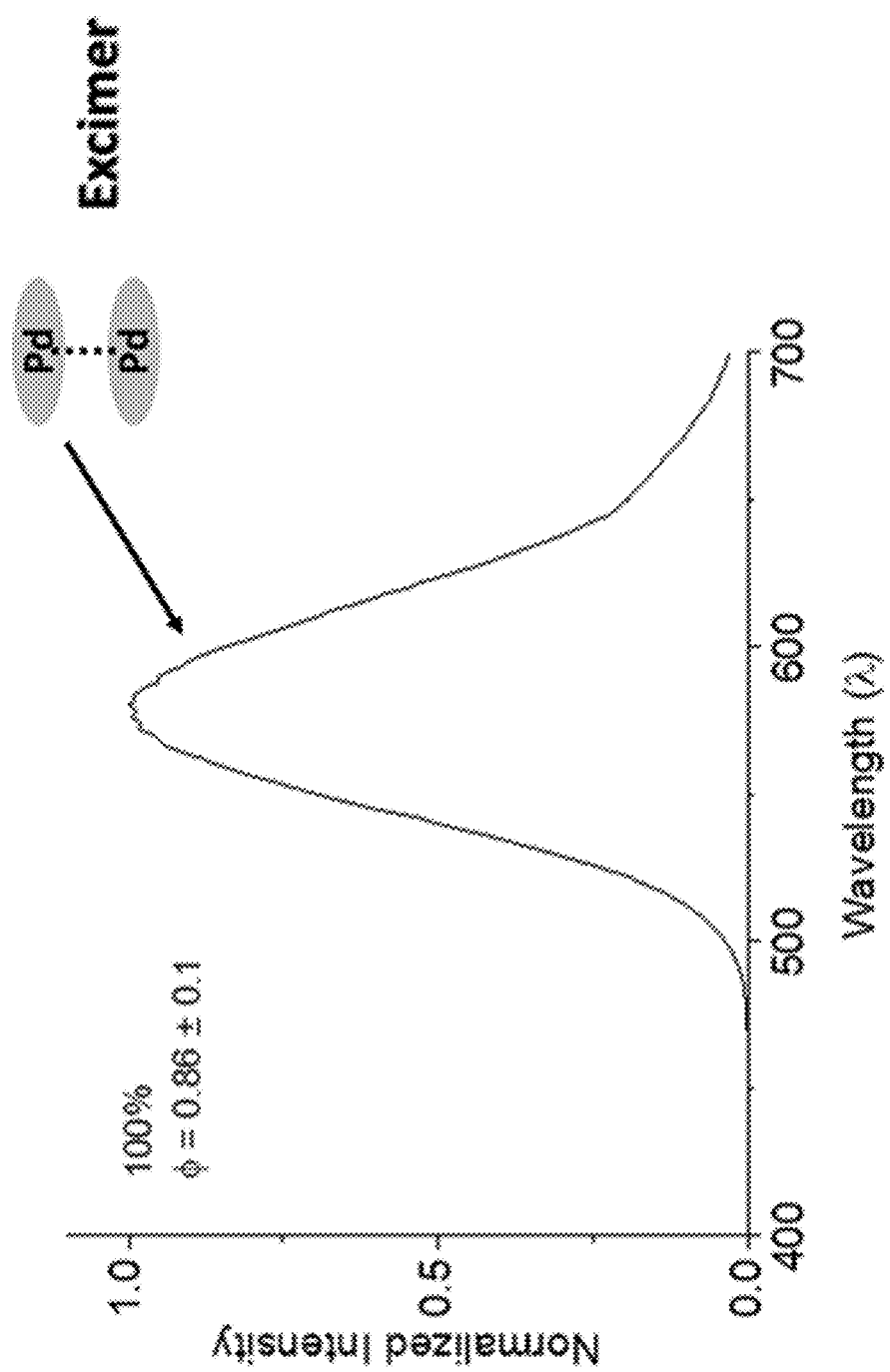
FIG. 3 depicts the photoluminescence (PL) emission of thin film Pd3O8-P.

A very efficient excimer emitter, Pd3O8-P, has been developed (FIG. 3). In the neat thin film, the emitter gives a very good performance with an emission peak at 586 nm, a photoluminescence quantum yield (PLQY) of 86%, and an external quantum efficiency (EQE) of 33%. When the stability of the device was tested, the half lifetime ($LT_{50}$) was found to reach 800000 h at 5 mA/cm². This great performance demonstrates that red excimer emitter Pd3O8-P is useful as a red pixel in the large size display.

Figure 4:
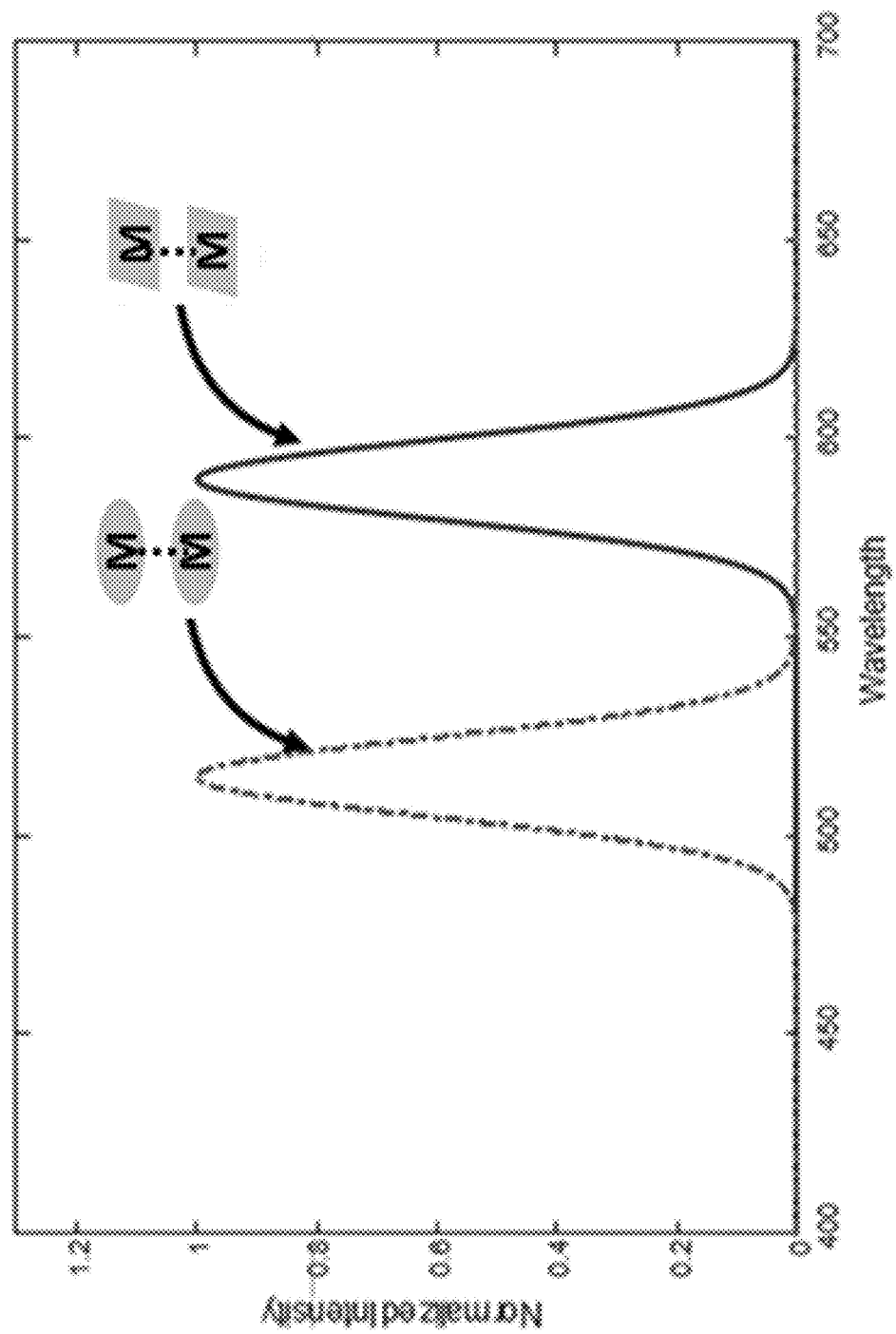
FIG. 4 depicts the PL emission of different kinds of excimer emitters.

Additionally, a new R/G layer was designed for a large size display. The photoluminescence (PL) of an exemplary inventive layer is shown in FIG. 4. Both of the pixels were emitted by excimer material, which is hypothesized to be more efficient and stable than currently existing commercial materials. In the emitting layer, two or more kinds of excimer emitters could be co-deposited to achieve the red and green colors. The ratio of the two or more kinds of emitters can be tuned to adjust and improve performance of the device.

Example 2: Co-Deposited Device Comprising Pd3O3 and Pt3O3

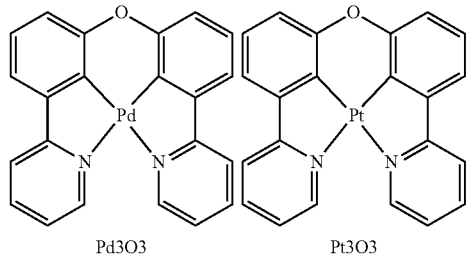

Pd3O3                    Pt3O3

Materials: TrisPCz (9,9',9"-triphenyl-9H,9'H,9"H-3,3': 6'3"-tercarbazole), BPyTP (2,7-di(2,2'-bipyridin-5-yl)triphenylene), HATCN (1,4,5,8,9,11-hexaazatriphenylenehexacarbonitrile), NPD (N,N-diphenyl-N,N-bis(1-naphthyl)-1,1'-biphenyl-4,4"-diamine), BAlq (bis(2-methyl-8-quinolinolato)(biphenyl-4-olato)aluminum), mCBT (9,9'-(2, 8-dibenzothiophenediyl)bis-9H-carbazole), Liq (8-hydroxyquinolinolatolithium), BCN34:

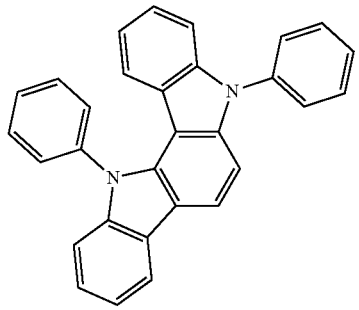

Figure 5:
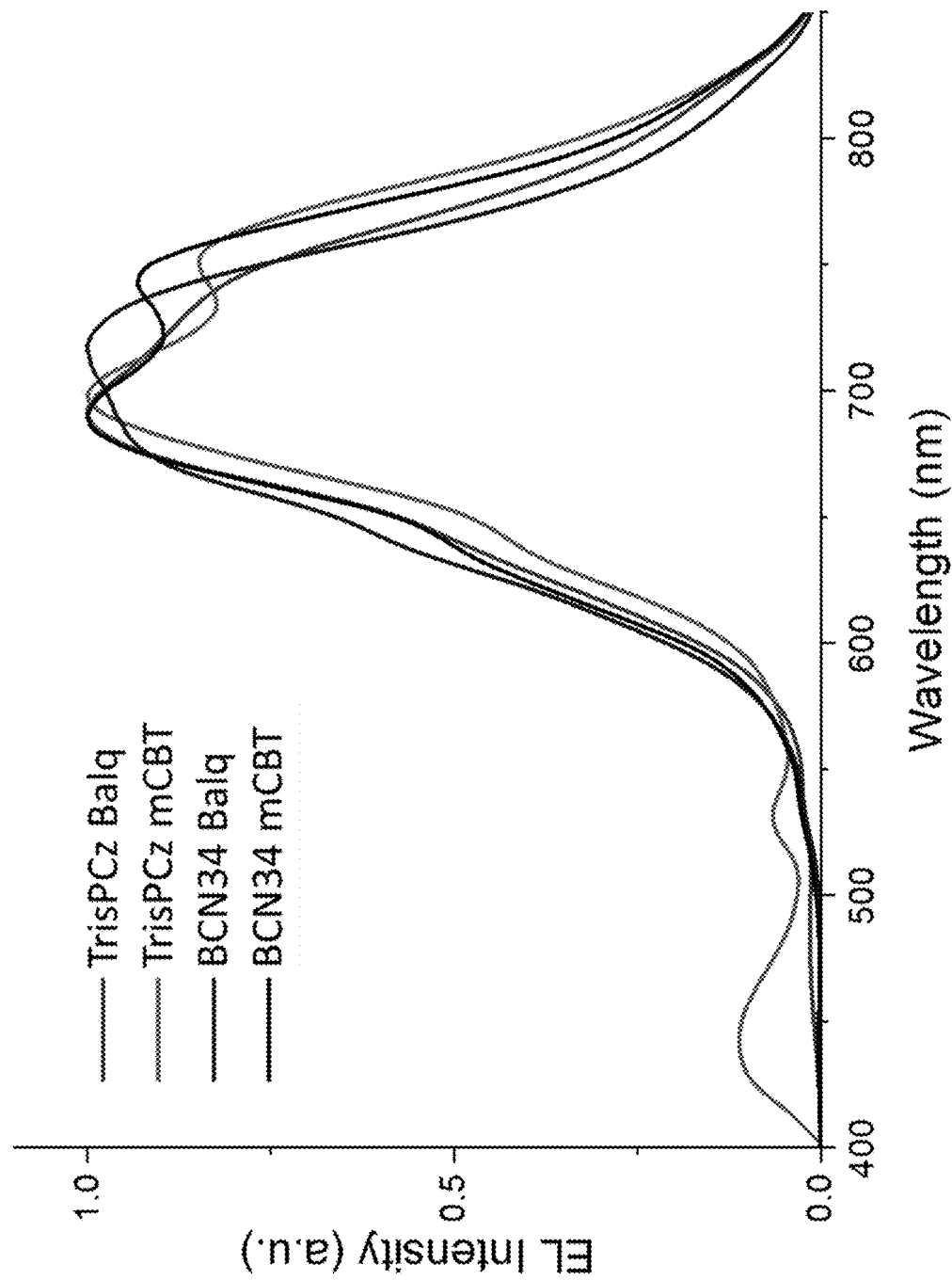
FIG. 5 depicts the electroluminescence spectra of the devices in Example 2.

A device was fabricated comprising the following structure: ITO/HATCN (10 nm)/NPD (40 nm)/EBL/50% Pt3O3: 50% Pd3O3 (15 nm)/HBL/BPyTP (40 nm)/Liq (2 nm)/Al. The EBL and HBL were varied as follows:
Device 1: TrisPCz (10 nm)/EML/BAlq (10 nm)
Device 2: TrisPCz (10 nm)/EML/mCBT (8 nm)
Device 3: BCN34 (10 nm)/EML/BAlq (10 nm).
Device 4: BCN34 (10 nm)/EML/mCBT (8 nm).
The electroluminescent spectra of the devices are shown in FIG. 5.

Example 3: Co-Deposited Device Comprising Pd3O3 and Pt3O3

A device was fabricated comprising the following structure: ITO/HATCN (10 nm)/NPD (40 nm)/EBL/4% Pt3O3: 96% Pd3O3 (15 nm)/HBL/BPyTP (40 nm)/Liq (2 nm)/Al. The EBL and HBL were varied as follows:
Device 1: TrisPCz (10 nm)/EML/BAlq (10 nm)
Device 2: TrisPCz (10 nm)/EML/mCBT (8 nm)

Device 3: BCN34 (10 nm)/EML/BAlq (10 nm)
Device 4: BCN34 (10 nm)/EML/mCBT (8 nm).

Figure 6:
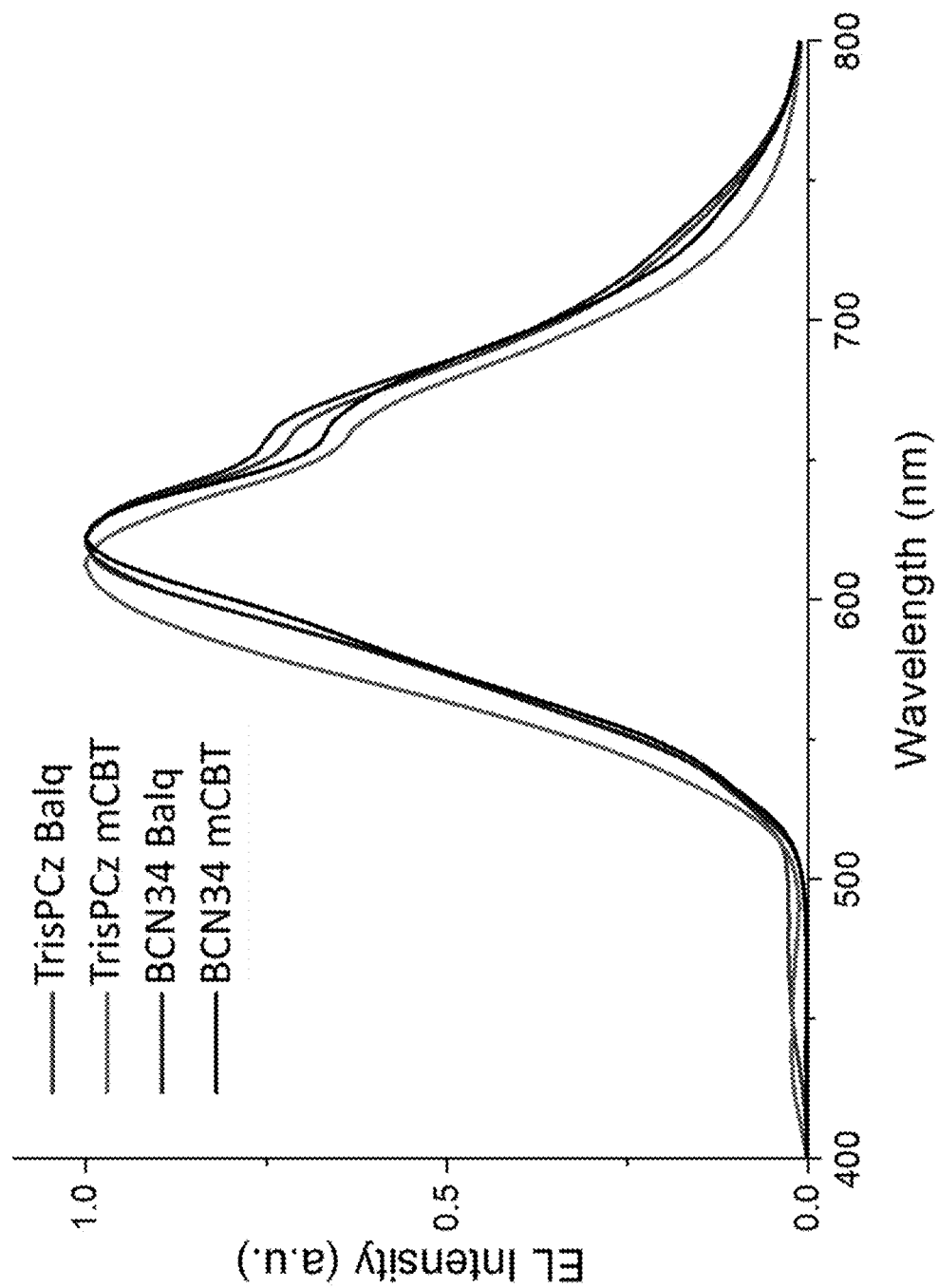
FIG. 6 depicts the electroluminescence spectra of the devices in Example 3.

The electroluminescent spectra of the devices are shown in FIG. 6.

Example 4: Co-Deposited Device Comprising Pt3O3 and Pd3O8-Py5

Figure 7:
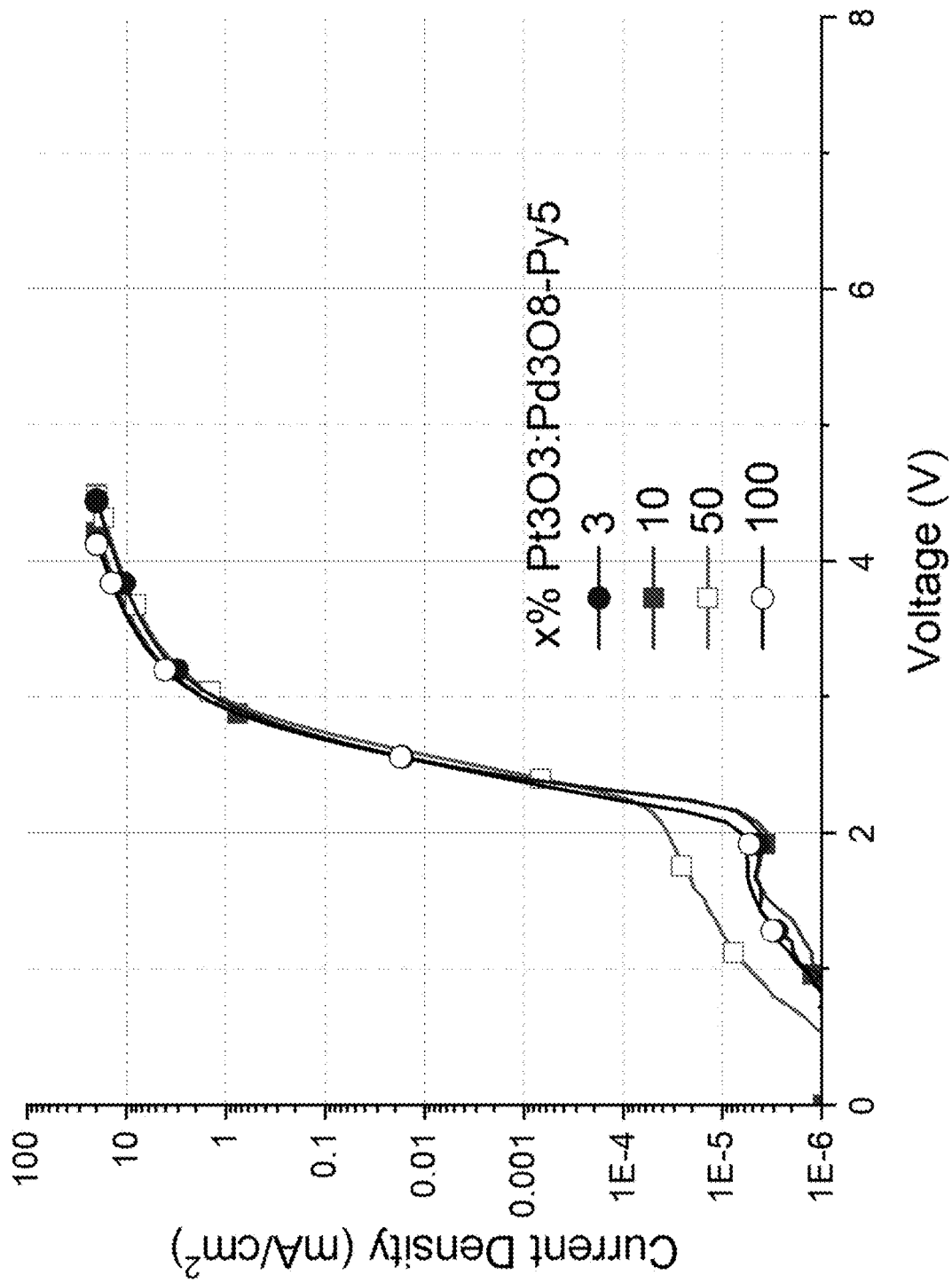
FIG. 7 is a plot of current density-voltage characteristics for these devices in Example 4.
Figure 8:
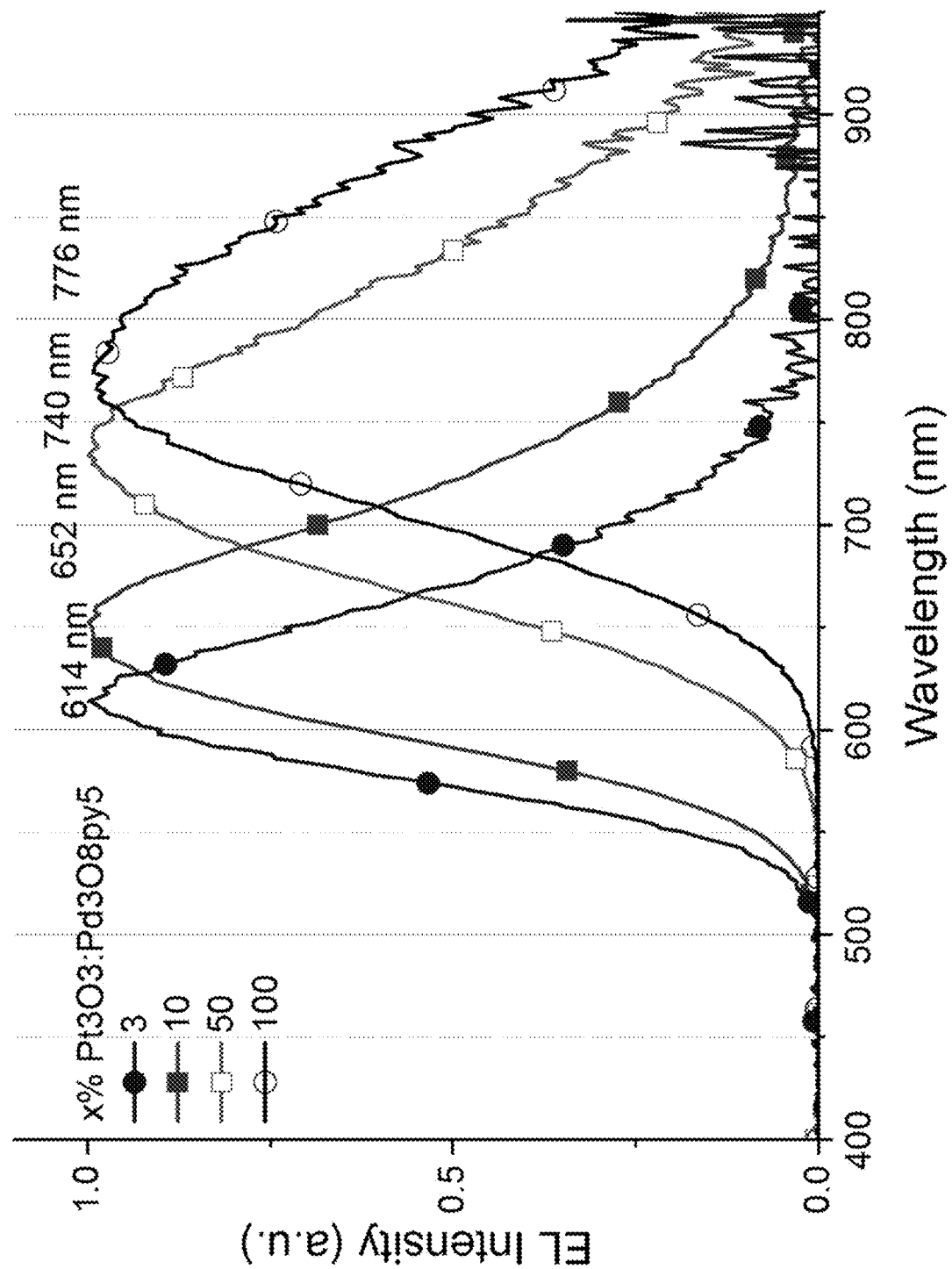
FIG. 8 is a plot of electroluminescence (EL) spectra of the devices in Example 4.
Figure 9:
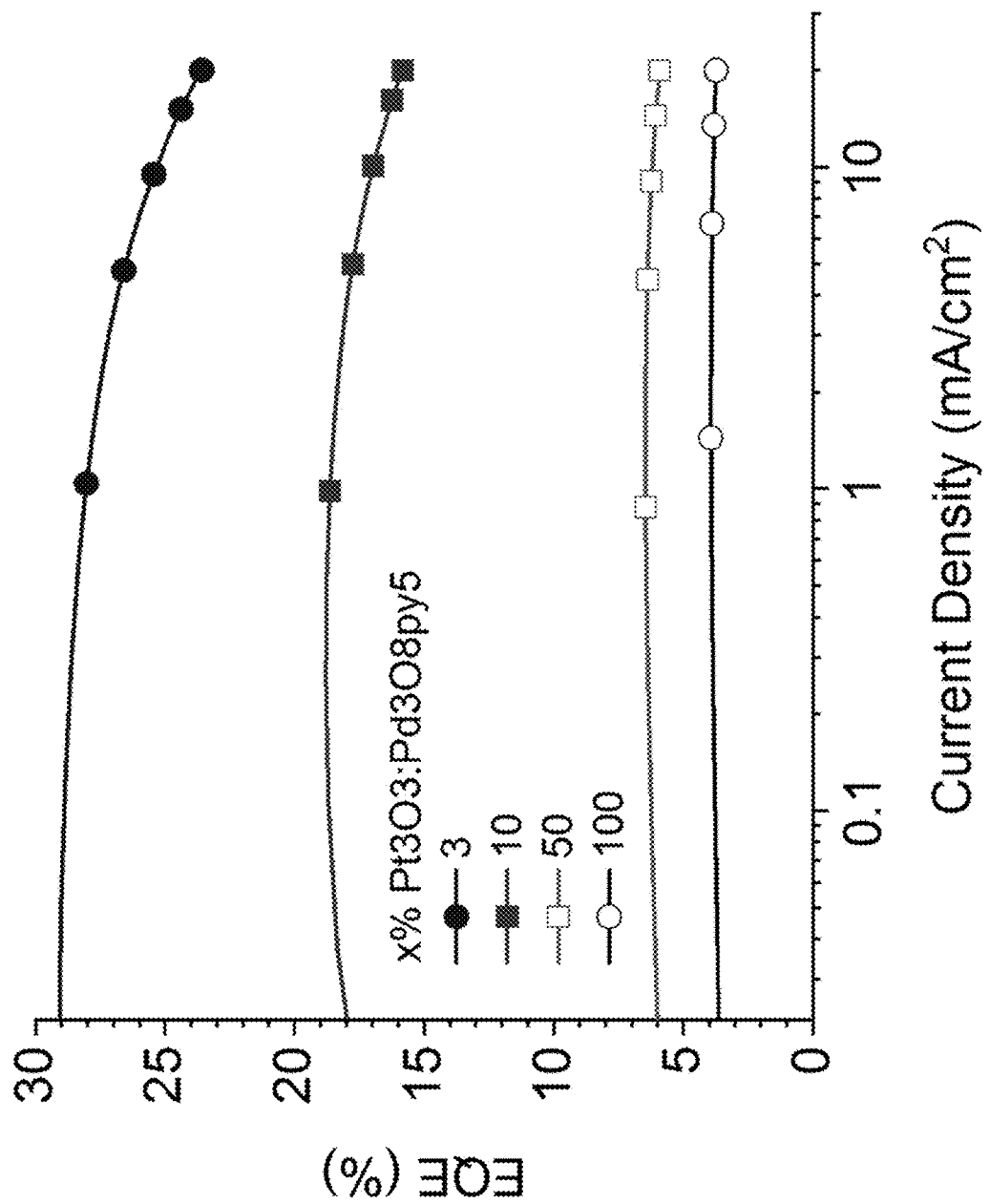
FIG. 9 is a plot of EQE vs current density for these devices in Example 4.
Figure 10:
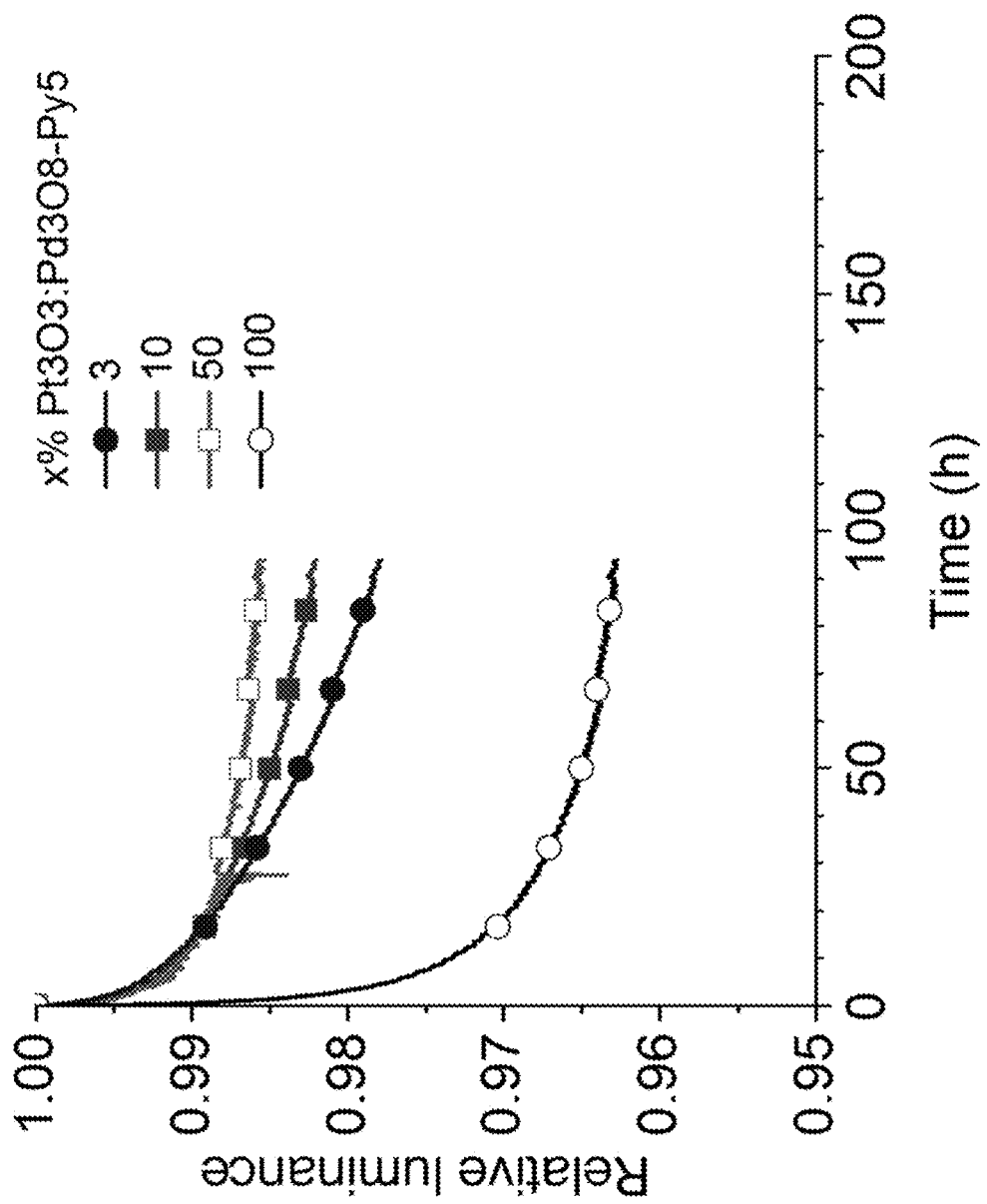
FIG. 10 is a plot of relative luminance versus operation time at current densities of 20 mA cm$^{-2}$ for the devices of Example 4.

Devices were fabricated having the following structure: ITO (100 nm))/HATCN (10 nm)/NPD (70 nm)/TrisPCz (10 nm)/x % Pt3O3:Pd3O8-Py5 (10 nm)/BAlq (10 nm)/BPyTP (50 nm)/Liq (2 nm)/Al, where x=3, 10, 50 and 100. A plot of current Current density-voltage characteristics for these devices is shown in FIG. 7. The electroluminescence (EL) spectra of the devices is shown in FIG. 8. Plots of EQE vs current density for these devices are shown in FIG. 9. Plots of relative luminance versus operation time at current densities of 20 mA cm$^{-2}$ for these devices is shown in FIG. 10. The structures of the compounds are presented below.

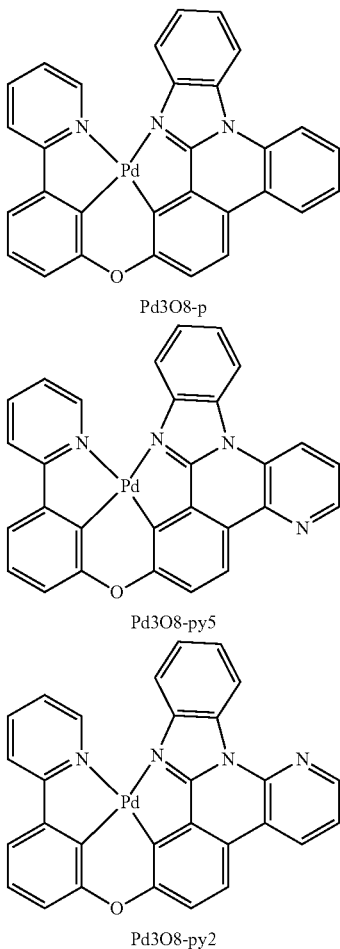

Pd3O8-p

Pd3O8-py5

Pd3O8-py2

As shown in Example 3 and Example 4, the mix of two phosphorescent excimers could either produce two emission peaks originated from their pure excimer emissions (in Example 3) or shift the emission peaks based on the formation of new phosphorescent excimers (Example 4). The observed phenomena can be applied to all of the excimers based on the general formulae disclosed herein.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

We claim:

1. A composition comprising a first complex and a second complex, wherein the first complex and the second complex each have a structure independently selected from General Formula I and General Formula II;

General Formula I

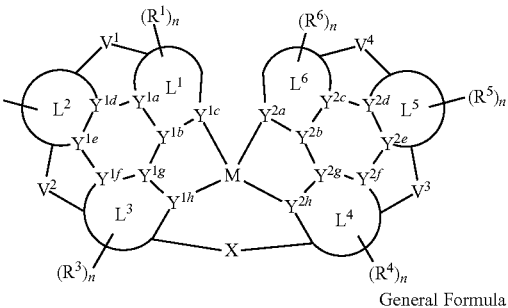

General Formula II

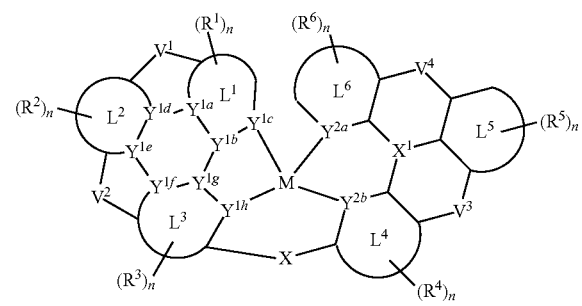

wherein:

M represents Pt(II), Pd(II), Ir(I), Rh(I), Au(III);

$Y^{1a}$, $Y^{1b}$, $y^{1e}$, $Y^{1f}$, $y^{1g}$, $Y^{1h}$, $Y^{2a}$, $Y^{2b}$, $Y^{2c}$, $Y^{2f}$, $Y^{2g}$, $Y^{2h}$ each independently represents C or N;

$Y^{1d}$, $Y^{1e}$, $Y^{2d}$, $Y^{2e}$ each is independently absent or present, and if present, $Y^{1d}$, $Y^{1e}$, $Y^{2d}$, $Y^{2e}$ each independently represents C or N;

X and $X^1$ each is independently present or absent, and each of X and $X^1$, if present, independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7R^8$, $R^7Bi$=O, or $BiR^7$;

$R^1$, $R^2$, $R^3$, $R^4$, $R^5$, $R^6$, $R^7$, and $R^8$ each is independently absent or present as a single substituent or multiple substituents, valency permitting, and, if present, each of $R^1$, $R^2$, $R^3$, $R^4$, $R^5$, $R^6$, $R^7$, and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof;

$L^1$, $L^3$, $L^4$, and $L^6$ each independently represents a 5- to 10-membered aryl, heteroaryl, fused aryl, or fused heteroaryl;

$L^2$ and $L^5$ each is independently present or absent and, if present, $L^2$ and $L^5$ each independently represents a 5- to 10-membered aryl, heteroaryl, fused aryl, or fused heteroaryl;

$V^1$, $V^2$, $V^3$, $V^4$ each is independently present, absent, or a covalent bond, and, if present, each of $V^1$, $V^2$, $V^3$, $V^4$ independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7R^8$, $R^7Bi$=O, or $BiR^7$;

each n is independently an integer, valency permitting; and wherein the first complex and the second complex have different structures.

2. The composition of claim 1, wherein, in at least one of the first complex and the second complex, at least one of $R^1$, $R^2$, $R^3$, $R^4$, $R^5$, or $R^6$ in any of General Formula I or General Formula II is a $C_1$-$C_6$ linear alkyl group or a $C_3$-$C_6$ branched alkyl group.

3. The composition of claim 1, wherein, in at least one of the first complex and the second complex, at least one of $R^1$, $R^2$, $R^3$, $R^4$, $R^5$, or $R^6$ in any of General Formula I or General Formula II is selected from the group consisting of: a methyl group, an ethyl group, an iso-propyl group, and a tert-butyl group.

4. The composition of claim 1, wherein, in at least one of the first complex and the second complex, at least one of $R^1$, $R^2$, $R^3$, $R^4$, $R^5$, or $R^6$ in any of General Formula I or General Formula II is an optionally substituted $C_6$-$C_{24}$ aryl group.

5. The composition of claim 1, wherein, in at least one of the first complex and the second complex, at least one of $R^1$, $R^2$, $R^3$, $R^4$, $R^5$, or $R^6$ in any of General Formula I or General Formula II is selected from the group consisting of:

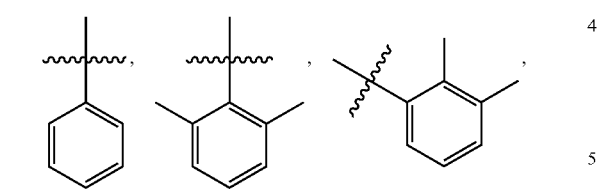

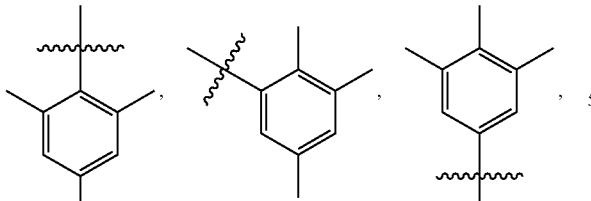

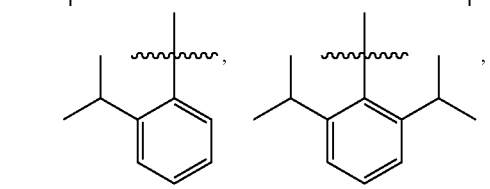

-continued

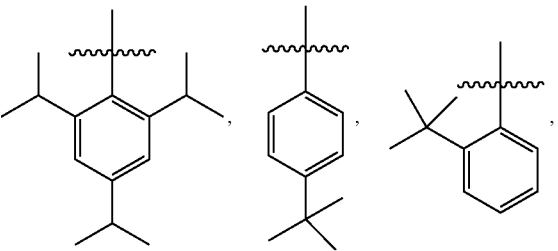

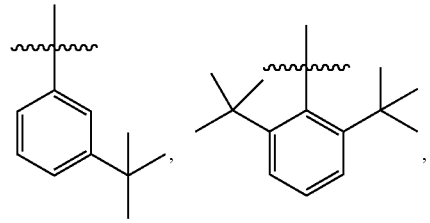

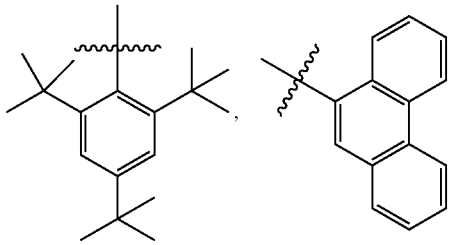

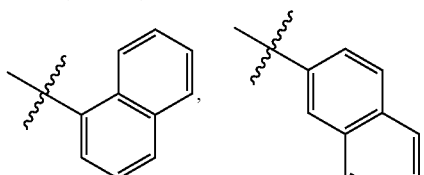

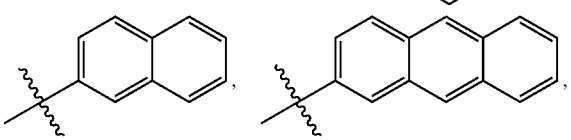

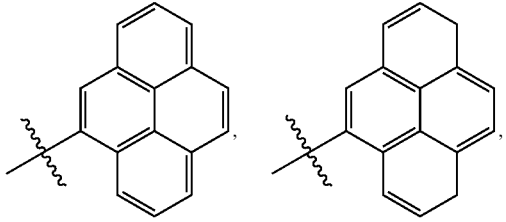

6. The composition of claim 1, wherein, in at least one of the first complex and the second complex, at least one of $R^1$, $R^2$, $R^3$, $R^4$, $R^5$, or $R^6$ in any of General Formula I or General Formula II is selected from the group consisting of:

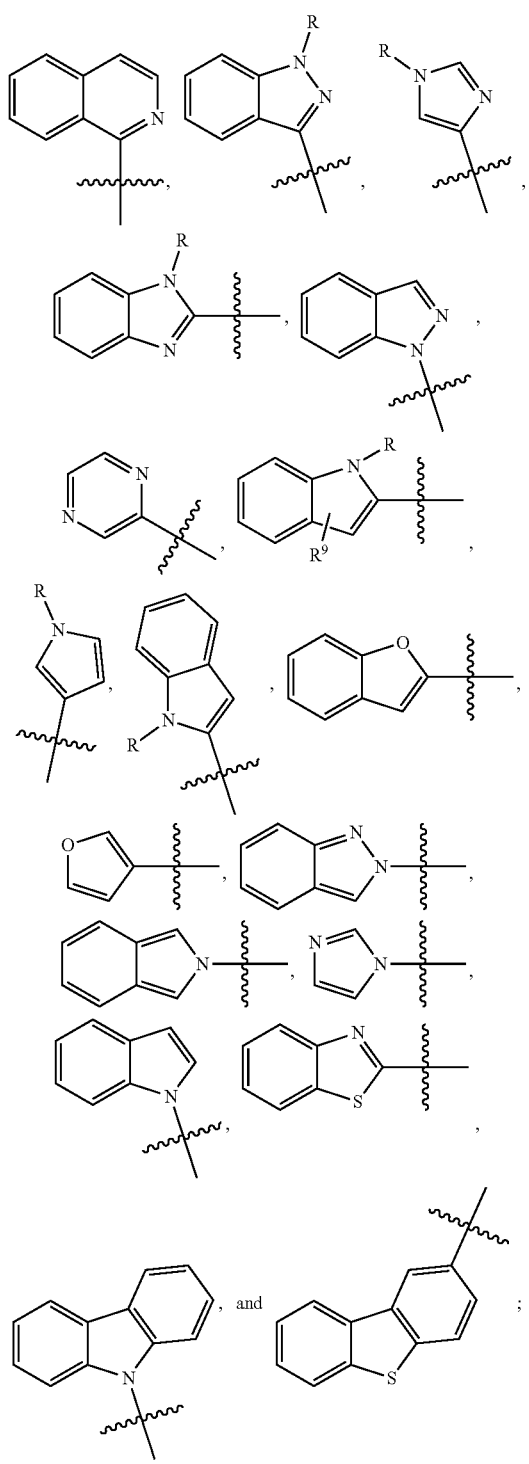

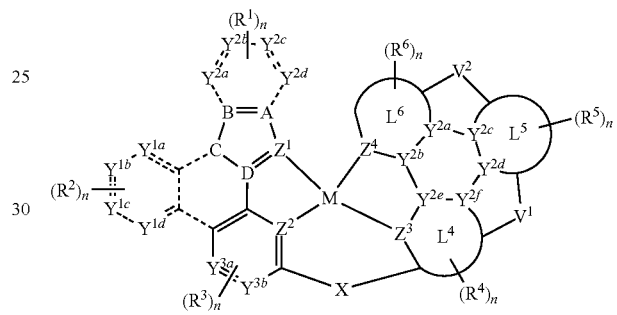

General Formula III

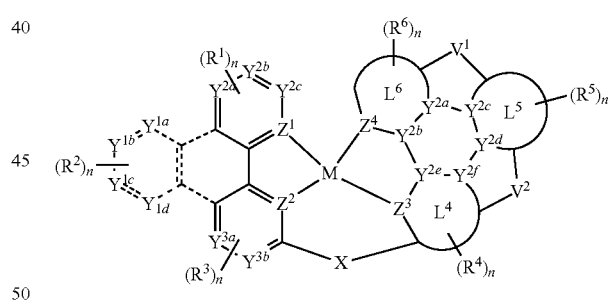

General Formula IV

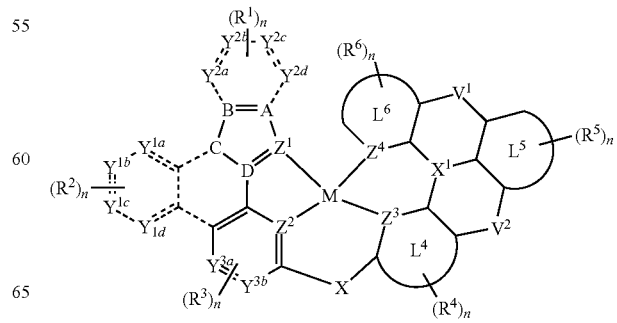

General Formula V wherein R and $R^9$ each independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

7. The composition of claim 1, wherein at least one of $V^3$, $V^4$, or $X^1$ is present in General Formula I or General Formula II.

8. The composition of claim 1, wherein M in one of the first complex and the second complex is Pt(II); and M in the other of the first complex and the second complex is Pd(II).

9. The composition of claim 1, wherein the first complex and the second complex each have a structure of General Formula I.

10. The composition of claim 1, wherein at least one of the first complex and the second complex is a complex of General Formula III, General Formula IV, General Formula V, or General Formula VI;

-continued

General Formula VI

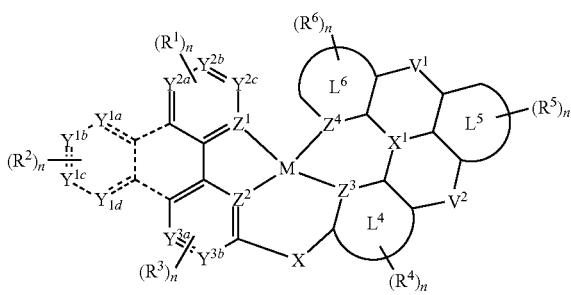

wherein, in General Formulas III-VI:
M represents Pt(II), Pd(II), Ir(I), Rh(I), or Au(III);
each $Y^{1a}$, $Y^{1b}$, $Y^{1e}$, $Y^{1d}$, $Y^{2a}$, $Y^{2b}$, $Y^{2c}$, $Y^{2d}$, $Y^{2e}$, $Y^{2f}$, $Y^{3a}$, $Y^{3b}$, $Z^1$, $Z^2$, $Z^3$, and $Z^4$ independently represents C or N;
X and $X^1$ each is independently present or absent, and, if present, each of X and $X^1$ independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7R^8$, $R^7Bi$=O, or $BiR^7$;
A, B, C, and D each independently represents C, N, O, or S;
$R^1$, $R^2$, $R^3$, $R^4$, $R^5$, $R^6$, $R^7$, and $R^8$ each is independently absent or present as a single substituent or multiple substituents, valency permitting, and, if present, each of $R^1$, $R^2$, $R^3$, $R^4$, $R^5$, $R^6$, $R^7$, and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof;
$L^4$, $L^5$, and $L^6$ each independently represents a 5- to 10-membered aryl, heteroaryl, fused aryl, or fused heteroaryl;
$V^1$ and $V^2$ each is independently present, absent, or a covalent bond, and if present, each of $V^1$ and $V^2$ independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7$, $AlR^7R^8$, $R^7Bi$=O, or $BiR^7$; and
each n is independently an integer, valency permitting.

11. The composition of claim 1, wherein one of the first complex and the second complex has a structure of General Formula III, and the other of the first complex and the second complex has a structure of General Formula IV.

12. The composition of claim 1, wherein at least one of the first complex and the second complex is a complex of General Formula VII, General Formula VIII, General Formula IX, General Formula X, General Formula XI, General Formula XII, General Formula XIII, General Formula XIV, General Formula XV, General Formula XVI, General Formula XVII, General Formula XVIII, General Formula XIX, General Formula XX, General Formula XXI, General Formula XXII, General Formula XXIII, or General Formula XXIV:

General Formula VII

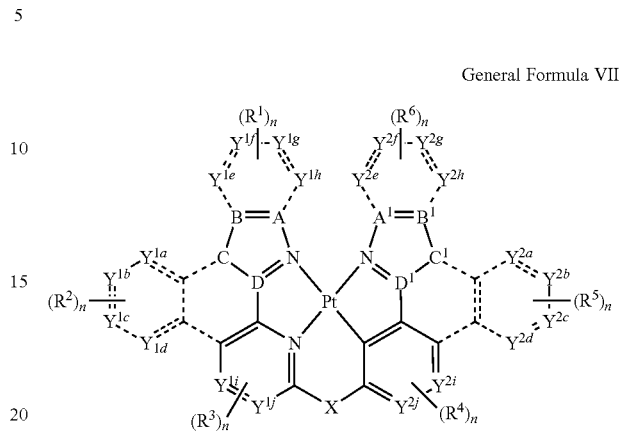

General Formula VIII

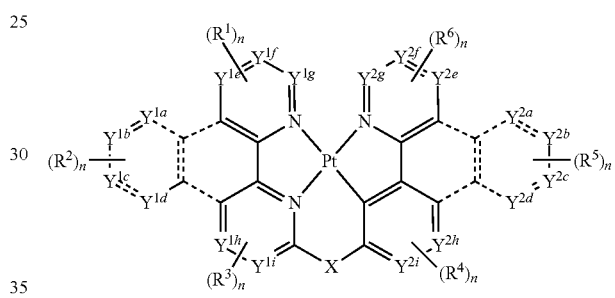

General Formula IX

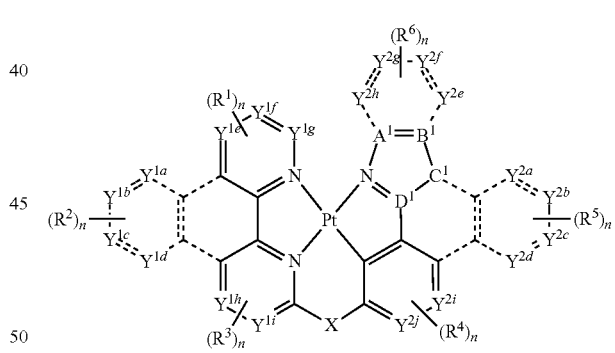

General Formula X

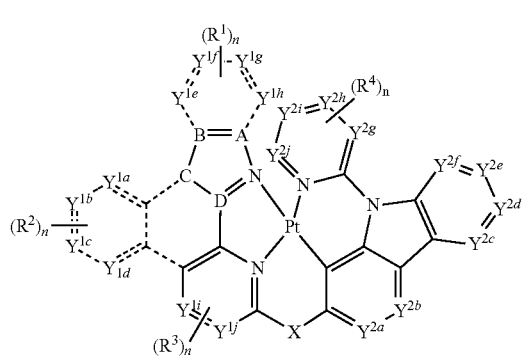

-continued
General Formula XI
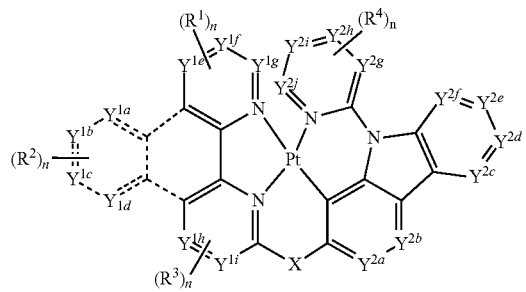
General Formula XII
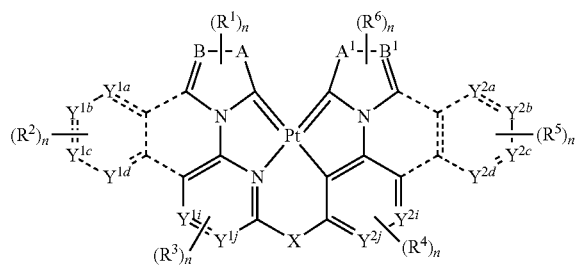
General Formula XIII
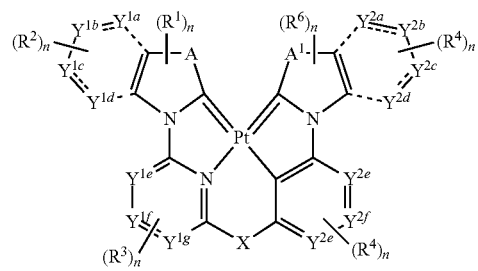
General Formula XIV
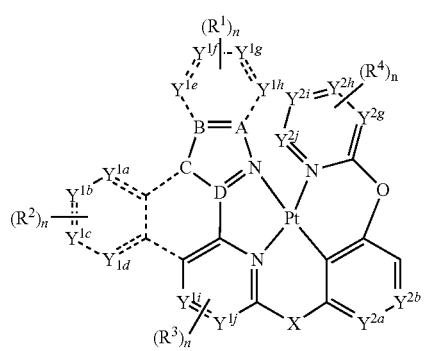
General Formula XV
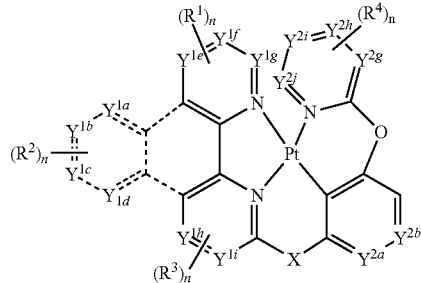
General Formula XVI
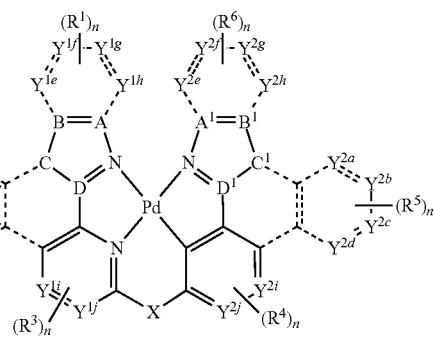
General Formula XVII
General Formula XVIII
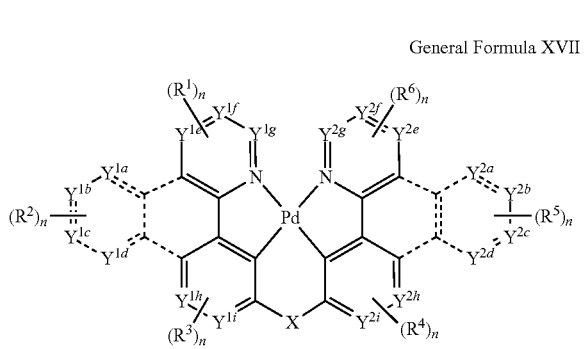
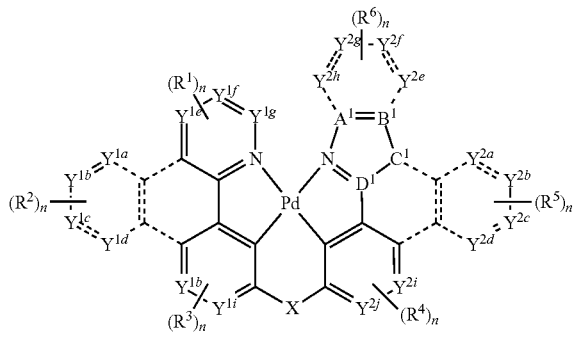
General Formula XIX
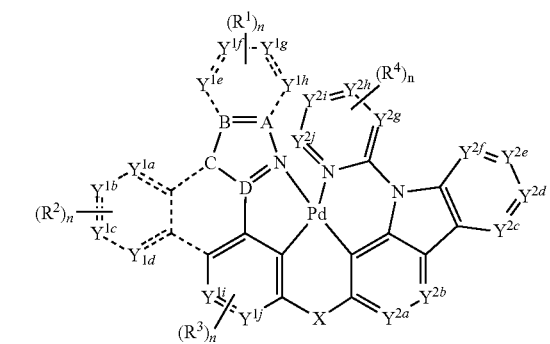

General Formula XX

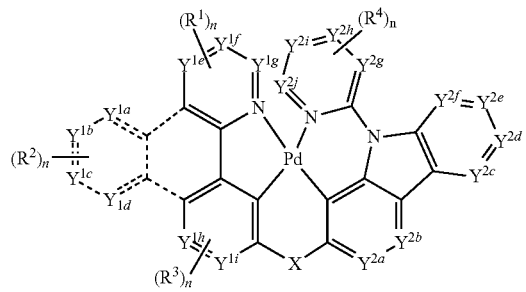

General Formula XXI

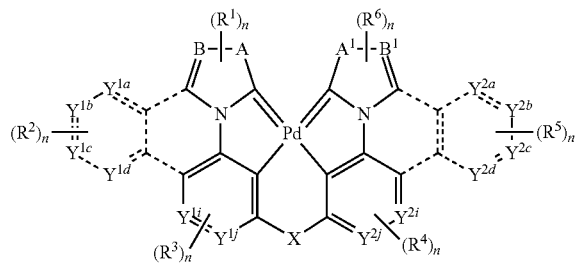

General Formula XXII

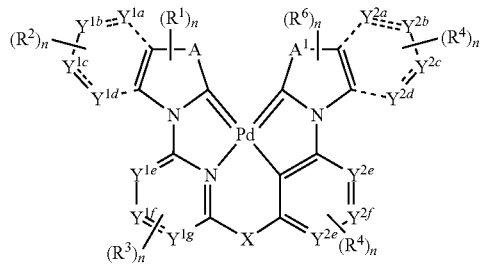

General Formula XXIII

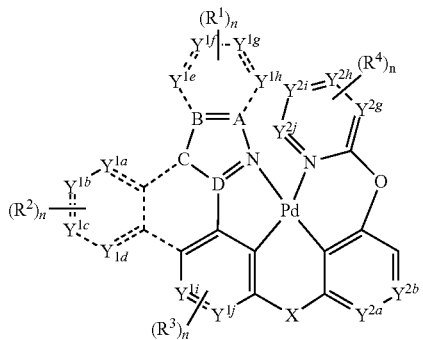

General Formula XXIV

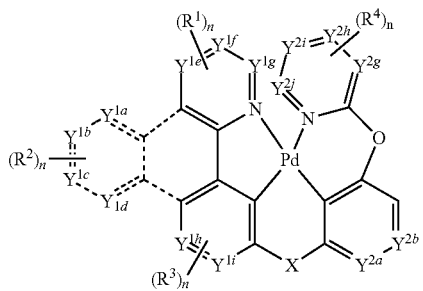

wherein, in General Formulas VII-XXIV:

$Y^{1a}$, $Y^{1b}$, $Y^{1c}$, $Y^{1d}$, $Y^{1e}$, $Y^{1f}$, $Y^{1g}$, $Y^{1h}$, $Y^{1i}$, $Y^{1j}$, $Y^{2a}$, $Y^{2b}$, $Y^{2c}$, $Y^{2d}$, $Y^{2e}$, $Y^{2f}$, $Y^{2g}$, $Y^{2h}$, $Y^{2i}$, $Y^{2j}$ each independently represents C or N;

X is independently present or absent, and, if present, X independently represents C, N, Si, O, S, Ge, P, As, Se, B, Al, or Bi, or if valency permits, X independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7R^8$, $R^7Bi$=O, or $BiR^7$;

A, B, C, D, $A^1$, $B^1$, $C^1$, and $D^1$ each independently represents C, N, O, S;

$R^1$, $R^2$, $R^3$, $R^4$, $R^5$, $R^6$, $R^7$, and $R^8$ is each independently absent or present as a single substituent or multiple substituents, valency permitting, and, if present, each of $R^1$, $R^2$, $R^3$, $R^4$, $R^5$, $R^6$, $R^7$, and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; and each n is independently an integer, valency permitting.

13. The composition of claim 1, wherein at least one of the first complex and the second complex has a structure of General Formula VIII.

14. The composition of claim 1, wherein at least one of the first complex and the second complex is a complex of General Formula XXV, General Formula XXVI, General Formula XXVII, General Formula XXVIII, General Formula XXIX, General Formula XXX, General Formula XXXI, or General Formula XXXII;

General Formula XXV

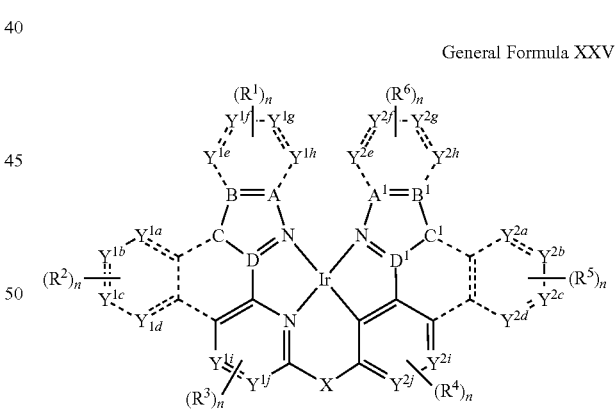

General Formula XXVI

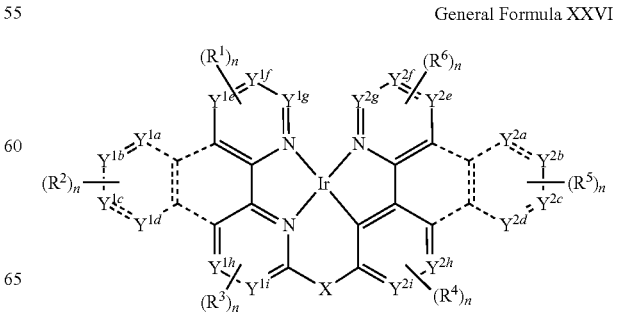

-continued

General Formula XXVII

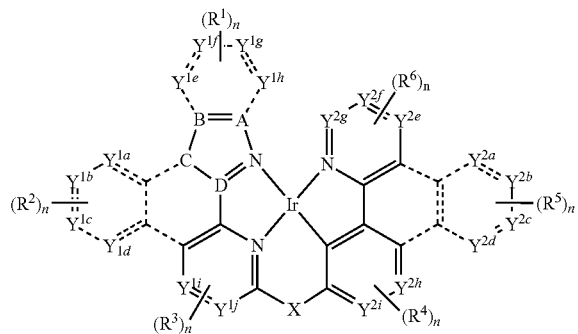

General Formula XXVIII

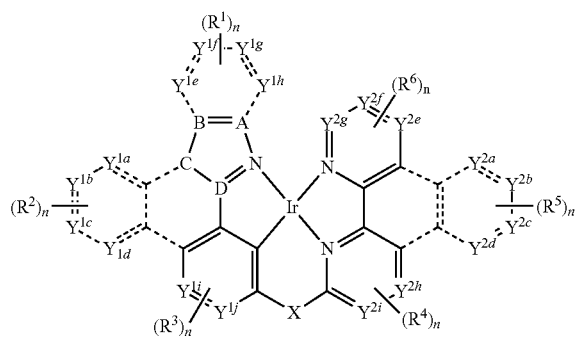

General Formula XXIX

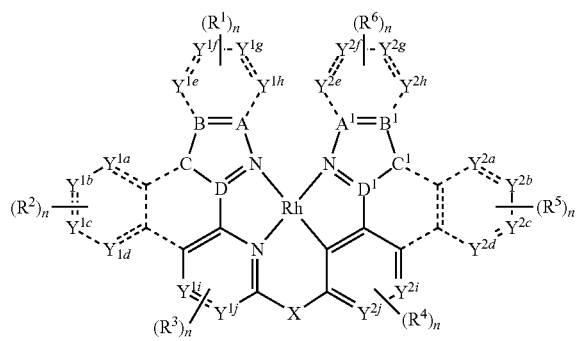

General Formula XXX

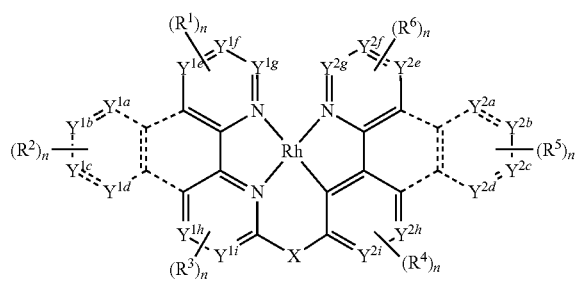

-continued

General Formula XXXI

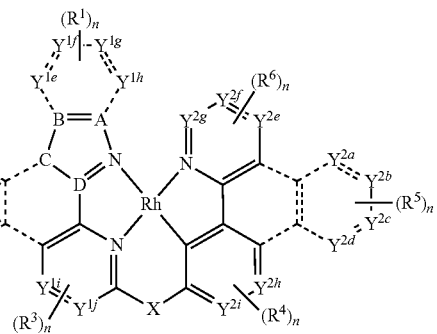

General Formula XXXII wherein, in General Formulas XXV-XXXII:

$Y^{1a}$, $Y^{1b}$, $Y^{1c}$, $Y^{1d}$, $y^{1e}$, $Y^{1f}$, $y^{1g}$, $Y^{1h}$, $Y^{1i}$, $Y^{1j}$, $Y^{2a}$, $Y^{2b}$, $Y^{2c}$, $Y^{2d}$ $Y^{2e}$, $Y^{2f}$, $Y^{2g}$, $Y^{2h}$, $Y^{2i}$, $Y^{2j}$ each independently represents C or N;

X is independently present or absent, and, if present, X independently represents C, N, Si, O, S, Ge, P, As, Se, B, Al, or Bi, or if valency permits, X independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7R^8$, $R^7Bi$=O, or $BiR^7$;

A, B, C, D each independently represents C, N, O, S;

$R^1$, $R^2$, $R^3$, $R^4$, $R^5$, $R^6$, $R^7$, and $R^8$ is each independently absent or present as a single substituent or multiple substituents, valency permitting, and, if present, each of $R^1$, $R^2$, $R^3$, $R^4$, $R^5$, $R^6$, $R^7$, and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; and each n is independently an integer, valency permitting.

15. The composition of claim 1, wherein at least one of the first complex and the second complex is a complex of General Formula XXXIII, General Formula XXXIV, or General Formula XXXV:

General Formula XXXIII

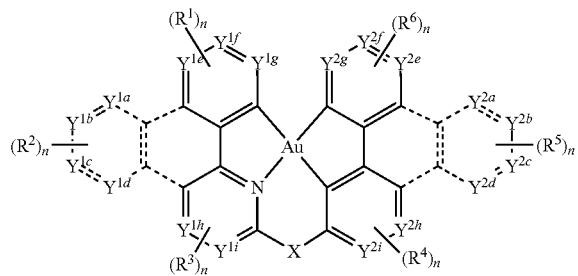

General Formula XXXIV

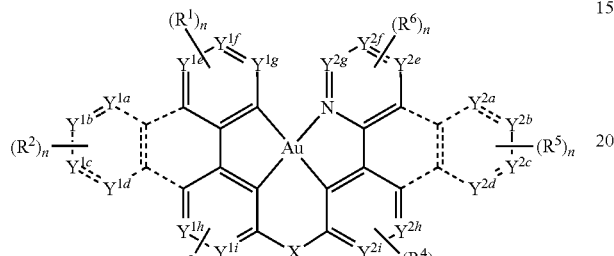

General Formula XXXV

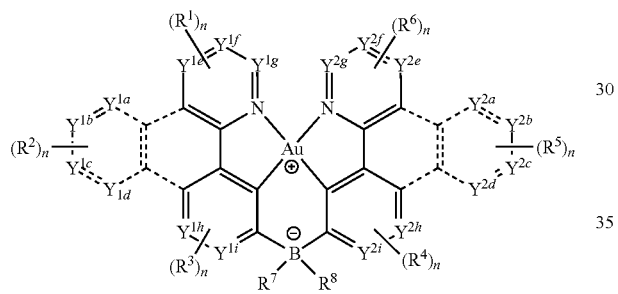

wherein, in General Formulas XXXIII-XXXV:
$Y^{1a}$, $Y^{1b}$, $Y^{1e}$, $Y^{1d}$, $Y^{1e}$, $Y^{1f}$, $Y^{1g}$, $Y^{1h}$, $Y^{1i}$, $Y^{2a}$, $Y^{2b}$, $Y^{2c}$, $Y^{2d}$ $Y^{2e}$, $Y^{2f}$, $Y^{2g}$, $Y^{2h}$, $Y^{2i}$, each independently represents C or N;

X is independently present or absent, and, if present, X independently represents C, N, Si, O, S, Ge, P, As, Se, B, Al, or Bi, or if valency permits, each X independently represents $CR^7$, $SiR^7$, $GeR^7$, $NR^7$, $P=O$, $As=O$, B, $BR^7$, $AlR^7$, $Bi=O$, $CR^7R^8$, $C=O$, $SiR^7R^8$, $GeR^7R^8$, $PR^7$, $PR^7R^8$, $R^7P=O$, $AsR^7$, $R^7As=O$, $S=O$, $SO_2$, $Se=O$, $SeO_2$, $BR^7R^8$, $AlR^7R^8$, $R^7Bi=O$, or $BiR^7$;

$R^1$, $R^2$, $R^3$, $R^4$, $R^5$, $R^6$, $R^7$, and $R^8$ is each independently absent or present as a single substituent or multiple substituents, valency permitting, and, if present, each of $R^1$, $R^2$, $R^3$, $R^4$, $R^5$, $R^6$, $R^7$, and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; and each n is independently an integer, valency permitting.

16. The composition of claim 1, wherein at least one of the first complex and the second complex is selected from the group consisting of:

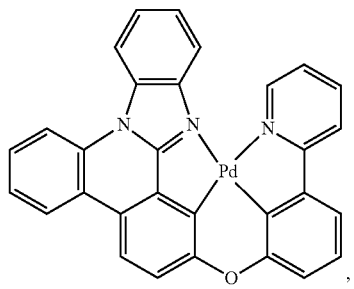

,

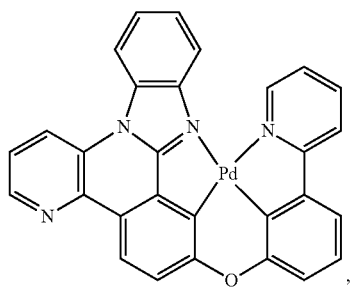

,

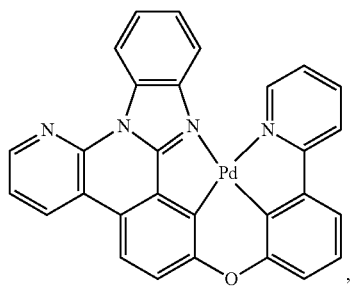

,

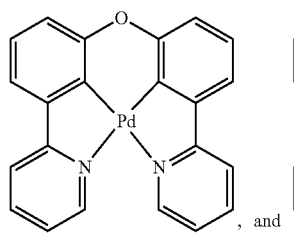

, and 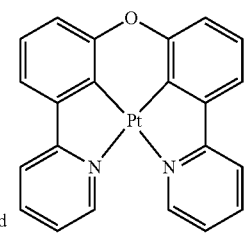 .

17. The composition of claim 1, wherein the ratio of the first complex to the second complex is any ratio between about 99:1 and about 1:99.

18. An organic light emitting device (OLED) comprising:
an anode;
a cathode; and
an organic region, disposed between the anode and the cathode, comprising a first complex and a second complex, wherein the first complex and the second complex each have a structure independently selected from General Formula I and General Formula II;

General Formula I

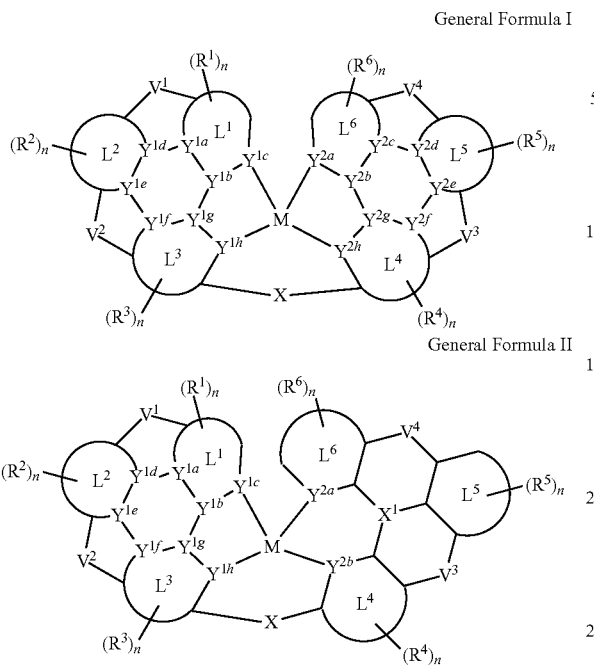

General Formula II wherein:
M represents Pt(II), Pd(II), Ir(I), Rh(I), Au(III);
$Y^{1a}$, $Y^{1b}$, $Y^{1e}$, $Y^{1f}$, $Y^{1g}$, $Y^{1h}$, $Y^{2a}$, $Y^{2b}$, $Y^{2c}$, $Y^{2f}$, $Y^{2g}$, $Y^{2h}$ each independently represents C or N;
$Y^{1d}$, $Y^{1e}$, $Y^{2d}$, $Y^{2e}$ each is independently absent or present, and if present, $Y^{1d}$, $Y^{1e}$, $Y^{2d}$, $Y^{2e}$ each independently represents C or N;
X and $X^1$ each is independently present or absent, and each of X and $X^1$, if present, independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7R^8$, $R^7Bi$=O, or $BiR^7$;
$R^1$, $R^2$, $R^3$, $R^4$, $R^5$, $R^6$, $R^7$, and $R^8$ each is independently absent or present as a single substituent or multiple substituents, valency permitting, and, if present, each of $R^1$, $R^2$, $R^3$, $R^4$, $R^5$, $R^6$, $R^7$, and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof;
$L^1$, $L^3$, $L^4$, and $L^6$ each independently represents a 5- to 10-membered aryl, heteroaryl, fused aryl, or fused heteroaryl;
$L^2$ and $L^5$ each is independently present or absent and, if present, $L^2$ and $L^5$ each independently represents a 5- to 10-membered aryl, heteroaryl, fused aryl, or fused heteroaryl;
$V^1$, $V^2$, $V^3$, $V^4$ each is independently present, absent, or a covalent bond, and, if present, each of $V^1$, $V^2$, $V^3$, $V^4$ independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7R^8$, $R^7Bi$=O, or $BiR^7$;
each n is independently an integer, valency permitting; and
wherein the first complex and the second complex have different structures.

19. A consumer product comprising an organic light emitting device (OLED) comprising:
an anode;
a cathode; and
an organic region, disposed between the anode and the cathode, comprising a first complex and a second complex, wherein the first complex and the second complex each have a structure independently selected from General Formula I and General Formula II;

General Formula I

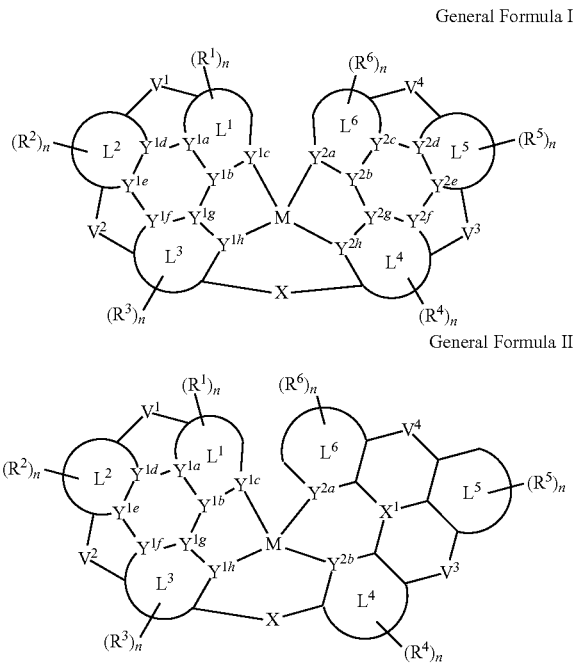

General Formula II wherein:
M represents Pt(II), Pd(II), Ir(I), Rh(I), Au(III);
$Y^{1a}$, $Y^{1b}$, $Y^{1e}$, $Y^{1f}$, $Y^{1g}$, $Y^{1h}$, $Y^{2a}$, $Y^{2b}$, $Y^{2c}$, $Y^{2f}$, $Y^{2g}$, $Y^{2h}$ each independently represents C or N;
$Y^{1d}$, $Y^{1e}$, $Y^{2d}$, $Y^{2e}$ each is independently absent or present, and if present, $Y^{1d}$, $Y^{1e}$, $Y^{2d}$, $Y^{2e}$ each independently represents C or N;
X and $X^1$ each is independently present or absent, and each of X and $X^1$, if present, independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7R^8$, $R^7Bi$=O, or $BiR^7$;
$R^1$, $R^2$, $R^3$, $R^4$, $R^5$, $R^6$, $R^7$, and $R^8$ each is independently absent or present as a single substituent or multiple substituents, valency permitting, and, if present, each of $R^1$, $R^2$, $R^3$, $R^4$, $R^5$, $R^6$, $R^7$, and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof;

$L^1$, $L^3$, $L^4$, and $L^6$ each independently represents a 5- to 10-membered aryl, heteroaryl, fused aryl, or fused heteroaryl;

$L^2$ and $L^5$ each is independently present or absent and, if present, $L^2$ and $L^5$ each independently represents a 5- to 10-membered aryl, heteroaryl, fused aryl, or fused heteroaryl;

$V^1$, $V^2$, $V^3$, $V^4$ each is independently present, absent, or a covalent bond, and, if present, each of $V^1$, $V^2$, $V^3$, $V^4$ independently represents C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $PR^7$, $PR^7R^8$, $R^7P$=O, $AsR^7$, $R^7As$=O, S=O, $SO_2$, Se=O, $SeO_2$, $BR^7R^8$, $AlR^7R^8$, $R^7Bi$=O, or $BiR^7$;

each n is independently an integer, valency permitting; and wherein the first complex and the second complex have different structures.

20. The consumer product of claim 19, wherein the consumer product is selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a microdisplay that is less than 2 inches diagonal, a 3-D display, a virtual reality or augmented reality display, a vehicle, a video wall comprising multiple displays tiled together, a theater or stadium screen, and a sign.

* * * * *